(12) United States Patent
Kawai et al.

(10) Patent No.: US 12,046,610 B2
(45) Date of Patent: *Jul. 23, 2024

(54) PHOTOELECTRIC CONVERTER AND SOLID-STATE IMAGING DEVICE

(71) Applicant: SONY SEMICONDUCTOR SOLUTIONS CORPORATION, Kanagawa (JP)

(72) Inventors: Nobuhiro Kawai, Kanagawa (JP); Hirokazu Shibuta, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/946,636

(22) Filed: Sep. 16, 2022

(65) Prior Publication Data

US 2023/0018449 A1    Jan. 19, 2023

Related U.S. Application Data

(63) Continuation of application No. 16/772,258, filed as application No. PCT/JP2018/045267 on Dec. 10, 2018, now Pat. No. 11,469,262.

(30) Foreign Application Priority Data

Dec. 20, 2017  (JP) ................................. 2017-244346

(51) Int. Cl.
  *H01L 27/146*    (2006.01)
(52) U.S. Cl.
  CPC .. *H01L 27/14621* (2013.01); *H01L 27/14612* (2013.01); *H01L 27/14627* (2013.01)

(58) Field of Classification Search
  CPC ......... H01L 27/14612; H01L 27/14621; H01L 27/14627; H01L 27/1463; H01L 27/14645;
  (Continued)

(56) References Cited

U.S. PATENT DOCUMENTS 11,469,262 B2 * 10/2022 Kawai ................. H01L 27/1463
2009/0321865 A1    12/2009 Kasano et al.
  (Continued)

FOREIGN PATENT DOCUMENTS

CN  102097443 A  6/2011
CN  107146850 A  9/2017
  (Continued)

OTHER PUBLICATIONS

International Search Report and Written Opinion for International (PCT) Patent Application No. PCT/JP2018/045267, dated Feb. 12, 2019, 10 pages.
  (Continued)

*Primary Examiner* — Nelson Garces
(74) *Attorney, Agent, or Firm* — SHERIDAN ROSS P.C.

(57) ABSTRACT

A photoelectric converter according to an embodiment of the present disclosure includes: an organic photoelectric conversion section; an inorganic photoelectric conversion section; and an optical filter. The organic photoelectric conversion section includes a first electrode, a second electrode, and an organic photoelectric conversion layer. The first electrode includes one electrode and another electrode. The second electrode is disposed to be opposed to the first electrode. The organic photoelectric conversion layer is disposed between the first electrode and the second electrode and is electrically coupled to the one electrode. The organic photoelectric conversion layer and the other electrode are provided with an insulation layer therebetween. The inor-
  (Continued)

ganic photoelectric conversion section has the first electrode disposed between the inorganic photoelectric conversion section and the organic photoelectric conversion section. The optical filter is provided between the organic photoelectric conversion section and the inorganic photoelectric conversion section.

19 Claims, 32 Drawing Sheets

(58) Field of Classification Search
CPC .............. H01L 27/307; H01L 27/1464; H01L 27/14623; H01L 27/14665; H01L 27/146; H01L 31/0232; H01L 51/42; G02B 5/223; G02B 5/285; G02B 5/201; G02B 5/20; H04N 9/04551; H04N 5/369; H04N 5/374; H04N 9/07; Y02E 10/549
See application file for complete search history.

(56) References Cited

U.S. PATENT DOCUMENTS

| | | |
|---|---|---|
| 2010/0123070 A1 | 5/2010 | Natori |
| 2010/0141812 A1 | 6/2010 | Hirota |
| 2013/0286260 A1 | 10/2013 | Hirota |
| 2014/0146207 A1 | 5/2014 | Yokogawa |
| 2015/0109496 A1 | 4/2015 | Hirota |
| 2015/0241611 A1 | 8/2015 | Hirota |
| 2015/0264325 A1 | 9/2015 | Hirota |
| 2015/0350540 A1 | 12/2015 | Borthakur et al. |
| 2016/0133865 A1* | 5/2016 | Yamaguchi ............ H04N 25/76 257/40 |
| 2016/0373709 A1 | 12/2016 | Hirota |
| 2017/0243912 A1* | 8/2017 | Kaneda ............ H01L 27/14647 |
| 2017/0317134 A1 | 11/2017 | Lu et al. |
| 2018/0007338 A1 | 1/2018 | Hirota |
| 2018/0076252 A1 | 3/2018 | Togashi et al. |
| 2018/0090531 A1 | 3/2018 | Yokogawa |
| 2018/0175102 A1 | 6/2018 | Togashi et al. |
| 2021/0104564 A1 | 4/2021 | Kawai et al. |

FOREIGN PATENT DOCUMENTS

| | | | | |
|---|---|---|---|---|
| JP | 2004-151313 | | 5/2004 | |
| JP | 2006-120773 | | 5/2006 | |
| JP | 2006120773 A | * | 5/2006 | |
| JP | 2009-303020 | | 12/2009 | |
| JP | 2010-123779 | | 6/2010 | |
| JP | 2010-136225 | | 6/2010 | |
| JP | 2010136225 A | * | 6/2010 | ......... G02B 13/0015 |
| JP | 2012-084649 | | 4/2012 | |
| JP | 2013-030626 | | 2/2013 | |
| JP | 2017-157816 | | 9/2017 | |
| JP | 2017157816 A | * | 9/2017 | ....... H01L 27/14605 |
| KR | 20160051687 A | | 5/2016 | |
| WO | WO 2017/169231 | | 10/2017 | |

OTHER PUBLICATIONS

Extended European Search Report for European Patent Application No. 18892649.7, dated Jan. 26, 2021, 6 pages.
Official Action for U.S. Appl. No. 16/772,258, dated Feb. 25, 2022, 16 pages.
Notice of Allowance for U.S. Appl. No. 16/772,258, dated Feb. 25, 2022, 8 pages.

* cited by examiner

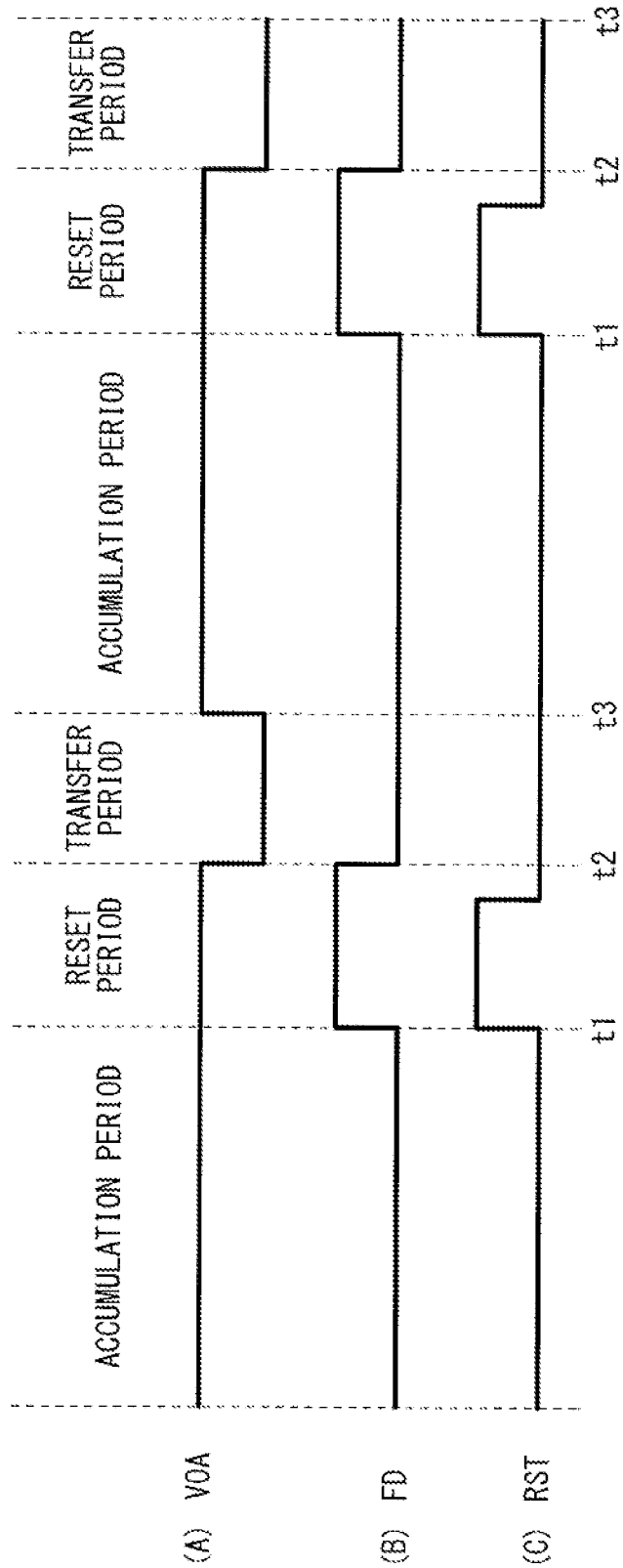

FIG. 20A
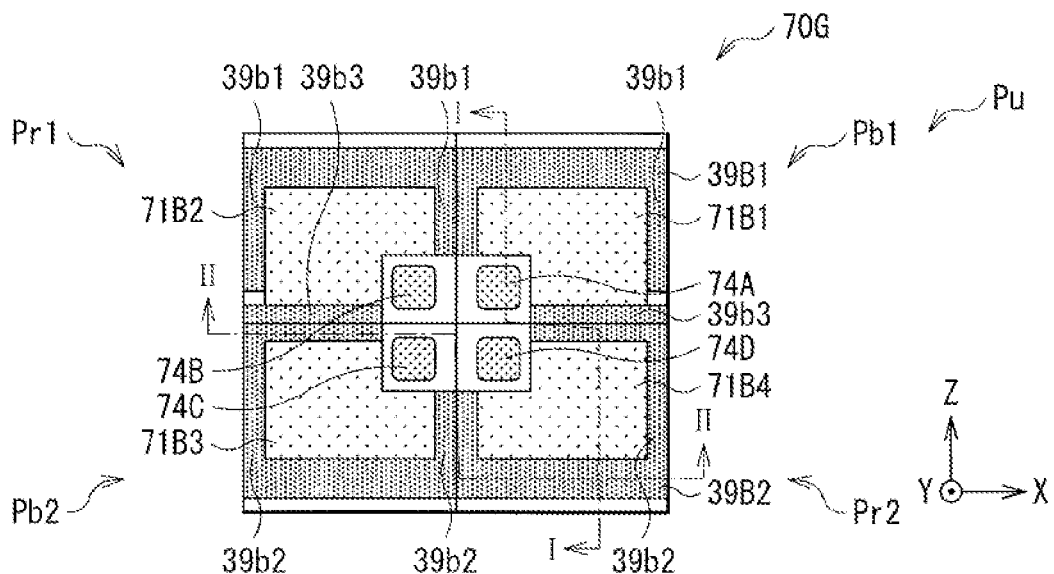
FIG. 20B
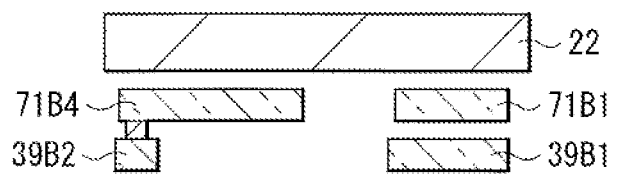
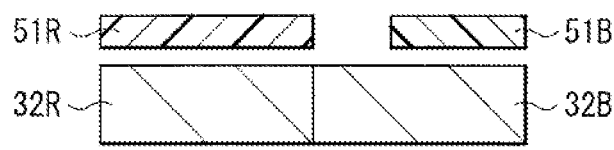
FIG. 20C
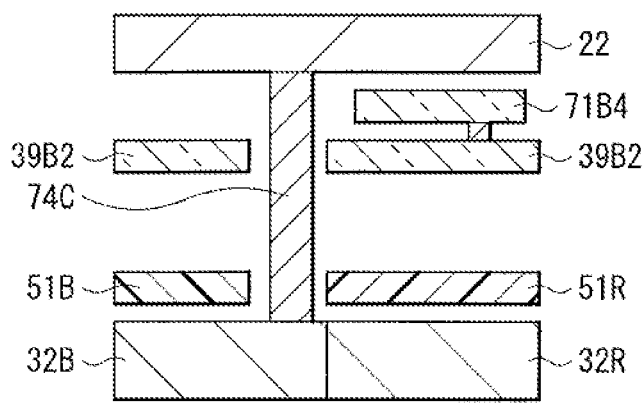

PHOTOELECTRIC CONVERTER AND SOLID-STATE IMAGING DEVICE

CROSS REFERENCE TO RELATED APPLICATIONS

This application is a continuation of U.S. patent application Ser. No. 16/772,258 filed 12 Jun. 2020, which is a national stage application under 35 U.S.C. 371 and claims the benefit of PCT Application No. PCT/JP2018/045267 having an international filing date of 10 Dec. 2018, which designated the United States, which PCT application claimed the benefit of Japanese Patent Application No. 2017-244346 filed 20 Dec. 2017, the entire disclosures of each of which are incorporated herein by reference.

TECHNICAL FIELD

The present disclosure relates, for example, to a photoelectric converter and a solid-state imaging device including this.

BACKGROUND ART

In recent years, solid-state imaging devices such as CCD (Charge Coupled Device) image sensors or CMOS (Complementary Metal Oxide Semiconductor) image sensors have been developed. In a case where colors are separated, general solid-state imaging devices are each structured to have photoelectric conversion sections irradiated with only necessary optical information by disposing optical filters (color filters) on the respective photoelectric conversion sections. The photoelectric conversion sections are disposed side by side. The optical filters (color filters) include a two-dimensional array of primary color filters of red, green, and blue.

A solid-state imaging device in which photoelectric conversion sections are stacked has been developed for this. The photoelectric conversion sections photoelectrically convert the respective pieces of light in the red, green, and blue wavelength bands. In such a solid-state imaging device, the respective pieces of light in the red and blue wavelength bands are photoelectrically converted by photoelectric conversion sections (photodiodes PD1 and PD2) formed inside a semiconductor substrate (Si substrate), and the light in the green wavelength band is photoelectrically converted by an organic photoelectric conversion film formed on the back surface side of the semiconductor substrate. For example, PTL 1 discloses a solid-state imaging device provided with a charge accumulation electrode on a first electrode side of the first electrode and a second electrode disposed to be opposed to each other with a photoelectric conversion layer (organic photoelectric conversion film) therebetween. The charge accumulation electrode is disposed to be spaced apart from the first electrode and opposed to the photoelectric conversion layer with an insulation layer interposed therebetween.

CITATION LIST

Patent Literature

PTL 1: Japanese Unexamined Patent Application Publication No. 2017-157816

SUMMARY OF THE INVENTION

Incidentally, a solid-state imaging device in which an inorganic photoelectric conversion section provided in a semiconductor substrate (Si substrate) and an organic photoelectric conversion film formed on the back surface side of the semiconductor substrate are stacked as described above is requested to improve a spectral characteristic to allow a light component to be detected with no color mixture.

It is desirable to provide a photoelectric converter and a solid-state imaging device that make it possible to improve a spectral characteristic. The solid-state imaging device includes the photoelectric converter.

A photoelectric converter according to an embodiment of the present disclosure includes: an organic photoelectric conversion section; an inorganic photoelectric conversion section; and an optical filter. The organic photoelectric conversion section includes a first electrode, a second electrode, and an organic photoelectric conversion layer. The first electrode includes one electrode and another electrode. The second electrode is disposed to be opposed to the first electrode. The organic photoelectric conversion layer is disposed between the first electrode and the second electrode and is electrically coupled to the one electrode. The organic photoelectric conversion layer and the other electrode are provided with an insulation layer therebetween. The inorganic photoelectric conversion section has the first electrode disposed between the inorganic photoelectric conversion section and the organic photoelectric conversion section. The optical filter is provided between the organic photoelectric conversion section and the inorganic photoelectric conversion section.

A solid-state imaging device according to an embodiment of the present disclosure includes one or more photoelectric converters according to the above-described embodiment of the present disclosure for a plurality of pixels.

In the photoelectric converter according to the embodiment of the present disclosure and the solid-state imaging device according to the embodiment, the organic photoelectric conversion section is provided with the optical filter between the inorganic photoelectric conversion section and the first electrode. The organic photoelectric conversion section has the organic photoelectric conversion layer between the pair of electrodes (first electrode and second electrode). The organic photoelectric conversion section and the inorganic photoelectric conversion section have the first electrode disposed therebetween. This makes it possible to remove an unnecessary wavelength component of wavelengths passing through the organic photoelectric conversion section.

The photoelectric converter according to the embodiment of the present disclosure and the solid-state imaging device according to the embodiment are each provided with the optical filter between the organic photoelectric conversion section one (first electrode) of the pair of electrodes of which includes the plurality of electrodes and the inorganic photoelectric conversion section. The pair of electrodes is disposed to be opposed to each other with the organic photoelectric conversion layer interposed therebetween. Accordingly, an unnecessary wavelength component of wavelengths passing through the organic photoelectric conversion section is removed. This makes it possible to improve spectral characteristics.

It is to be noted that the effects described here are not necessarily limited, but any of effects described in the present disclosure may be included.

BRIEF DESCRIPTION OF DRAWING

FIG. 9 is a timing chart illustrating an operation example of a photoelectric converter illustrated in FIG. 1.

FIG. 20A is a schematic plan view of the positional relationship between the respective sections in the photoelectric converters illustrated in FIG. 13.

FIG. 20B is a schematic cross-sectional view taken along a line I-I illustrated in FIG. 20A.

FIG. 20C is a schematic cross-sectional view taken along a line II-II illustrated in FIG. 20A.

MODES FOR CARRYING OUT THE INVENTION

The following describes embodiments of the present disclosure in detail with reference to the drawings. The following description is a specific example of the present disclosure, but the present disclosure is not limited to the following embodiment. In addition, the present disclosure does not limit the disposition, dimensions, dimension ratios, and the like of respective components illustrated in the diagrams thereto. It is to be noted that description is given in the following order.
1. Embodiment (Example in which an optical filter is disposed between an organic photoelectric conversion section and an inorganic photoelectric conversion section)
1-1. Configuration of Photoelectric Converter
1-2. Method of Manufacturing Photoelectric Converter
1-3. Workings and Effects
2. Modification Examples
2-1. Modification Example 1 (Example in which an optical filter that transmits visible light is added)
2-2. Modification Example 2 (Example of a photoelectric converter that absorbs IR in an organic photoelectric conversion section)
2-3. Modification Example 3 (Example of a photoelectric converter in which a light-shielding property is added to a through electrode)
3. Application Examples

1. Embodiment

Figure 1:
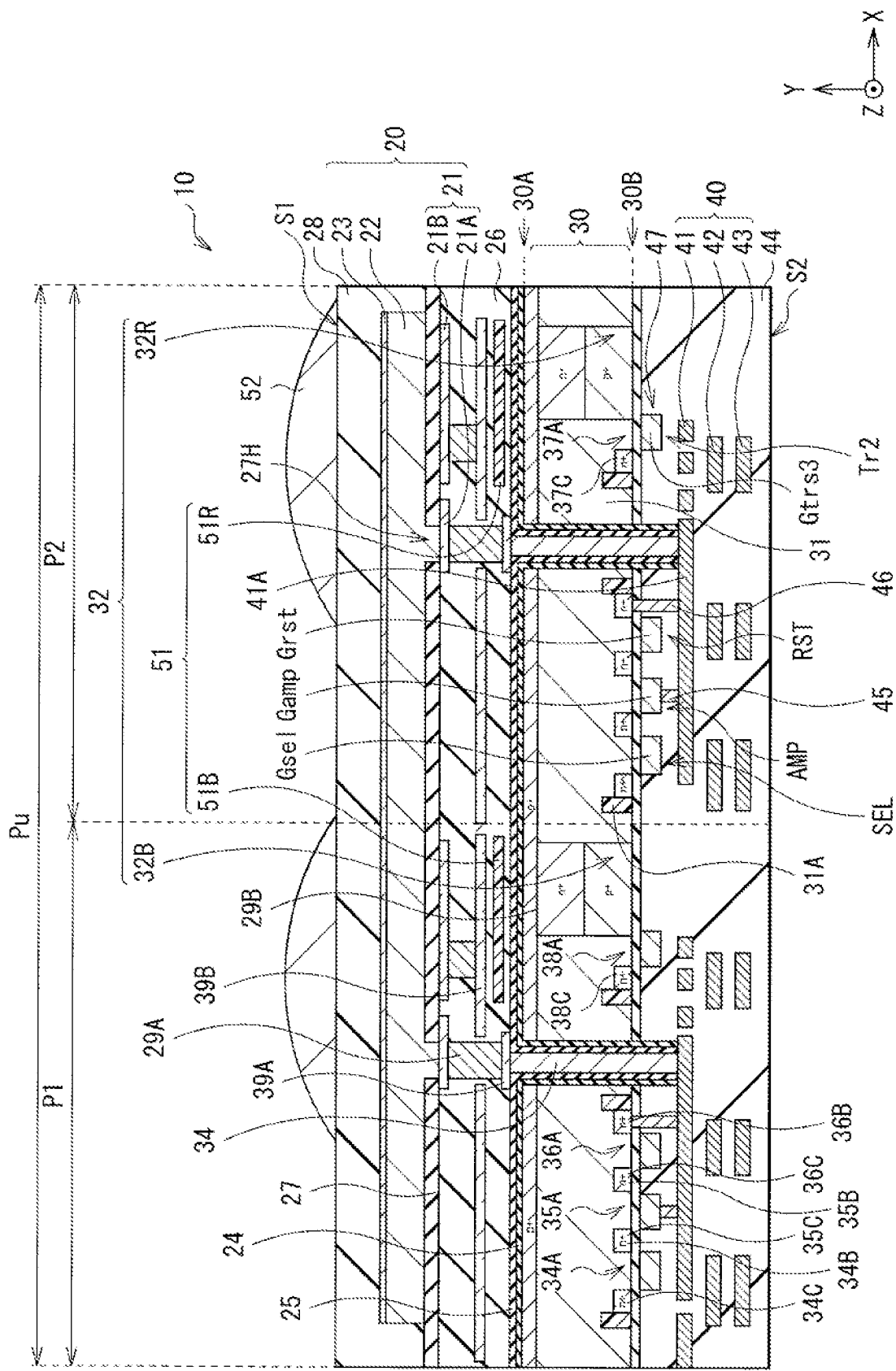
FIG. 1 is a schematic cross-sectional view of an example of a schematic configuration of a photoelectric converter according to an embodiment of the present disclosure.
Figure 2:
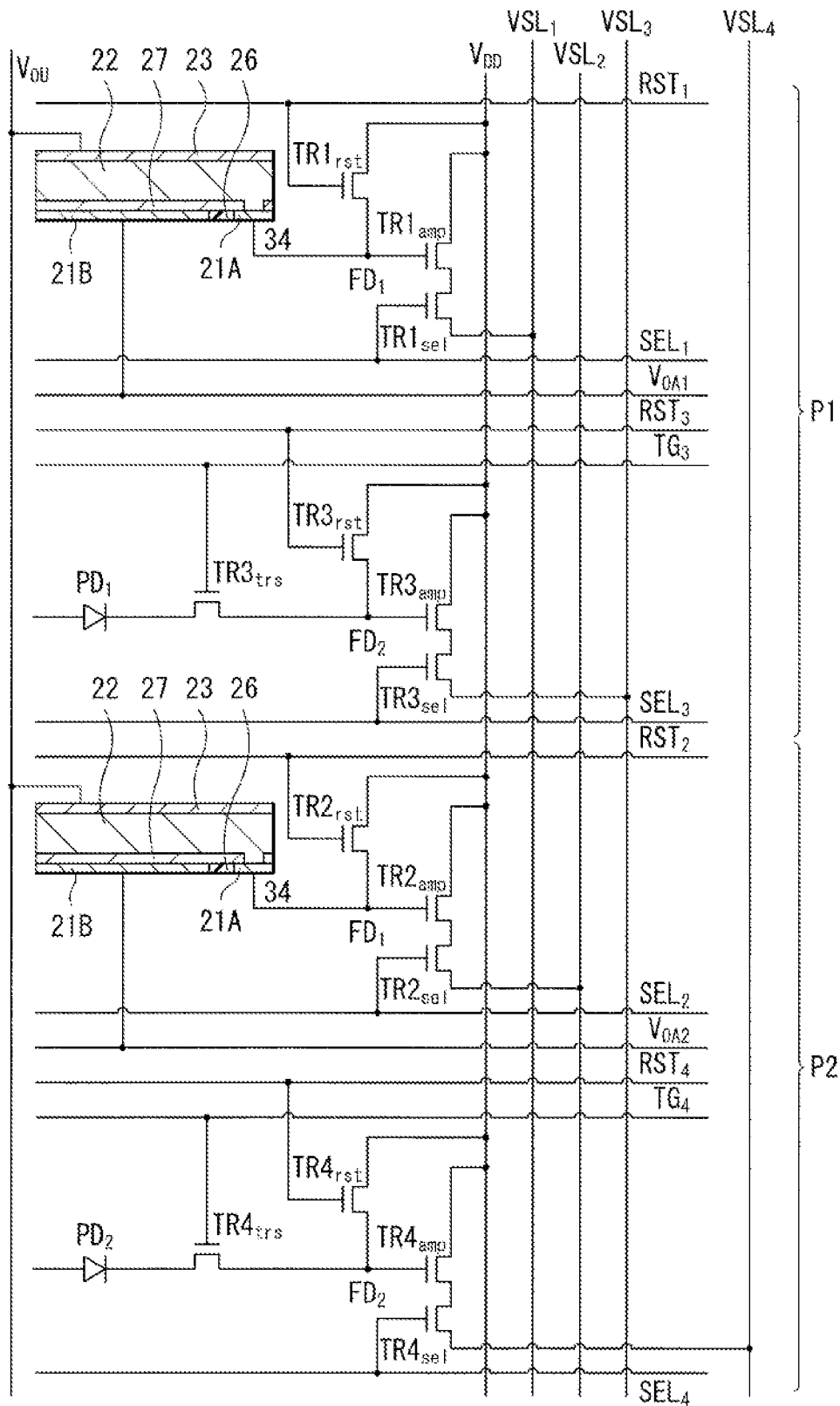
FIG. 2 is an equivalent circuit diagram of the photoelectric converters illustrated in FIG. 1.
Figure 3:
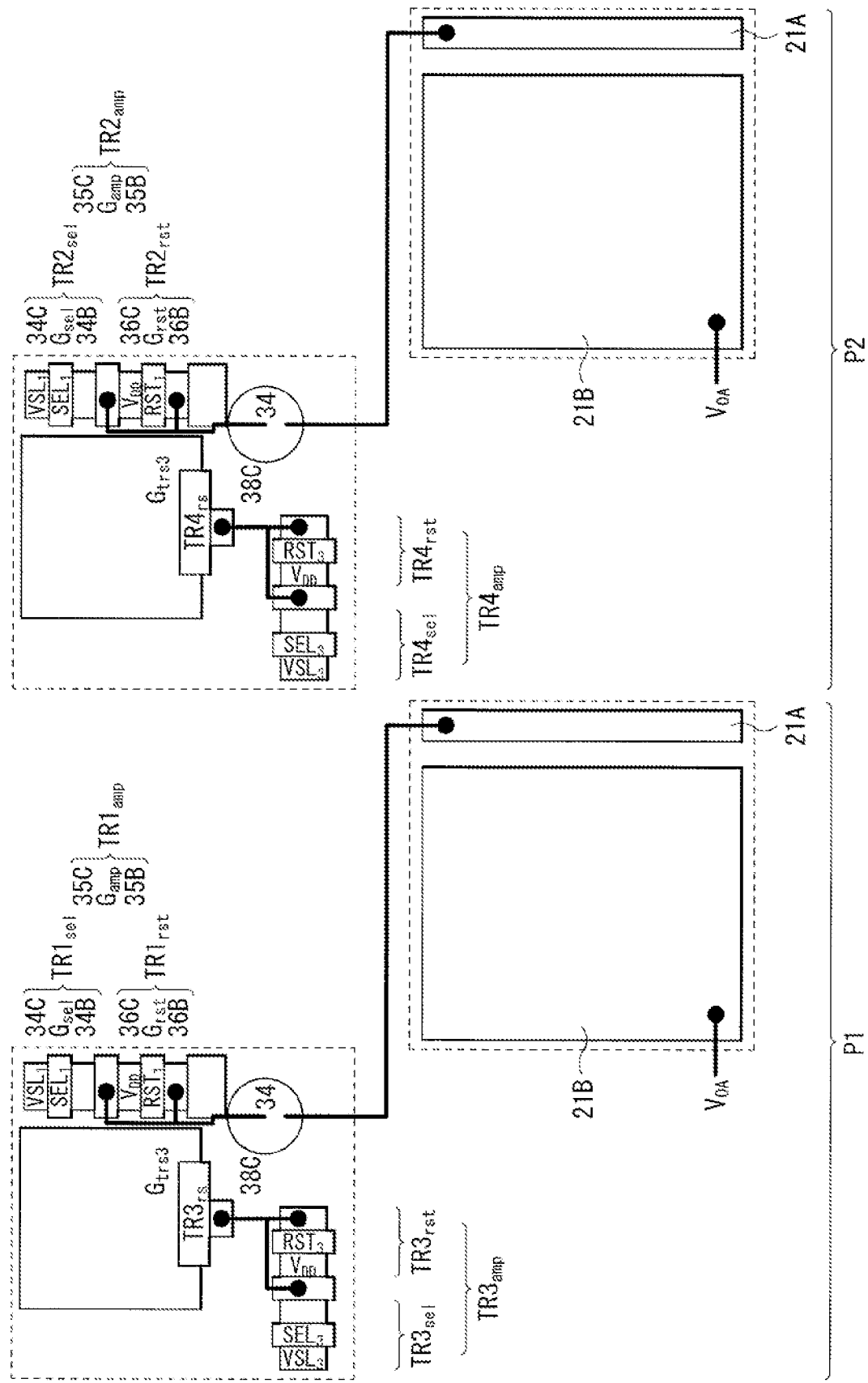
FIG. 3 is a schematic diagram illustrating disposition of lower electrodes and transistors included in controllers of the photoelectric converter illustrated in FIG. 1.

FIG. 1 illustrates a cross-sectional configuration of a photoelectric converter (photoelectric converter 10) according to an embodiment of the present disclosure. FIG. 2 is an equivalent circuit diagram of the photoelectric converters 10 illustrated in FIG. 1. FIG. 3 schematically illustrates the disposition of lower electrodes 21 and transistors included in controllers of the photoelectric converters 10 illustrated in FIG. 1. The photoelectric converter 10 is included in one pixel (unit pixel P) in a solid-state imaging device (solid-state imaging device 1; see FIG. 26) such as a CMOS image sensor used in an electronic apparatus such as a digital still camera or a video camera, for example.

1-1. Configuration of Photoelectric Converter

FIG. 1 illustrates an example in which the two photoelectric converters 10 are disposed side by side, and are included in the respective pixels P (pixels P1 and P2). Each of the photoelectric converters 10 is of a so-called longitudinal spectral type in which, for example, an organic photoelectric conversion section 20 and an inorganic photoelectric conversion section 32 are stacked in the longitudinal direction. The organic photoelectric conversion section 20 is provided on a first surface (back surface) 30A side of a semiconductor substrate 30. The inorganic photoelectric conversion section 32 is embedded and formed in the semiconductor substrate 30. For example, two types of inorganic photoelectric conversion sections 32B and 32R are disposed in the semiconductor substrate 30 in the planar direction. The organic photoelectric conversion section 20 has an organic photoelectric conversion layer 22 between the lower electrode 21 (first electrode) and an upper electrode 23 (second electrode) that are opposed to each other. The organic photoelectric conversion layer 22 is formed by using an organic material. This organic photoelectric conversion layer 22 includes a p-type semiconductor and an n-type semiconductor, and has a bulk heterojunction structure in the layer. The bulk hetero junction structure is a p/n junction surface formed by mixture of a p-type semiconductor and an n-type semiconductor.

The lower electrode 21 of the photoelectric converter 10 according to the present embodiment includes a plurality of electrodes (readout electrode 21A and accumulation electrode 21B. Among the electrodes included in the organic photoelectric conversion section 20, the lower electrode 21 is disposed on the opposite side to a light incidence side S1 with respect to the organic photoelectric conversion layer 22. Further, the present embodiment has a configuration in which there is provided an optical filter 51 between the organic photoelectric conversion section 20 and the inorganic photoelectric conversion section 32. More specifically, the present embodiment has a configuration in which the inorganic photoelectric conversion sections 32R and 32B are each provided at the position opposed to the accumulation electrode 21B of the lower electrode 21 in the pixel P. There are provided optical filters 51B and 51R between these accumulation electrode 21B and inorganic photoelectric conversion section 32B and between these accumulation electrode 21B and inorganic photoelectric conversion section 32R, respectively.

The organic photoelectric conversion section 20 and the inorganic photoelectric conversion sections 32B and 32R perform photoelectric conversion by selectively detecting respective pieces of light in wavelength bands different from each other. Specifically, the organic photoelectric conversion section 20 acquires a color signal of green (G). The inorganic photoelectric conversion sections 32B and 32R respectively acquire a color signal of blue (B) and a color signal of red (R).

It is to be noted that, in the present embodiment, description is given of a case of reading an electron as a signal charge (case where the n-type semiconductor region is used as a photoelectric conversion layer) of a pair (electron-hole pair) of the electron and hole generated from photoelectric conversion. In addition, in the drawings, "+(plus)" assigned to "p" and "n" indicates that the concentration of p-type or n-type impurities is high, and "++" indicates that the concentration of p-type or n-type impurities is further higher than "+". In addition, the respective photoelectric converters provided in the pixel P1 and the pixel P2 have configurations similar to each other, except that the photoelectric converters selectively detect respective pieces of light in wavelength bands different from each other in the inorganic photoelectric conversion section 32B and the inorganic photoelectric conversion section 32R.

For example, the pixel P1 and the pixel P2 are each provided with a floating diffusions (floating diffusion layers) FD1 (region 36B in the semiconductor substrate 30) and FD3 (region 38C in the semiconductor substrate 30), a transfer transistor Tr3, an amplifier transistor (modulator) AMP, a reset transistor RST, a selection transistor SEL, and a multilayer wiring line 40 on a second surface (front surface) 30B of the semiconductor substrate 30. The multilayer wiring line 40 has a configuration in which wiring layers 41, 42, and 43, for example, are stacked in an insulating layer 44.

It is to be noted that the diagram illustrates the first surface 30A side of the semiconductor substrate 30 as a light incidence side S1, and the second surface 30B side thereof as a wiring layer side S2.

The organic photoelectric conversion section 20 has a configuration in which, for example, a lower electrode 21, the organic photoelectric conversion layer 22, and an upper electrode 23 are stacked in this order from the first surface 30 side of the semiconductor substrate 30. In addition, there is provided an insulation layer 27 between the lower electrode 21 and the organic photoelectric conversion layer 22. The lower electrode 21 is formed separately for each of the pixels P1 and P2, for example, and includes the readout electrode 21A and the accumulation electrode 21B that are separated from each other with an inter-layer insulation layer 26 interposed therebetween, as described in detail below. The readout electrode 21A of the lower electrode 21 is electrically coupled to the organic photoelectric conversion layer 22 through an opening 27H provided in the insulation layer 27. FIG. 1 illustrates an example in which the organic photoelectric conversion layer 22 and the upper electrode 23 are provided as continuous layers common to the plurality of photoelectric converters 10, but the organic photoelectric conversion layers 22 and the upper electrodes 23 may be separately formed for each of the photoelectric converters 10. For example, a layer (fixed charge layer) 24 having fixed charges, a dielectric layer 25 having an insulating property, and the inter-layer insulation layer 26 are provided, for example, between the first surface 30A of the semiconductor substrate 30 and the lower electrode 21. Each of the pixels P1 and P2 is provided with a wiring line 39B and the above-described optical filter 51 (optical filter 51B for the pixel P1 and optical filter 51R for the pixel P2) in the inter-layer insulation layer 26. The wiring line 39B is electrically coupled to the accumulation electrode 21B of the lower electrode 21. A protective layer 28 is provided on the upper electrode 23. Optical members such as a planarization layer (not illustrated) and an on-chip lens 52 are disposed above the protective layer 28.

There is provided a through electrode 34 between the first surface 30A and the second surface 30B of the semiconductor substrate 30. The organic photoelectric conversion section 20 is coupled, through this through electrode 34, to a gate Gamp of the amplifier transistor AMP and the one source/drain region 36B of the reset transistor RST (reset transistor Tr1rst) also serving as the floating diffusion FD1. This allows the photoelectric converter 10 to favorably transfer charges (here, electrons) generated in the organic photoelectric conversion section 20 on the first surface 30A side of the semiconductor substrate 30 to the second surface 30B side of the semiconductor substrate 30 through the through electrode 34.

The lower end of the through electrode 34 is coupled to a coupling section 41A in the wiring layer 41, and the coupling section 41A and the gate Gamp of the amplifier transistor AMP are coupled through the lower first contact 45. The coupling section 41A and the floating diffusion FD1 (region 36B) are coupled through a lower second contact 46, for example. The upper end of the through electrode 34 is coupled to the readout electrode 21A through a pad section 39A and an upper first contact 29A, for example.

The through electrode 34 is provided to each of the organic photoelectric conversion sections 20 of respective photoelectric converters 10A, for example. The through electrode 34 has a function of a connector for the organic photoelectric conversion section 20 and the gate Gamp of the amplifier transistor AMP, and the floating diffusion FD1, and serves as a transmission path for charges (here, electrons) generated in the organic photoelectric conversion section 20.

A reset gate Grst of the reset transistor RST is disposed next to the floating diffusion FD1 (one source/drain region 36B of the reset transistor RST). This makes it possible to cause the reset transistor RST to reset the charges accumulated in the floating diffusion FD1.

In the photoelectric converter 10, light inputted to the organic photoelectric conversion section 20 from the upper electrode 23 side is absorbed by the organic photoelectric conversion layer 22. Excitons thus generated move to an interface between an electron donor and an electron acceptor included in the organic photoelectric conversion layer 22, and undergo exciton separation, that is, dissociate into electrons and holes. The charges (electrons and holes) generated here are transported to different electrodes by diffusion due to a difference in carrier concentration or by an internal electric field due to a difference in work functions between an anode (here, the lower electrode 21) and a cathode (here, the upper electrode 23), and are detected as a photocurrent. In addition, the application of an electric potential between the lower electrode 21 and the upper electrode 23 makes it possible to control directions in which electrons and holes are transported.

The following describes configurations, materials, or the like of respective sections.

The organic photoelectric conversion section 20 is an organic photoelectric converter that absorbs the green light corresponding to a portion or all of selective wavelength bands (e.g., 450 nm or more and 650 nm or less) to generate an electron-hole pair.

As described above, the lower electrode 21 includes the readout electrode 21A and the accumulation electrode 21B that are formed separately. The readout electrode 21A transfers charges (here, electrons) generated in the organic photoelectric conversion layer 22 to the floating diffusion FD1. The readout electrode 21A is coupled to the floating diffusion FD1, for example, through the upper first contact 29A, the pad section 39A, the through electrode 34, the coupling section 41A, and the lower second contact 46. The accumulation electrode 21B accumulates, in the organic photoelectric conversion layer 22, the electrons serving as signal charges of the charges generated in the organic photoelectric conversion layer 22. The accumulation electrode 21B is provided in each of regions that are directly opposed to the light receiving surfaces of the inorganic photoelectric conversion sections 32B and 32R formed in the semiconductor substrate 30, and cover the light receiving surfaces, for example. It is to be noted that the accumulation electrode 21B is preferably larger than the readout electrode 21A, which makes it possible to accumulate a large number of charges. In addition, it is sufficient if the accumulation electrodes 21B are directly opposed to the inorganic photoelectric conversion sections 32B and 32R as described above. The accumulation electrodes 21B do not necessarily have to be formed in the entire light receiving surface regions opposed to the inorganic photoelectric conversion sections 32 and 32R.

The lower electrode 21 includes an electrically-conducive layer having light-transmissivity, and includes, for example, ITO (indium-tin oxide). However, as a material included in the lower electrode 21, a tin oxide ($SnO_2$)-based material obtained by adding a dopant or a zinc oxide-based material formed by adding a dopant to aluminum zinc oxide (ZnO) may be used in addition to this ITO. Examples of the zinc oxide-based materials include aluminum zinc oxide (AZO) obtained by adding aluminum (Al) as the dopant, gallium (Ga)-added gallium zinc oxide (GZO), and indium (In)-added indium zinc oxide (IZO). In addition to these, CuI, $InSbO_4$, ZnMgO, $CuInO_2$, $MgIN_2O_4$, CdO, $ZnSnO_3$, or the like may also be used.

The organic photoelectric conversion layer 22 converts optical energy into electric energy. The organic photoelectric conversion layer 22 includes, for example, two or more types of organic semiconductor materials (p-type semiconductor material or n-type semiconductor material) that each function as a p-type semiconductor or an n-type semiconductor. The organic photoelectric conversion layer 22 has a junction surface (p/n junction surface) between these p-type semiconductor material and n-type semiconductor material in the layer. The p-type semiconductor relatively functions as an electron donor (donor), and the n-type semiconductor relatively functions an electron acceptor (acceptor). The organic photoelectric conversion layer 22 provides a field in which excitons generated at the time of light absorption are separated into electrons and holes, and specifically, excitons are separated into electrons and holes on the interface (p/n junction surface) between the electron donor and the electron acceptor.

The organic photoelectric conversion layer 22 may include, in addition to the p-type semiconductor material and the n-type semiconductor material, an organic semiconductor material, i.e., a so-called dye material, that photoelectrically converts light in a predetermined wavelength band and transmits light in another wavelength band. In a case where the organic photoelectric conversion layer 22 is formed by using three types of organic semiconductor materials including the p-type semiconductor material, the n-type semiconductor material, and the dye material, the p-type semiconductor material and the n-type semiconductor material each preferably include a material that transmits light in a visible region (e.g., 450 nm to 800 nm). The thickness of the organic photoelectric conversion layer 22 is, for example, 50 nm to 500 nm.

Examples of the organic semiconductor materials included in the organic photoelectric conversion layer 22 include quinacridone, chlorinated boron subphthalocyanine, pentacene, benzothienobenzothiophene, fullerene, and derivatives thereof. The organic photoelectric conversion layer 22 includes a combination of two or more types of the organic semiconductor materials described above. The above-described organic semiconductor materials function as a p-type semiconductor or an n-type semiconductor, depending on the combination.

It is to be noted that the organic semiconductor materials included in the organic photoelectric conversion layer 22 are not particularly limited. In addition to the organic semiconductor materials listed above, for example, any one type of naphthalene, anthracene, phenantherene, tetracene, pyrene, perylene, or fluoranthene, or derivatives thereof is preferably used. Alternatively, a polymer such as phenylenevinylene, fluorene, carbazole, indole, pyrene, pyrrole, picoline, thiophene, acetylene, and diacetylene, or a derivative thereof may be used. Additionally, it is possible to preferably use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthaquinone, an anthraquinone-based dye, a chain compound in which a condensed polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and croconic methine group as a bonded chain, or by a squarylium group or a croconic methine group, etc. It is to be noted that the above-described metal complex dye is preferably, but not limited to, a dithiol metal complex-based dye, a metallophthalocyanine dye, a metalloporphyrine dye, or a ruthenium complex dye.

There may be provided other layers between the organic photoelectric conversion layer 22 and the lower electrode 21 (specifically between the organic photoelectric conversion layer 22 and the insulation layer 27) and between the organic photoelectric conversion layer 22 and the upper electrode 23. Specifically, for example, an underlying film, a hole transport layer, an electron blocking film, the organic photoelectric conversion layer 22, a hole blocking film, a buffer film, an electron transport layer, a work function adjusting film, and the like may be stacked in order from the lower electrode 21 side.

The upper electrode 23 includes an electrically-conductive film having light-transmissivity similar to that of the lower electrode 21. In the solid-state imaging device 1 including the photoelectric converter 10 as one pixel, the upper electrode 23 may be separated for each pixel P, or may be formed as an electrode common to each pixel P. The thickness of the upper electrode 23 is, for example, 10 nm to 200 nm.

The fixed charge layer 24 may be a film having a positive fixed charge or a film having a negative fixed charge. As materials of the film having the negative fixed charge, hafnium oxide, aluminum oxide, zirconium oxide, tantalum oxide, titanium oxide, and the like are included. In addition, as a material other than the above-described materials, lanthanum oxide, praseodymium oxide, cerium oxide, neodymium oxide, promethium oxide, samarium oxide, europium oxide, gadolinium oxide, terbium oxide, dysprosium oxide, holemium oxide, thulium oxide, ytterbium oxide, lutetium oxide, yttrium oxide, an aluminum nitride film, a hafnium oxynitride film, an aluminum oxynitride film, or the like may be used.

The fixed charge layer 24 may also have a configuration in which two or more types of films are stacked. This makes it possible to further improve a function of a hole accumulation layer in a case of a film having the negative fixed charge, for example.

Although materials of the dielectric layer 25 are not limited in particular, the dielectric layer 25 includes a silicon oxide film, TEOS, a silicon nitride film, a silicon oxynitride film, or the like, for example.

The inter-layer insulating layer 26 includes, for example, a single-layer film including one type of silicon oxide, silicon nitride, silicon oxynitride (SiON), and the like, or a stacked film including two or more types thereof. The wiring lines 39B are provided in the inter-layer insulation layer 26 along with the pad sections 39A that each couple the readout electrode 21A of the lower electrode 21 and the through electrode 34. Each of these wiring lines 39B is a driving wiring line for applying a voltage to the accumulation electrode 21B, and is electrically coupled to the accumulation electrode 21B. Further, the optical filters 51B and 51R are respectively provided at the positions opposed to the inorganic photoelectric conversion sections 32B and 32R in layers (semiconductor substrate 30 side) lower than the accumulation electrodes 21B.

Figure 4:
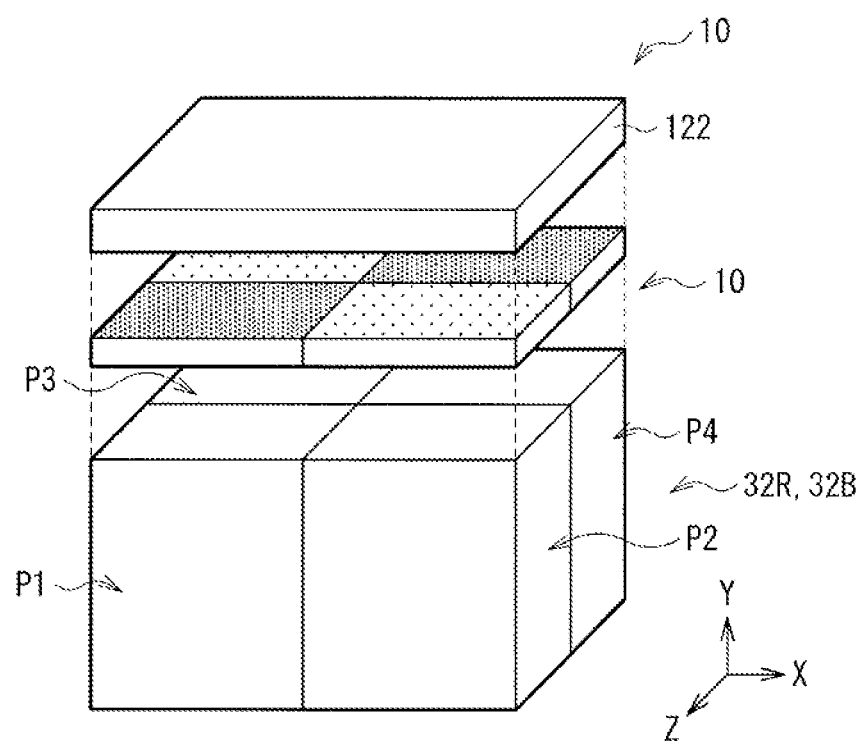
FIG. 4 is a schematic diagram illustrating a positional relationship between main parts of respective photoelectric converters in pixels P1, P2, P3, and P4 disposed in two rows and two columns.
Figure 5A:
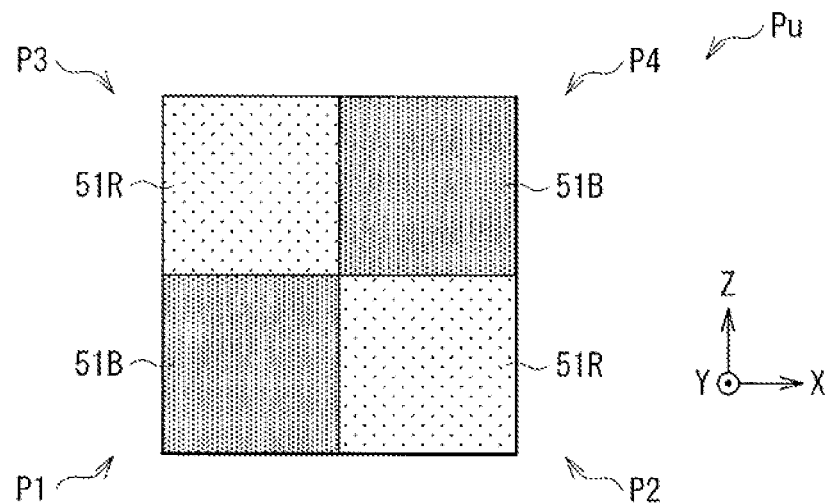
FIG. 5A is an example of disposition of optical filters in one pixel unit illustrated in FIG. 4.
Figure 5B:
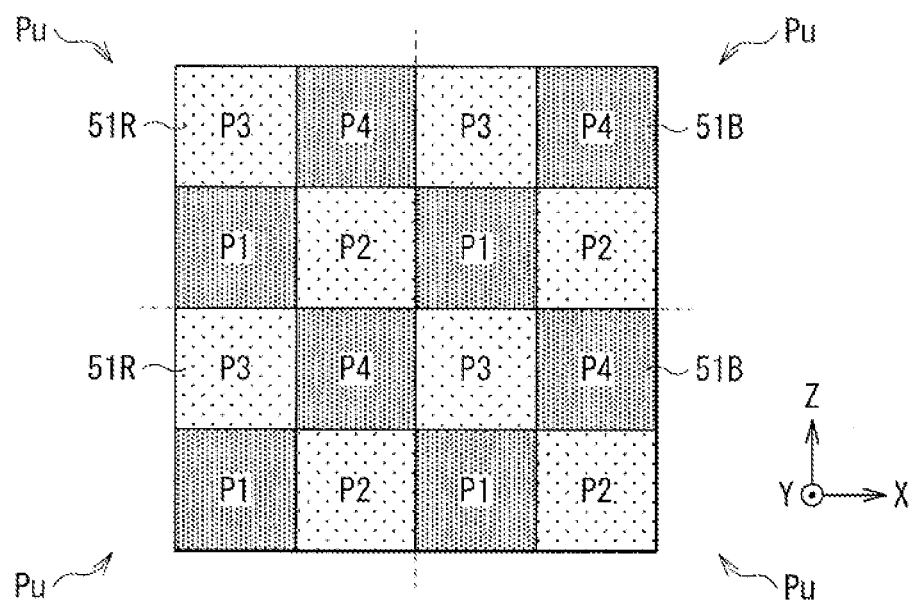
FIG. 5B is an example of disposition of optical filters obtained by combining four pixel units each of which is illustrated in FIG. 5A.
Figure 6A:
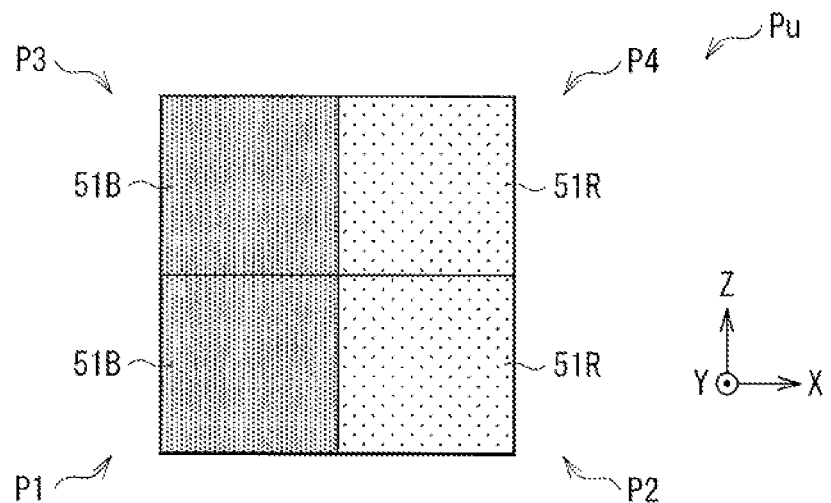
FIG. 6A is an example of the disposition of the optical filters in the one pixel unit illustrated in FIG. 4.
Figure 6B:
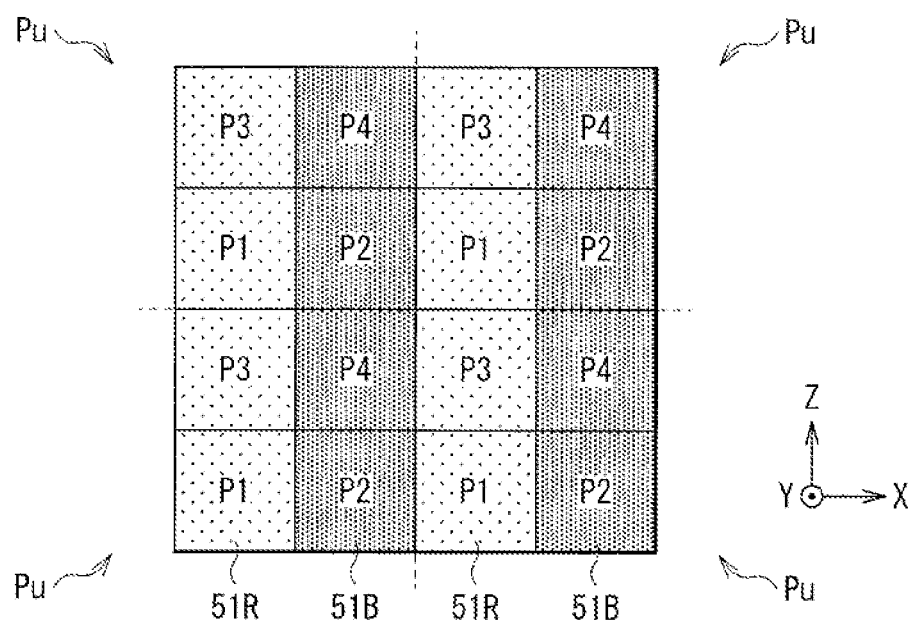
FIG. 6B is an example of the disposition of the optical filters obtained by combining the four pixel units each of which is illustrated in FIG. 6A.

The optical filters 51B and 51R each selectively transmit light in a predetermined wavelength band. Specifically, the optical filter 51B selectively transmits, for example, a wavelength (blue light; first wavelength band) of 450 nm to 495 nm. The optical filter 51R selectively transmits, for example, a wavelength (red light; second wavelength band) of 620 nm to 750 nmnm or less. FIG. 4 schematically illustrates the positional relationship between respective sections (organic photoelectric conversion layers 22, optical filters 51, and inorganic photoelectric conversion sections 32B and 32R) of the photoelectric converters 10. FIG. 4 schematically illustrates the positional relationship between the main parts of the respective photoelectric converters in the pixels P1, P2, P3, and P4. The pixels P1, P2, P3, and P4 are disposed in two rows and two columns in the XY planar direction, and included in one pixel unit Pu. In a case where the pixels P1, P2, P3, and P4 are disposed in two rows and two columns in this way, it is possible to dispose the optical filters 51B and 51R on respective diagonal lines, for example, as illustrated in FIG. 5A. FIG. 5B illustrates that four pixel units Pu each of which is illustrated in FIG. 4 are disposed, and the optical filters 51B and 51R are disposed in a checkerboard pattern. That is, the different optical filters 51B and 51R are disposed at the respective adjacent positions. The disposition of the optical filters 51B and 51R is not limited thereto, but the same optical filters may be disposed, for example, in the Z axis direction, for example, as illustrated in FIG. 6A. In a case where four pixel units Pu each of which is illustrated in FIG. 6A are disposed, the optical filters 51B and 51R are disposed in a striped pattern as illustrated in FIG. 6B.

The optical filters 51 (51B and 51R) may be any filters as long as the filters each selectively transmit light in a predetermined wavelength band as described above. Examples thereof include organic pigment dispersion type, nanohole type, metal ion implantation type, quantum dot type, and multilayer interference type optical filters.

The organic pigment dispersion type optical filter is a general color filter.

The nanohole type optical filter includes, for example, a periodical array of a plurality of openings on a metal thin film. Periodical disposition with the distance between the openings controlled allows the metal thin film to transmit only light having a predetermined wavelength. For example, periodically disposing openings each having a diameter of 150 nm at a pitch of 260 nm configures the optical filter 51B to transmit blue light having a wavelength of 450 nm to 495 nm. For example, periodically disposing openings each having a diameter of 150 nm at a pitch of 420 nm configures the optical filter 51R to transmit red light having a wavelength of 620 nm to 750 nm.

The metal ion implantation type optical filter includes a metal nanoparticle, and is formable, for example, by implanting metal ions into an inorganic material film such as a silicon oxide film by ion implantation.

The quantum dot type optical filter has quantum dots dispersed in a layer. It is preferable that quantum dots each have a higher refractive index than that of a layer (base material of the optical filter) in which the quantum dot is embedded, and be uniform in diameter. This offers an optical characteristic to selectively transmit light within a predetermined wavelength range.

The multilayer interference type optical filter includes a multilayer film (multilayer interference film) in which two or more types of films having different refractive indices are alternately stacked. Examples of the films having different refractive indices include a combination of a silicon oxide ($SiO_2$) film and a silicon nitride (SiN) film, a combination of a silicon oxide ($SiO_2$) film and a titanium oxide ($TiO_2$) film, and the like.

The insulation layer 27 electrically separates the accumulation electrode 21B and the organic photoelectric conversion layer 22 from each other. The insulation layer 27 is provided on the inter-layer insulation layer 26, for example, to cover the lower electrode 21. In addition, the insulation layer 27 has the opening 27H on the readout electrode 21A of the lower electrode 21, and the readout electrode 21A and the organic photoelectric conversion layer 22 are electrically coupled through this opening 27H. The insulating layer 27 is formable, for example, by using a material similar to that of the inter-layer insulating layer 26, and includes, for example, a single-layer film including one type of silicon oxide, silicon nitride, silicon oxynitride (SiON), and the like, or a stacked film including two or more types thereof. The thickness of the insulating layer 27 is, for example, 20 nm to 500 nm.

The protective layer 28 includes a material having light-transmissivity, and includes, for example, a single layer film including any of silicon oxide, silicon nitride, silicon oxynitride, and the like, or a stacked film including two or more types thereof. The thickness of the protective layer 28 is, for example, 100 nm to 30000 nm.

It is to be noted that there may be a light-shielding film, for example, above the readout electrode 21A in the protective layer 28. In that case, it is preferable to provide the light-shielding film to cover the region of the readout electrode 21A in direct contact with at least the organic photoelectric conversion layer 22 without covering at least the accumulation electrode 21B.

The semiconductor substrate 30 includes, for example, an n-type silicon (Si) substrate, and has a p-well 31 in a predetermined region. The second surface 30B of the p-well 31 is provided with the transfer transistors Tr 3 and Tr 4, the amplifier transistor AMP, the reset transistor RST, the selection transistor SEL, and the like. In addition, a peripheral portion of the semiconductor substrate 30 is provided with a peripheral circuit (not illustrated) including a logic circuit or the like.

The reset transistor RST1 (reset transistor Tr1rst) resets the charges transferred from the organic photoelectric conversion section 20 to the floating diffusion FD1, and includes, for example, a MOS transistor. Specifically, the reset transistor Tr1rst includes a reset gate Grst1, a channel formation region 36A, and the source/drain regions 36B and 36C. The reset gate Grst1 is coupled to a reset line RST1. The one source/drain region 36B of the reset transistor Tr1rst also serves as the floating diffusion FD1. The other source/drain region 36C included in the reset transistor Tr1rst is coupled to a power supply VDD.

The amplifier transistor AMP1 is a modulator that modulates, into a voltage, an amount of the charges generated in the organic photoelectric conversion section 20, and includes, for example, a MOS transistor. Specifically, the amplifier transistor AMP includes the gate Gamp, a channel formation region 35A, and the source/drain regions 35B and 35C. A gate Gamp1 is coupled to the readout electrode 21A and the one source/drain region 36B (floating diffusion FD1) of the reset transistor Tr1rst through the lower first contact 45, the coupling section 41A, the lower second contact 46, the through electrode 34, and the like. In addition, the one source/drain region 35B shares a region with the other source/drain region 36C included in the reset transistor Tr1rst, and is coupled to the power supply VDD, for example.

A selection transistor SEL1 (selection transistor TR1sel) includes a gate Gsel1, a channel formation region 34A, and source/drain regions 34B and 34C. The gate Gsel1 is coupled to a selection line SEL1. In addition, the one source/drain region 34B shares a region with the other source/drain region 35C included in the amplifier transistor AMP, and the other source/drain region 34C is coupled to a signal line (data output line) VSL1.

The reset transistor RST2 (reset transistor Tr2rst) resets the charges transferred from the organic photoelectric conversion section 20 to the floating diffusion FD2, and includes, for example, a MOS transistor. Specifically, the reset transistor Tr2rst includes a reset gate Grst2, the channel formation region 36A, and the source/drain regions 36B and 36C. The reset gate Grst is coupled to a reset line RST2. The one source/drain region 36B of the reset transistor Tr2rst also serves as the floating diffusion FD2. The other source/drain region 36C included in the reset transistor Tr2rst is coupled to the power supply VDD.

The amplifier transistor AMP2 is a modulator that modulates, into a voltage, an amount of the charges generated in the organic photoelectric conversion section 20, and includes, for example, a MOS transistor. Specifically, the amplifier transistor AMP2 includes the gate Gamp2, the channel formation region 35A, and the source/drain regions 35B and 35C. A gate Gamp2 is coupled to the readout electrode 21A and the one source/drain region 36B (floating diffusion FD2) of the reset transistor Tr2rst through the lower first contact 45, the coupling section 41A, the lower second contact 46, the through electrode 34, and the like. In addition, the one source/drain region 35B shares a region with the other source/drain region 36C included in the reset transistor Tr2rst, and is coupled to the power supply VDD, for example.

A selection transistor SEL2 (selection transistor TR2sel) includes a gate Gsel2, the channel formation region 34A, and the source/drain regions 34B and 34C. The gate Gsel2 is coupled to a selection line SEL2. In addition, the one source/drain region 34B shares a region with the other source/drain region 35C included in the amplifier transistor AMP2, and the other source/drain region 34C is coupled to a signal line (data output line) VSL2.

Each of the inorganic photoelectric conversion sections 32B and 32R has a p-n junction in a predetermined region of the semiconductor substrate 30. The inorganic photoelectric conversion section 32B detects blue light selectively transmitted by the optical filter 51B, and accumulates the detected blue light as signal charges corresponding to blue. The inorganic photoelectric conversion section 32R detects red light selectively transmitted by the optical filter 51R, and accumulates signal charges corresponding to red. It is to be noted that blue (B) is a color corresponding to a wavelength band of 450 nm to 495 nm, for example, and red (R) is a color corresponding to a wavelength band of 620 nm to 750 nm, for example. It is sufficient if the inorganic photoelectric conversion sections 32B and 32R are able to detect pieces of light of a portion or all of the respective wavelength bands. The inorganic photoelectric conversion section 32B and the inorganic photoelectric conversion section 32R each have, for example, a p+ region that is to be a hole accumulation layer, and an n region that is to be an electron accumulation layer. In addition, FIG. 1 illustrates an example in which the two types of inorganic photoelectric conversion sections 32B and 32R are formed to have the same height in the film thickness direction (Y axis direction) in the semiconductor substrate 30 and disposed side by side, but this is not limitative. For example, they may be provided at spatially different positions (different in height in the film thickness direction) in the semiconductor substrate 30.

The transfer transistor Tr3 (transfer transistor TR3trs) transfers, to the floating diffusion FD3, signal charges (here, electrons) corresponding to blue which are generated and accumulated in the inorganic photoelectric conversion section 32B. In addition, the transfer transistor TR3trs is coupled to a transfer gate line TG3. Further, the floating diffusion FD3 is provided in a region 37C in the vicinity of the gate Gtrs3 of the transfer transistor TR3trs. The charges accumulated in the inorganic photoelectric conversion section 32B are read out to the floating diffusion FD3 through the transfer channel formed along the gate Gtrs3.

The transfer transistor Tr4 (transfer transistor TR4trs) transfers, to the floating diffusion FD4, the signal charges (electrons, here) generated and accumulated in the inorganic photoelectric conversion section 32R. The signal charges correspond to red. The transfer transistor Tr4 (transfer transistor TR4trs) includes, for example, a MOS transistor. In addition, the transfer transistor TR4trs is coupled to a transfer gate line TG4. Further, the floating diffusion FD4 is provided in the region 38C in the vicinity of the gate Gtrs4 of the transfer transistor TR4trs. The charges accumulated in the inorganic photoelectric conversion section 32R are read out to the floating diffusion FD4 through the transfer channel formed along the gate Gtrs4.

The second surface 30B side of the semiconductor substrate 30 is further provided with a reset transistor TR3rst, an amplifier transistor TR3amp, and a selection transistor TR3sel included in the controller of the inorganic photoelectric conversion section 32B. In addition, there are provided a reset transistor TR4rst, an amplifier transistor TR4amp, and a selection transistor TR4sel included in the controller of the inorganic photoelectric conversion section 32R.

The reset transistor TR3rst includes a gate, a channel formation region, and a source/drain region. The gate of the reset transistor TR3rst is coupled to a reset line RST3, and one of the source/drain regions of the reset transistor TR3rst is coupled to the power supply VDD. The other source/drain region of the reset transistor TR3rst also serves as the floating diffusion FD3.

The amplifier transistor TR3amp includes a gate, a channel formation region, and a source/drain region. The gate is coupled to the other source/drain region (floating diffusion FD3) of the reset transistor TR3rst. In addition, one of the source/drain regions included in the amplifier transistor TR3amp shares a region with one of the source/drain regions included in the reset transistor TR3rst, and is coupled to the power source VDD, for example.

The selection transistor TR3sel includes a gate, a channel formation region, and a source/drain region. The gate is coupled to a selection line SEL3. In addition, one of the source/drains region included in the selection transistor TR3sel shares a region with the other source/drain region included in the amplifier transistor TR3amp. The other source/drain region included in the selection transistor TR3sel is coupled to a signal line (data output line) VSL3.

The reset transistor TR4rst includes a gate, a channel formation region, and a source/drain region. The gate of the reset transistor TR4rst is coupled to a reset line RST4, and one of the source/drain regions included in the reset transistor TR4rst is coupled to the power supply VDD. The other source/drain region included in the reset transistor TR4rst also serves as the floating diffusion FD4.

The amplifier transistor TR4amp includes a gate, a channel formation region, and a source/drain region. The gate is coupled to the other source/drain region (floating diffusion FD4) included in the reset transistor TR4rst. In addition, one of the source/drain regions included in the amplifier transistor TR4amp shares a region with one of the source/drain regions included in the reset transistor TR4rst, and is coupled to the power source VDD, for example.

The selection transistor TR4sel includes a gate, a channel formation region, and a source/drain region. The gate is coupled to a selection line SEL4. In addition, one of the source/drains region included in the selection transistor TR4sel shares a region with the other source/drain region included in the amplifier transistor TR4amp. The other source/drain region included in the selection transistor TR4sel is coupled to a signal line (data output line) VSL4.

The reset lines RST1, RST2, RST3, and RST4, the selection lines SEL1, SEL2, SEL3, and SEL4, and the transfer gate lines TG3 and TG4 are each coupled to a vertical drive circuit 112 included in a drive circuit. The signal lines (data output lines) VSL1, VSL2, VSL3, and VSL4 are coupled to a column signal processing circuit 113 included in the drive circuit.

A lower first contact 45, the lower second contact 46, the upper first contact 29A, and an upper second contact 29B each include, for example, a doped silicon material such as PDAS (Phosphorus Doped Amorphous Silicon), or a metallic material such as aluminum (Al), tungsten (W), titanium (Ti), cobalt (Co), hafnium (Hf), or tantalum (Ta).

1-2. Method of Manufacturing Photoelectric Converter

It is possible to manufacture the photoelectric converter 10 according to the present embodiment, for example, in the following manner. It is to be noted that description is made here with reference to the photoelectric converter 10 in the pixel P1, but it is also possible to similarly form the photoelectric converter 10 in the pixel P2 in the same manufacturing process.

Figure 7:
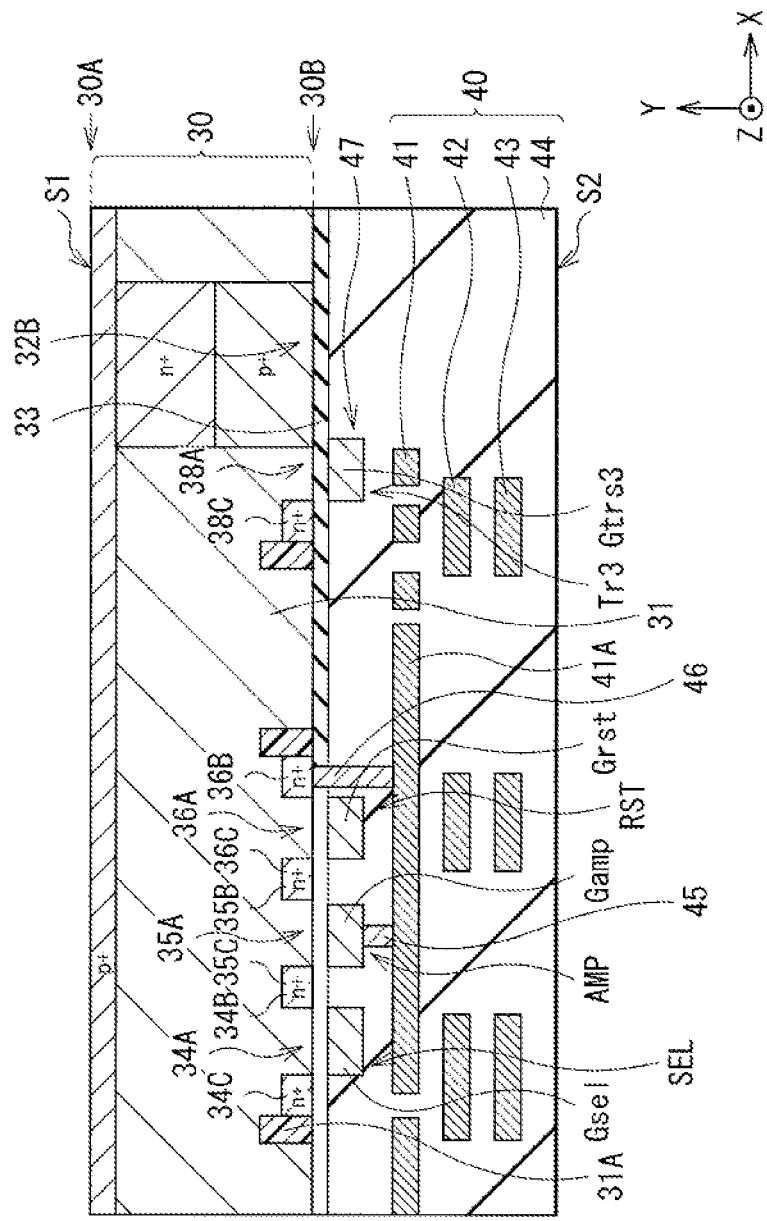
FIG. 7 is a cross-sectional view for describing a method of manufacturing the photoelectric converter illustrated in FIG. 1.
Figure 8:
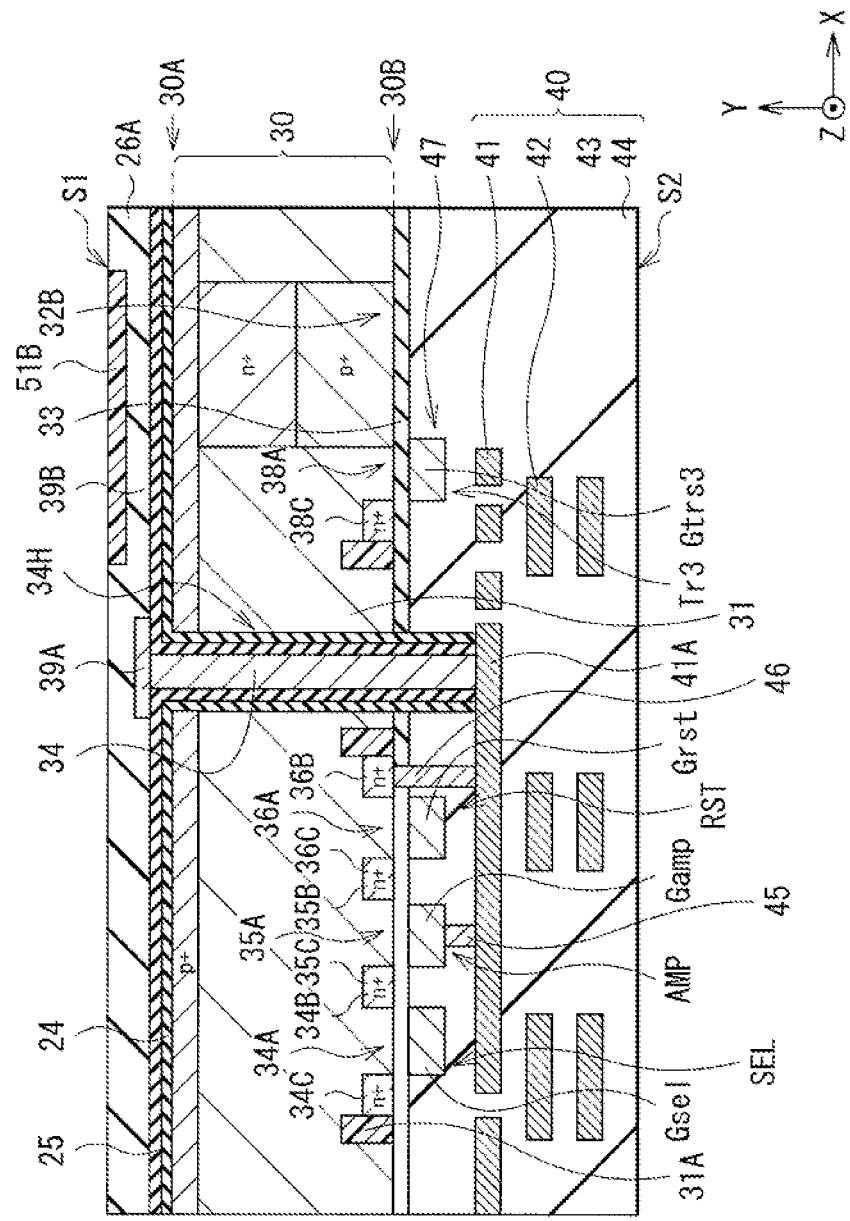
FIG. 8 is a cross-sectional view illustrating a process following FIG. 7.

FIGS. 7 and 8 each illustrate a method of manufacturing the photoelectric converter 10 in order of processes. First, as illustrated in FIG. 7, the p-well 31, for example, is formed as a first electrically-conductive well in the semiconductor substrate 30. The second electrically-conductive (e.g., n-type) inorganic photoelectric conversion section 32B is formed in this p-well 31. A p+ region is formed in the vicinity of the first surface 30A of the semiconductor substrate 30.

As also illustrated in FIG. 7, on the second surface 30B of the semiconductor substrate 30, after n+ regions serving, for example, as the floating diffusions FD1 to FD4 are formed, a gate insulating layer 33 and a gate wiring layer 47 including the respective gates of the transfer transistor Tr3, the transfer transistor Tr4, the selection transistor SEL, the amplifier transistor AMP, and the reset transistor RST are formed. This forms the transfer transistor Tr3, the transfer transistor Tr4, the selection transistor SEL, the amplifier transistor AMP, and the reset transistor RST. Further, the multilayer wiring line 40 is formed on the second surface 30B of the semiconductor substrate 30. The multilayer wiring line 40 includes wiring layers 41 to 43 and the insulating layer 44. The wiring layers 41 to 43 include the lower first contact 45, the lower second contact 46, and the coupling section 41A.

As a base of the semiconductor substrate 30, for example, an SOI (Silicon on Insulator) substrate is used in which the semiconductor substrate 30, an embedded oxide film (not illustrated), and a holding substrate (not illustrated) are stacked. Although not illustrated in FIG. 7, the embedded oxide film and the holding substrate are joined to the first substrate surface 30A of the semiconductor substrate 30. After ion implantation, an annealing process is performed.

Then, a support substrate (not illustrated), another semiconductor base, or the like is joined to the second surface 30B side (multilayer wiring line 40 side) of the semiconductor substrate 30 and flipped vertically. Subsequently, the semiconductor substrate 30 is separated from the embedded oxide film and the holding substrate of the SOI substrate to expose the first surface 30A of the semiconductor substrate 30. It is possible to perform these processes with technology used in a normal CMOS process such as ion implantation and CVD (Chemical Vapor Deposition).

Then, as illustrated in FIG. 8, the semiconductor substrate 30 is processed from the first surface 30A side with dry etching, for example, to form an annular opening 34H, for example. The opening 34H has a depth penetrating from the first surface 30A to the second surface 30B of the semiconductor substrate 30 as illustrated in FIG. 8, and reaching the coupling section 41A, for example.

Subsequently, for example, the negative fixed charge layer 24 is formed on the first surface 30A of the semiconductor substrate 30 and the side surface of the opening 34H. Two or more types of films may be stacked as the negative fixed charge layer 24. This makes it possible to further improve the function of the hole accumulation layer. The dielectric layer 25 is formed after the negative fixed charge layer 24 is formed. Next, the pad section 39A is formed at a predetermined position on the dielectric layer 25, and an insulation layer is then formed on the dielectric layer 25 and the pad section 39A. Further, the optical filters 51 (52B and 51R) are patterned and formed.

The organic photoelectric conversion section 20, the on-chip lens 52, and the like are sequentially formed thereafter. Specifically, for example, an electrically-conductive film is formed on an insulation layer 26A, and a photoresist PR is then formed at a predetermined position on the electrically-conductive film. Afterwards, etching and removing the photoresist PR pattern the wiring line 39B.

Next, an insulation layer is formed on the insulation layer 26A and the wiring line 39B, and the surface of the insulation layer 26B is then planarized by using a CMP (Chemical Mechanical Polishing) method, for example. Subsequently, respective openings are formed on the pad section 39A and the wiring line 39B, and the openings are then filled, for example, with electrically-conductive materials such as Al to form the upper first contact 29A and the upper second contact 29B.

Subsequently, an electrically-conductive film is formed on the upper first contact 29A, the upper second contact 29B, and the inter-layer insulation layer 26, and the photoresist PR is then formed at a predetermined position in the electrically-conductive film. Afterwards, the readout electrode 21A and the accumulation electrode 21B are patterned by etching and removing the photoresist PR.

Next, the insulating layer 27 is formed on the inter-layer insulating layer 26, the readout electrode 21A, and the accumulation electrode 21B, and the opening 27H is then provided on the readout electrode 21A. Afterwards, the organic photoelectric conversion layer 22, the upper electrode 23, and the protective layer 28 are formed on the inter-layer insulation layer 26. It is to be noted that, in a case where another organic layer (e.g., electron-blocking layer, etc.) is formed on or under the organic photoelectric conversion layer 22 as described above, it is desirable to continuously form the other organic layer (by a vacuum-consistent process) in a vacuum process. In addition, the method of forming the organic photoelectric conversion layer 22 is not necessarily limited to the method using a vacuum deposition method, but another method, for example, a spin-coating technique, a printing technique, or the like may be used. Lastly, the optical members such as the planarization layer and the on-chip lens 52 are disposed. Thus, the photoelectric converter 10 illustrated in FIG. 1 is completed.

When light enters the organic photoelectric conversion section 20 through the on-chip lens 52 in the photoelectric converter 10, the light passes through the organic photoelectric conversion section 20, the inorganic photoelectric conversion section (or the inorganic photoelectric conversion section 32R) in this order, and the respective pieces of light of green, blue, and red are photoelectrically converted in the passing process. The following describes an operation of acquiring signals of the respective colors.

(Acquisition of Green Color Signal by Organic Photoelectric Conversion Section 20)

First, the green light of the pieces of light inputted into the photoelectric converter 10 is selectively detected (absorbed) and photoelectrically converted by the organic photoelectric conversion section 20. The following describes the pixel P1, but the same applies to the pixel P2.

The organic photoelectric conversion section 20 is coupled to a gate Gamp of the amplifier transistor AMP and the floating diffusion FD1 (FD2 in the pixel P2) through the through electrode 34. Thus, the electron of the electron-hole pair generated in the organic photoelectric conversion section 20 is taken out from the lower electrode 21 side, transferred to the second surface 30B side of the semiconductor substrate 30 through the through electrode 34, and accumulated in the floating diffusion FD1. At the same time as this, the amplifier transistor AMP modulates the amount of the charges generated in the organic photoelectric conversion section 20 into a voltage.

In addition, the reset gate Grst of the reset transistor RST is disposed next to the floating diffusion FD1. This causes the reset transistor RST to reset the charges accumulated in the floating diffusion FD1.

Here, the organic photoelectric conversion section 20 is coupled to not only the amplifier transistor AMP, but also the floating diffusion FD1 through the through electrode 34, making it possible for the reset transistor RST to easily reset the charges accumulated in the floating diffusion FD1.

In contrast, in a case where the through electrode 34 and the floating diffusion FD1 are not coupled, it is difficult to reset the charges accumulated in the floating diffusion FD1, resulting in application of a large voltage to pull out the charges to the upper electrode 23 side. Accordingly, there is a possibility that the organic photoelectric conversion layer 22 is damaged. In addition, a structure that enables resetting in a short period of time leads to increased dark-time noise and results in a trade-off. This structure is thus difficult.

Figure 13:
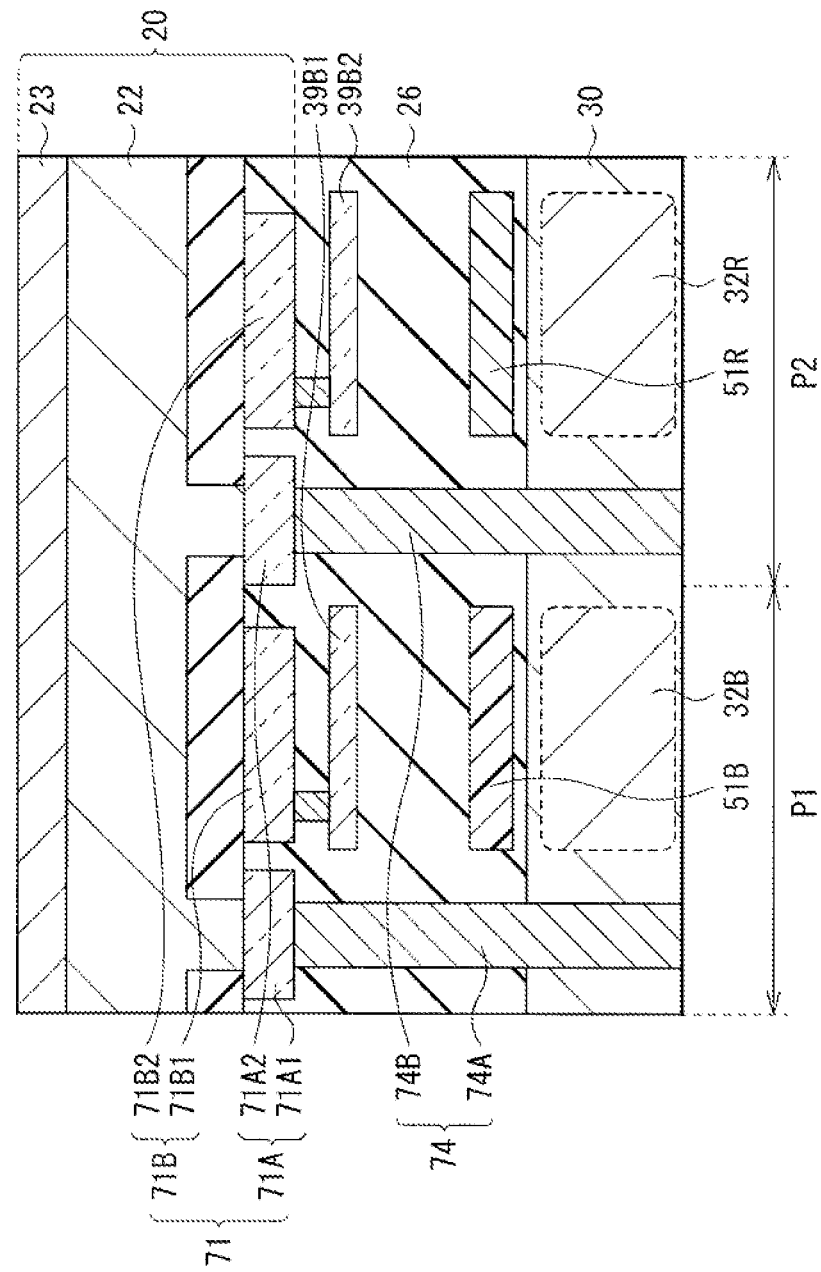
FIG. 13 is a schematic diagram illustrating a stacked configuration of main parts of photoelectric converters according to a modification example 3 of the present disclosure.

FIG. 13 illustrates an operation example of the photoelectric converter 10. (A) illustrates a potential at the accumulation electrode 21B, (B) illustrates a potential at the floating diffusion FD1 (readout electrode 21A), and (C) illustrates a potential at the gate (Gsel) of the reset transistor TR1rst. In the photoelectric converter 10, voltages are individually applied to the readout electrode 21A and the accumulation electrode 21B.

In the photoelectric converter 10, in the accumulation period, a potential V1 is applied to the readout electrode 21A from the drive circuit, and a potential V2 is applied to the accumulation electrode 21B. Here, it is assumed that the potentials V1 and V2 satisfy V2>V1. This causes charges (here, electrons) generated by photoelectric conversion to be drawn to the accumulation electrode 21B, and accumulated in the region of the organic photoelectric conversion layer 22 opposed to the accumulation electrode 21B (accumulation period). In this regard, the value of a potential in the region of the organic photoelectric conversion layer 22 opposed to the accumulation electrode 21B becomes more negative with the lapse of time of photoelectric conversion. It is to be noted that holes are sent from the upper electrode 23 to the drive circuit.

In the photoelectric converter 10, a reset operation is performed at a later stage of the accumulation period. Specifically, at a timing t1, a scanning section changes the voltage of a reset signal RST from a low level to a high level. This turns on the reset transistor TR1rst in the unit pixel P. As a result, the voltage of the floating diffusion FD1 is set at the power supply voltage VDD, and the voltage of the floating diffusion FD1 is reset (reset period).

After the reset operation is completed, the charges are read out. Specifically, at a timing t 2, a potential V3 is applied to the readout electrode 21A from the drive circuit, and a potential V4 is applied to the accumulation electrode 21B. Here, it is assumed that the potentials V3 and V4 satisfy V3<V4. This causes the charges (here, electrons) accumulated in the region corresponding to the accumulation electrode 21B to be read out from the readout electrode 21A to the floating diffusion FD1. That is, the charges accumulated in the organic photoelectric conversion layer 22 are read out by the controller (transfer period).

After the readout operation is completed, the potential V1 is applied from the drive circuit to the readout electrode 21A, and the potential V2 is applied to the accumulation electrode 21B again. This causes charges (here, electrons) generated by photoelectric conversion to be drawn to the accumulation electrode 21B, and accumulated in the region of the organic photoelectric conversion layer 22 opposed to the accumulation electrode 21B (accumulation period).

(Acquisition of Blue Color Signal and Red Color Signal by Inorganic Photoelectric Conversion Sections 32B and 32R)

Subsequently, the blue light and the red light of the pieces of light passing through the organic photoelectric conversion section 20 are respectively absorbed in sequence and photoelectrically converted in the inorganic photoelectric conversion section 32B and the inorganic photoelectric conversion section 32R. In the inorganic photoelectric conversion section 32B, electrons corresponding to the inputted blue light are accumulated in the n region of the inorganic photoelectric conversion section 32B, and the accumulated electrons are transferred to the floating diffusion FD3 by the transfer transistor Tr3. Similarly, in the inorganic photoelectric conversion section 32R, electrons corresponding to the inputted red light are accumulated in the n region of the inorganic photoelectric conversion section 32R, and the accumulated electrons are transferred to the floating diffusion FD4 by the transfer transistor Tr4.

1-3. Workings and Effects

A so-called longitudinal spectral type solid-state imaging device in which an inorganic photoelectric conversion section provided in the above-described semiconductor substrate (Si substrate) and an organic photoelectric conversion film formed on the back surface side of the semiconductor substrate are stacked absorbs a first light component with the organic photoelectric conversion film and absorbs the other light components with the inorganic photoelectric conversion section (photodiode; PD) in the Si substrate. The Si substrate has a high absorptivity on the light irradiation surface side. It is thus difficult to detect a light component with no color mixture if the colors of light passing through the organic photoelectric conversion film are separated in the depth direction of the Si substrate.

In contrast, in the present embodiment, the optical filters 51 are disposed between the organic photoelectric conversion sections 20 and the inorganic photoelectric conversion sections 32 (32B and 32R). This makes it possible to remove an unnecessary wavelength component of wavelengths passing through the organic photoelectric conversion section 20. In other words, it is possible to selectively irradiate the inorganic photoelectric conversion sections 32 (32B and 32R) with desired wavelength components.

As described above, the optical filters 51 (51B and 51R) are disposed between the organic photoelectric conversion sections 20 and the inorganic photoelectric conversion sections 32 (32B and 32R) of the photoelectric converters 10 according to the present embodiment. This makes it possible to remove unnecessary wavelength components and selectively irradiate the inorganic photoelectric conversion sections 32 (32B and 32R) with desired wavelength components. This makes it possible to improve spectral characteristics.

Next, modification examples 1 to 3 are described. Components similar to those of the above-described embodiment are denoted with the same reference numerals below, and descriptions thereof are omitted as appropriate.

2. MODIFICATION EXAMPLES

2-1. Modification Example 1

Figure 10A:
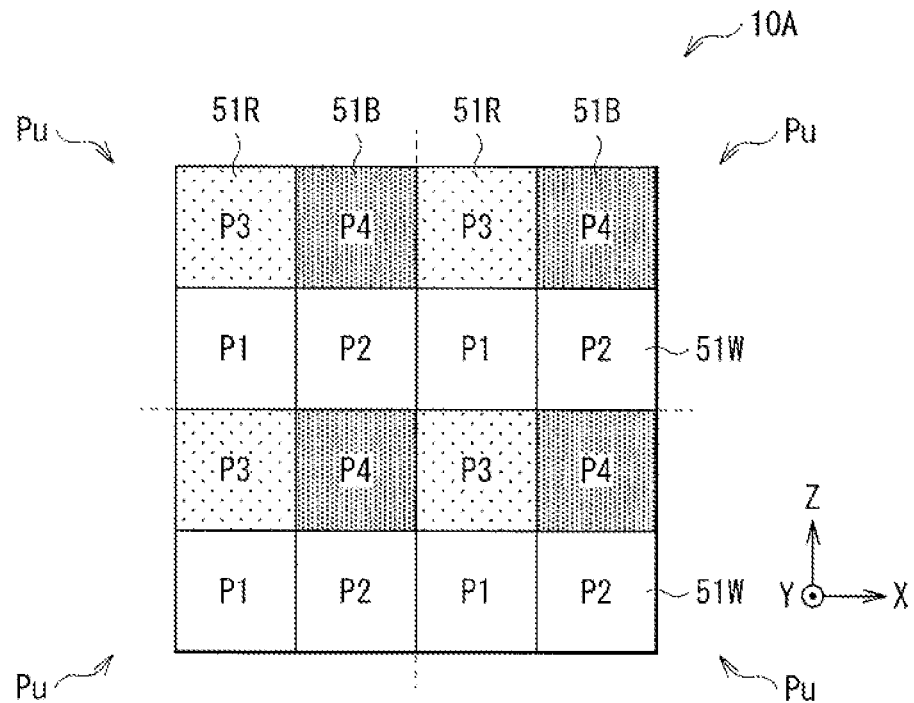
FIG. 10A is an example of disposition of optical filters in a modification example 1 of the present disclosure.
Figure 10B:
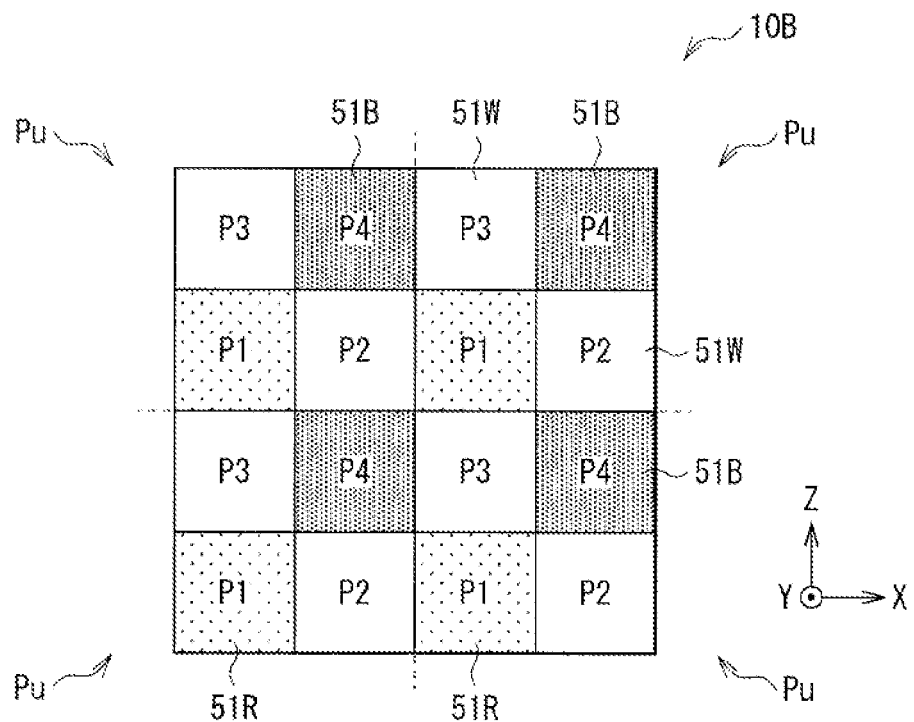
FIG. 10B is another example of the disposition of the optical filters in the modification example 1 of the present disclosure.

Each of FIGS. 10A and 10B illustrates an example of the disposition of the optical filters 51 (51B, 51R, and 51W) in the photoelectric converters 10A according to a modification example (modification example 1) of the present disclosure. As with the photoelectric converter 10 according to the above-described embodiment, this the photoelectric converter 10A is included in one pixel (unit pixel P) in a solid-state imaging device (solid-state imaging device 1; see FIG. 26) such as a CMOS image sensor used in an electronic apparatus such as a digital still camera or a video camera, for example. The photoelectric converter 10A according to the present modification example is different from that of the above-described embodiment in that the optical filter 51W which transmits at least visible light is added as the optical filter 51.

As in the above-described embodiment, the four photoelectric converters 10A are included in one pixel unit Pu in the present modification example. The three types of optical filters 51B, 51R, and 51W are used for the four photoelectric converters 10A. In a case where the three types of optical filters 51B, 51R, and 51W are disposed in the four photoelectric converters 10A in this way, optical filters of one type (optical filters 51W in FIG. 10A) may be disposed side by side, for example in the X axis direction, for example, as illustrated in FIG. 10A. The two remaining types of optical filters (optical filters 51B and 51R in FIG. 10A) may be alternately disposed, for example, in the X axis direction. Alternatively, for example, as illustrated in FIG. 10B, optical filters of one type (optical filters 51W in FIG. 10B) may be disposed, for example, on one diagonal line, and the two remaining types of optical filters (optical filters 51B and 51R in FIG. 10B) may be disposed, for example, on another diagonal line.

For example, a pixel in which the optical filters 51W that transmit visible light are disposed on the inorganic photoelectric conversion sections 32 are added to the pixel units Pu in addition to pixels including the optical filters 51B and 51R on the inorganic photoelectric conversion sections 32B and 32R in this way, thereby allowing the inorganic photoelectric conversion sections 32 to be irradiated with more light. This makes it possible to increase an S (Signal)/N (Noise) ratio in a low illuminance environment while improving a spectral characteristic.

2-2. Modification Example 2

Figure 11:
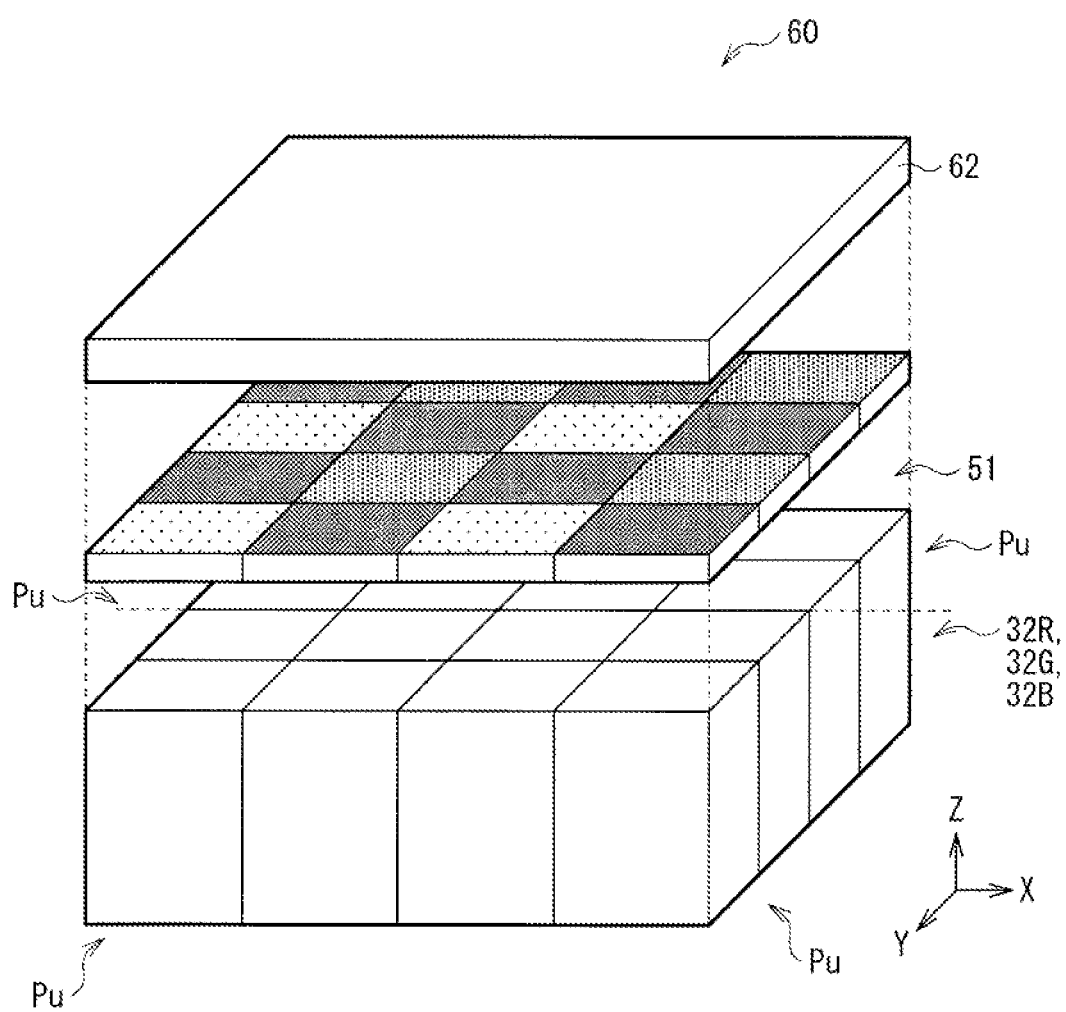
FIG. 11 is a schematic diagram illustrating a positional relationship between main parts obtained by combining four pixel units in each of which four photoelectric converters are disposed in two rows and two columns in a modification example 2 of the present disclosure.

FIG. 11 schematically illustrates the positional relationship between main parts obtained by combining four pixel units Pu in each of which four photoelectric converters 60 according to a modification example (modification example 2) of the present disclosure are disposed in two rows and two columns. As with the photoelectric converter 10 according to the above-described embodiment, the photoelectric converter 60 is included in one pixel (unit pixel P) in a solid-state imaging device (solid-state imaging device 1; see FIG. 26) such as a CMOS image sensor used in an electronic apparatus such as a digital still camera or a video camera, for example. The photoelectric converter 60 according to the present modification example is different from that of the above-described embodiment in that an organic photoelectric conversion layer 62 is configured as a photoelectric conversion layer that, for example, absorbs infrared light (IR) and transmits visible light, and any one of the inorganic photoelectric conversion section 32R that absorbs red light in addition to an inorganic photoelectric conversion section 32G that absorbs green light and the inorganic photoelectric conversion section 32B that absorbs blue light in the semiconductor substrate 30 is provided.

Figure 12A:
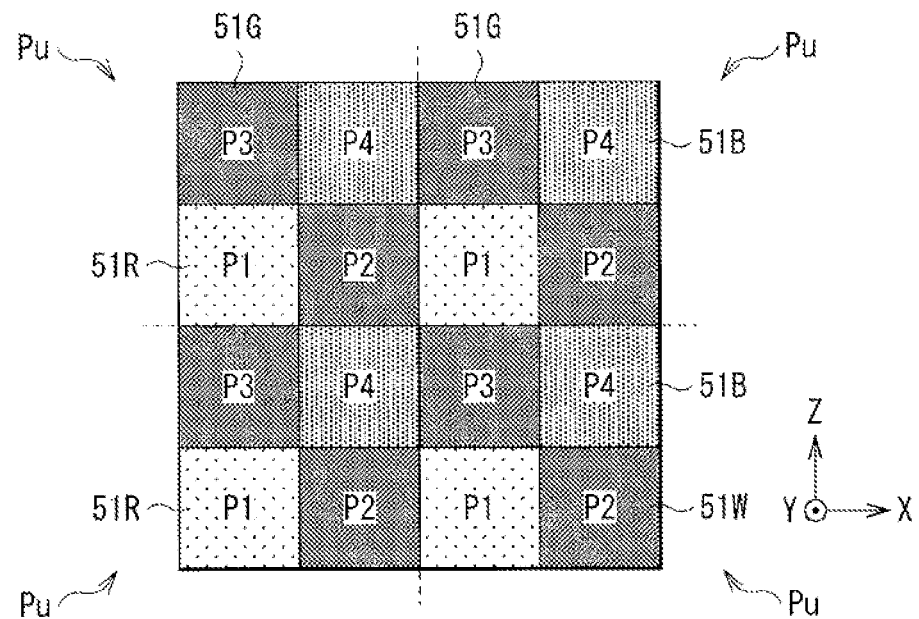
FIG. 12A is an example of disposition of optical filters in a modification example 2 of the present disclosure.

FIG. 12A illustrates an example of the disposition of the optical filters 51 (51R, 51G, and 51B) disposed in the pixel units Pu. The pixel units Pu each include, for example, the four pixels P1, P2, P3, and P4. As in the above-described modification example 1, for example, optical filters of one type (optical filters 51G in FIG. 12A) among the optical filters 51R, 51G, and 51B are disposed, for example, on one diagonal line, and the two remaining types of optical filters (optical filters 51R and 51B in FIG. 12B) are disposed, for example, on another diagonal line. Disposing these four pixels P in two rows and two columns makes the optical filters 51R, 51G, and 51B disposed in a so-called Bayer array. In addition, although not illustrated, optical filters of one type (e.g., optical filters 51G) may be disposed side by side, for example, in the X axis direction, and the two remaining types of optical filters (e.g., optical filters 51R and 51B) may be alternately disposed, for example, in the X axis direction as in the modification example 1.

Figure 12B:
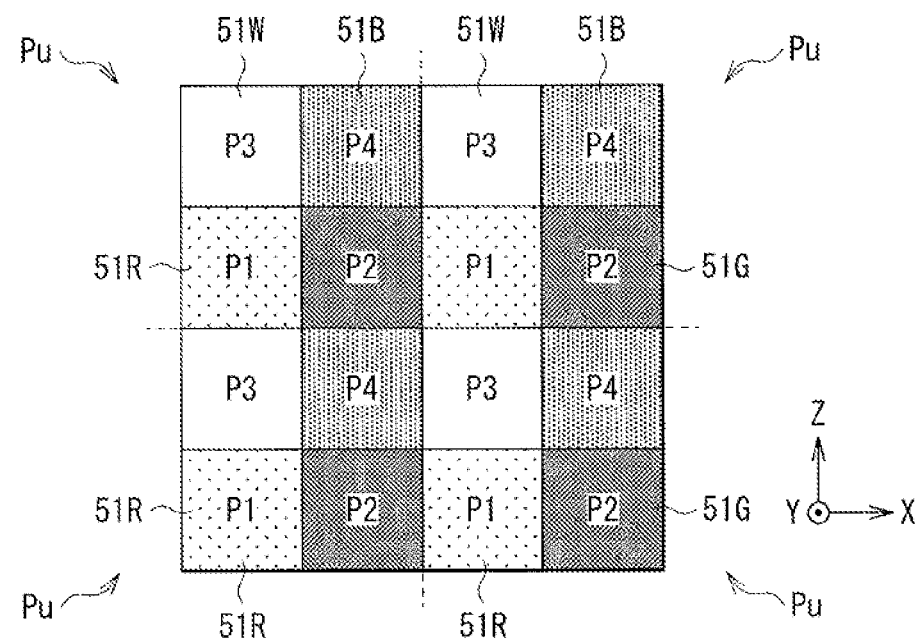
FIG. 12B is another example of the disposition of the optical filters in the modification example 2 of the present disclosure.

FIG. 12B illustrates an example of the disposition of the four types of optical filters 51R, 51G, 51B, and 51W disposed in the pixel units Pu. In FIG. 12B, in addition to the three types of RGB optical filters 51R, 51G, and 51B, the optical filter 51W is added that transmits visible light. Each of the optical filters is disposed in one pixel unit Pu.

2-3. Modification Example 3

FIG. 13 schematically illustrates a stacked configuration of respective main parts of photoelectric converters (photoelectric converters 70) according to a modification example (modification example 3) of the present disclosure. As in the above-described embodiment, the photoelectric converter 70 is included in one pixel (unit pixel P) in a solid-state imaging device (solid-state imaging device 1; see FIG. 26) such as a CMOS image sensor used in an electronic apparatus such as a digital still camera or a video camera, for example. The present modification example is different from the above-described embodiment and modification examples 1 and 2 in that there are provided light-shielding sections between the inorganic photoelectric conversion sections 32B and the inorganic photoelectric conversion sections 32R that absorb respective pieces of light in wavelength bands different from each other in adjacent pixels Pb1, Pr1, Pb2, and Pr2.

Figure 14A:
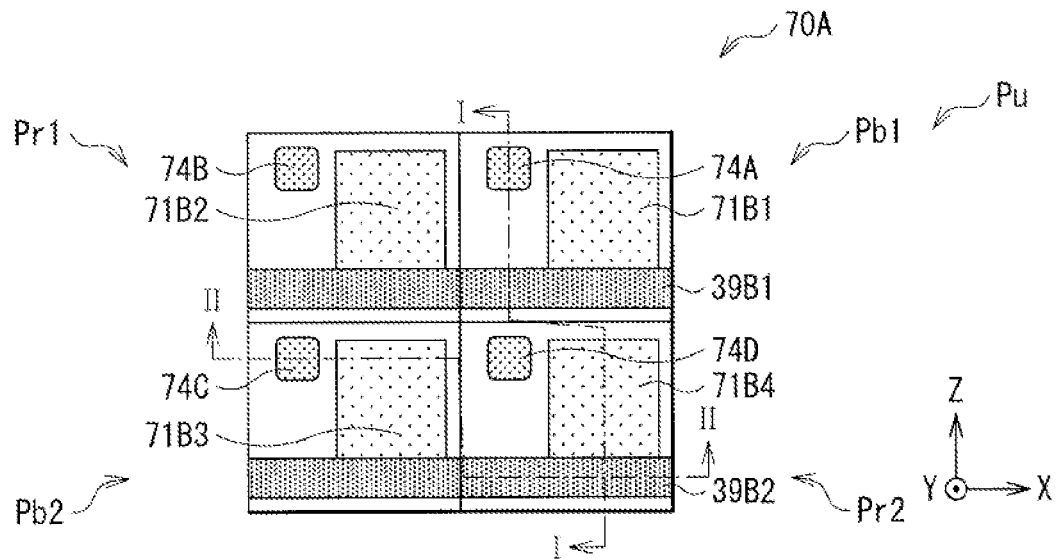
FIG. 14A is a schematic plan view of a positional relationship between respective sections in the photoelectric converters illustrated in FIG. 13.
Figure 14B:
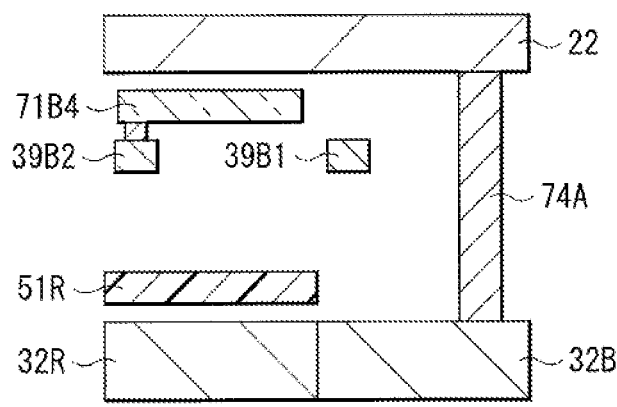
FIG. 14B is a schematic cross-sectional view taken along a line I-I illustrated in FIG. 14A.
Figure 14C:
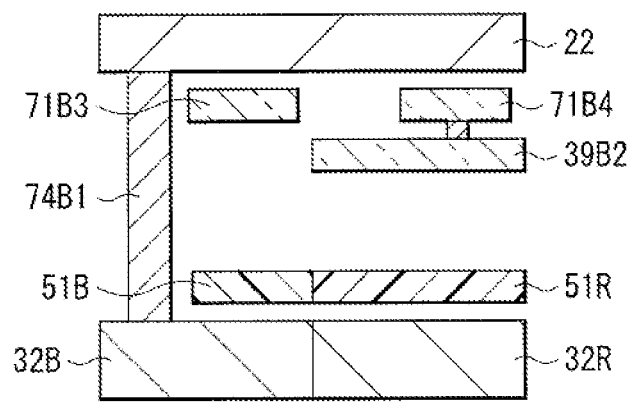
FIG. 14C is a schematic cross-sectional view taken along a line II-II illustrated in FIG. 14A.

FIG. 14A schematically illustrates a planar configuration of respective sections of four photoelectric converters 70A provided in the respective pixels P (Pb1, Pr1, Pb2, and Pr2) disposed in two rows and two columns. FIG. 14B schematically illustrates a cross-sectional configuration taken along a line I-I illustrated in FIG. 14A, and FIG. 14C schematically illustrates a cross-sectional configuration taken along a line II-II illustrated in FIG. 14A. The photoelectric converters 70A are an example of a specific configuration of the respective sections of the two photoelectric converters 70 illustrated in FIG. 13. For example, the pixel Pb1 and pixel Pb2 (blue pixels) that absorb blue light and the pixels Pr1 and pixel Pr2 (red pixels) that absorb red light are disposed in one pixel unit Pu in a checkerboard pattern. In this pixel unit Pu, readout electrodes 71A (71A1, 71A2, 71A3, and 71A4) and through electrodes 74 (74A, 74B, 74C, and 74D) coupled thereto are provided, for example, at respective corners of the rectangular pixels Pb1, Pr1, Pb2, and Pr2. Wiring lines 39B1 and 39B2 coupled to accumulation electrodes 71B (71B1, 71B2, 71B3, and 71B4) are provided as common wiring lines of the pixels Pb1 and Pr1 and pixels Pb2 and Pr2 that are adjacent in the X axis direction. In these photoelectric converters 70A, for example, the through electrodes 74A, 74B, 74C, and 74D and the wiring lines 39B1 and 39B2 are formed by using materials each having a light-shielding property, and these are included in the light-shielding sections. It is to be noted that the materials of the wiring lines 39B1 and 39B2 include a metallic material such as tungsten (W), titanium nitride (TiN), titanium (Ti), or copper (Cu).

Figure 15A:
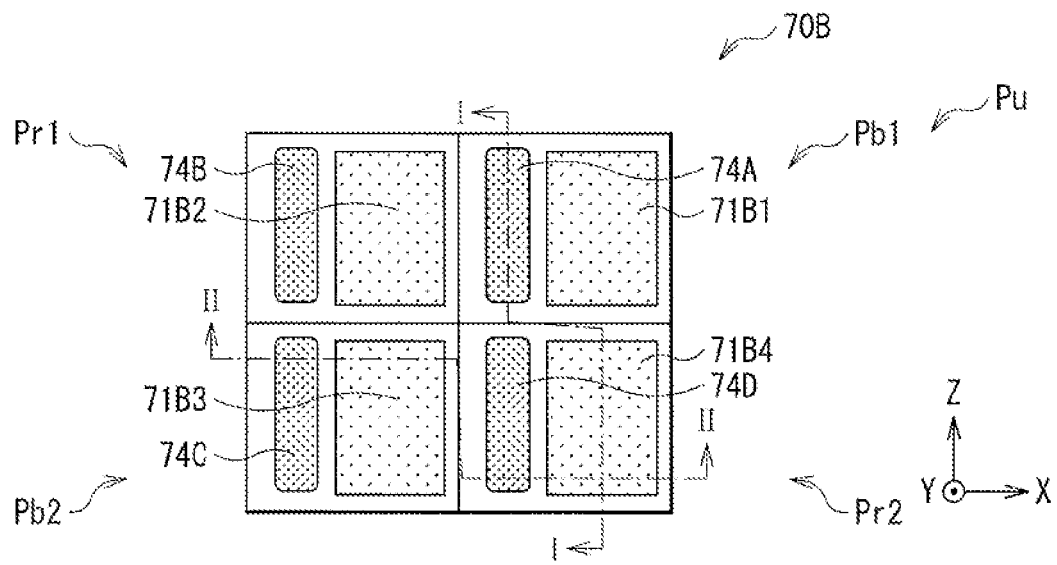
FIG. 15A is a schematic plan view of the positional relationship between the respective sections in the photoelectric converters illustrated in FIG. 13.
Figure 15B:
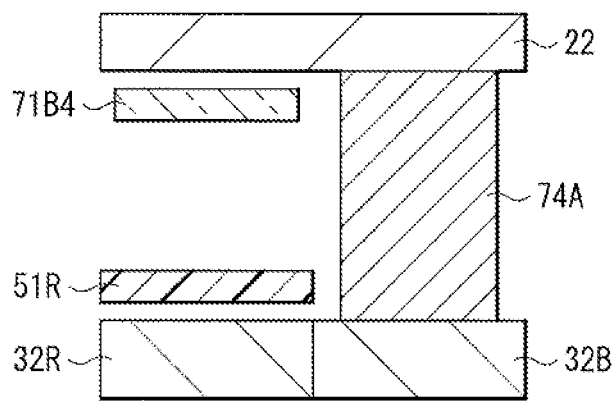
FIG. 15B is a schematic cross-sectional view taken along a line I-I illustrated in FIG. 15A.
Figure 15C:
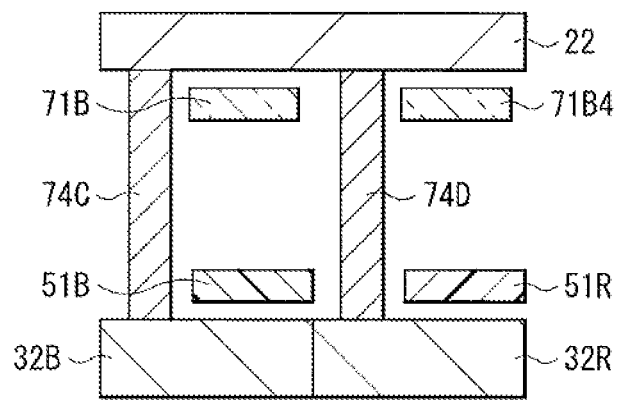
FIG. 15C is a schematic cross-sectional view taken along a line II-II illustrated in FIG. 15A.

FIG. 15A schematically illustrates a planar configuration of four photoelectric converters 70B provided in the respective pixels P (Pb1, Pr1, Pb2, and Pr2) disposed in two rows and two columns. FIG. 15B schematically illustrates a cross-sectional configuration taken along a line I-I illustrated in FIG. 15A, and FIG. 15C schematically illustrates a cross-sectional configuration taken along a line II-II illustrated in FIG. 15A. The photoelectric converters 70B are another example of a specific configuration of the respective sections of the photoelectric converters 70 illustrated in FIG. 13. As with the photoelectric converters 70A, for example, the pixel Pb1 and pixel Pb2 (blue pixels) that absorb blue light and the pixels Pr1 and pixel Pr2 (red pixels) that absorb red light are disposed in one pixel unit Pu in a checkerboard pattern. In this pixel unit Pu, the readout electrodes 71A (71A1, 71A2, 71A3, and 71A4) and the through electrodes 74 (74A, 74B, 74C, and 74D) coupled thereto are provided, for example, on respective sides of the rectangular pixels Pb1, Pr1, Pb2, and Pr2. The wiring lines 39B1 and 39B2 are omitted. In these photoelectric converters 70B, for example, the through electrodes 74A, 74B, 74C, and 74D are formed by using materials each having a light-shielding property, and these are included in the light-shielding sections.

Figure 16A:
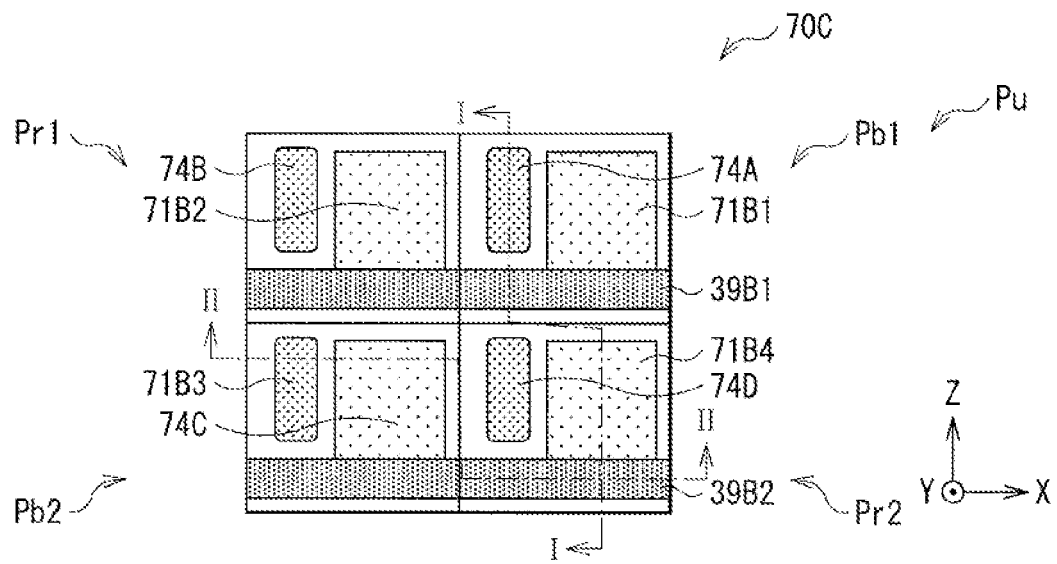
FIG. 16A is a schematic plan view of the positional relationship between the respective sections in the photoelectric converters illustrated in FIG. 13.
Figure 16B:
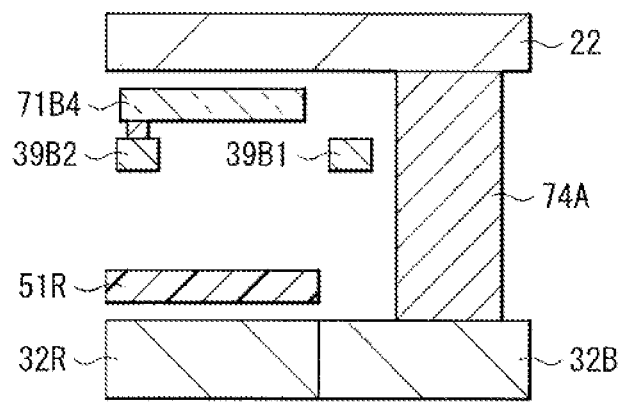
FIG. 16B is a schematic cross-sectional view taken along a line I-I illustrated in FIG. 16A.
Figure 16C:
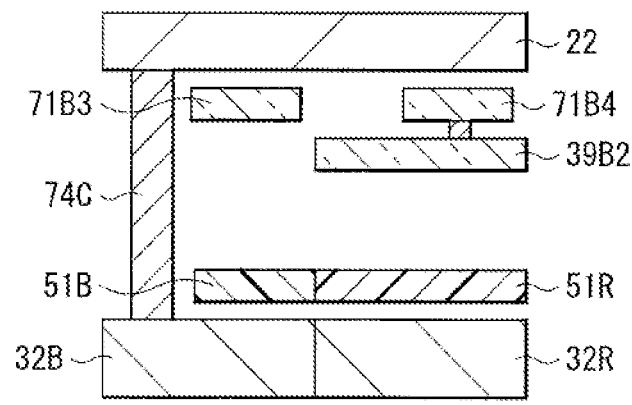
FIG. 16C is a schematic cross-sectional view taken along a line II-II illustrated in FIG. 16A.

FIG. 16A schematically illustrates a planar configuration of four photoelectric converters 70C provided in the respective pixels P (Pb1, Pr1, Pb2, and Pr2) disposed in two rows and two columns. FIG. 16B schematically illustrates a cross-sectional configuration taken along a line I-I illustrated in FIG. 16A, and FIG. 16C schematically illustrates a cross-sectional configuration taken along a line II-II illustrated in FIG. 16A. The photoelectric converters 70C are another example of a specific configuration of the respective sections of the photoelectric converters 70 illustrated in FIG. 13. As with the photoelectric converters 70A, for example, the pixel Pb1 and pixel Pb2 (blue pixels) that absorb blue light and the pixels Pr1 and pixel Pr2 (red pixels) that absorb red light are disposed in one pixel unit Pu in a checkerboard pattern. In this pixel unit Pu, the readout electrodes 71A (71A1, 71A2, 71A3, and 71A4) and the through electrodes 74 (74A, 74B, 74C, and 74D) coupled thereto are provided, for example, on respective sides of the rectangular pixels Pb1, Pr1, Pb2, and Pr2. The wiring lines 39B1 and 39B2 coupled to the accumulation electrodes 71B (71B1, 71B2, 71B3, and 71B4) are provided as common wiring lines of the pixels Pb1 and Pr1 and pixels Pb2 and Pr2 that are adjacent in the X axis direction. In these photoelectric converters 70C, for example, the through electrodes 74A, 74B, 74C, and 74D and the wiring lines 39B1 and 39B2 are formed by using materials each having a light-shielding property, and these are included in the light-shielding sections.

Figure 17A:
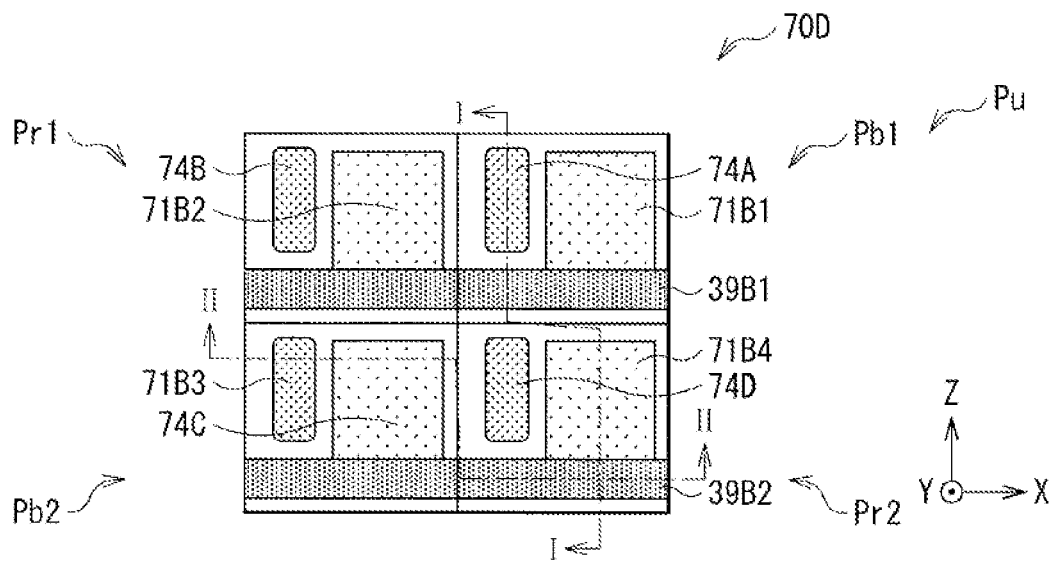
FIG. 17A is a schematic plan view of the positional relationship between the respective sections in the photoelectric converters illustrated in FIG. 13.
Figure 17B:
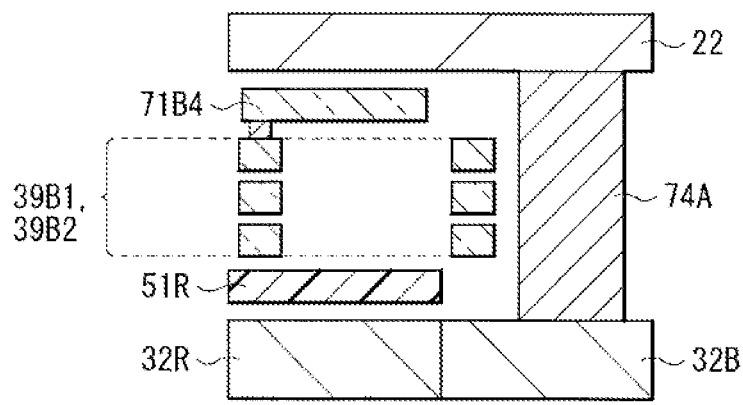
FIG. 17B is a schematic cross-sectional view taken along a line I-I illustrated in FIG. 17A.
Figure 17C:
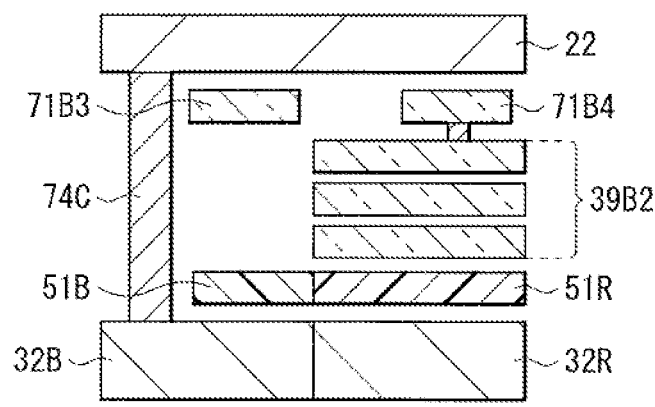
FIG. 17C is a schematic cross-sectional view taken along a line II-II illustrated in FIG. 17A.

FIG. 17A schematically illustrates a planar configuration of four photoelectric converters 70D provided in the respective pixels P (Pb1, Pr1, Pb2, and Pr2) disposed in two rows and two columns. FIG. 17B schematically illustrates a cross-sectional configuration taken along a line I-I illustrated in FIG. 17A, and FIG. 17C schematically illustrates a cross-sectional configuration taken along a line II-II illustrated in FIG. 17A. The photoelectric converters 70D are another example of a specific configuration of the respective sections of the photoelectric converters 70 illustrated in FIG. 13. As with the photoelectric converters 70A, for example, the pixel Pr1 and pixel Pr2 (blue pixels) that absorb blue light and the pixels Pr1 and pixel Pr2 (red pixels) that absorb red light are disposed in one pixel unit Pu in a checkerboard pattern. In this pixel unit Pu, the readout electrodes 71A (71A1, 71A2, 71A3, and 71A4) and the through electrodes 74 (74A, 74B, 74C, and 74D) coupled thereto are provided, for example, on respective sides of the rectangular pixels Pb1, Pr1, Pb2, and Pr2. The wiring lines 39B1 and 39B2 coupled to the accumulation electrodes 71B (71B1, 71B2, 71B3, and 71B4) are provided as common wiring lines of the pixels Pb1 and Pr1 and pixels Pb2 and Pr2 that are adjacent in the X axis direction, and each have a stacked structure (e.g., 3-layer structure). In these photoelectric converters 70D, for example, the through electrodes 74A, 74B, 74C, and 74D and the wiring lines 39B1 and 39B2 are formed by using materials each having a light-shielding property, and these are included in the light-shielding sections.

Figure 18A:
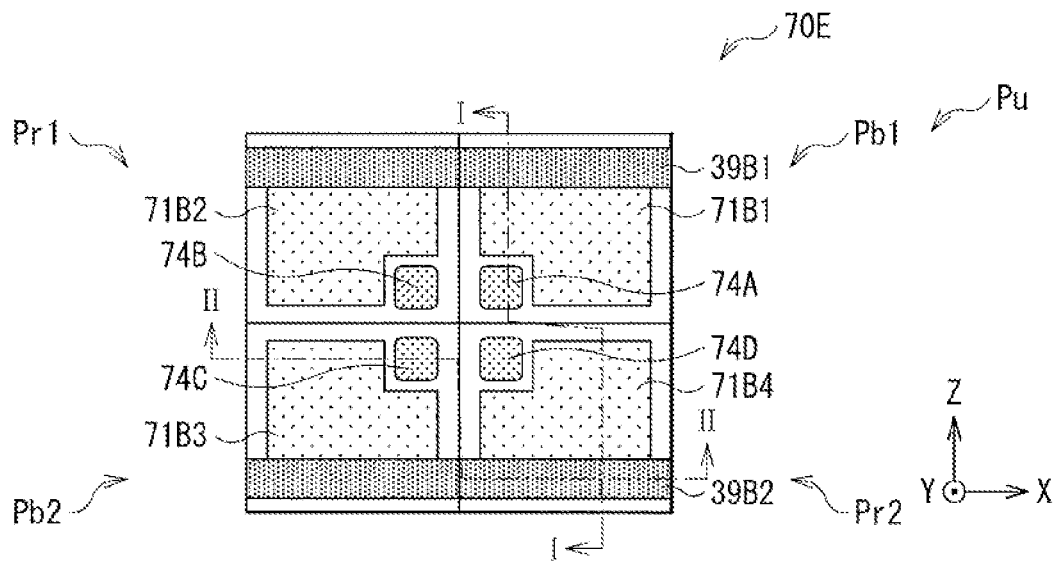
FIG. 18A is a schematic plan view of the positional relationship between the respective sections in the photoelectric converters illustrated in FIG. 13.
Figure 18B:
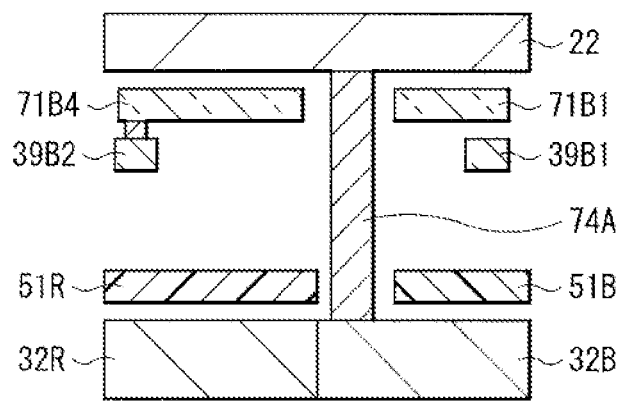
FIG. 18B is a schematic cross-sectional view taken along a line I-I illustrated in FIG. 18A.
Figure 18C:
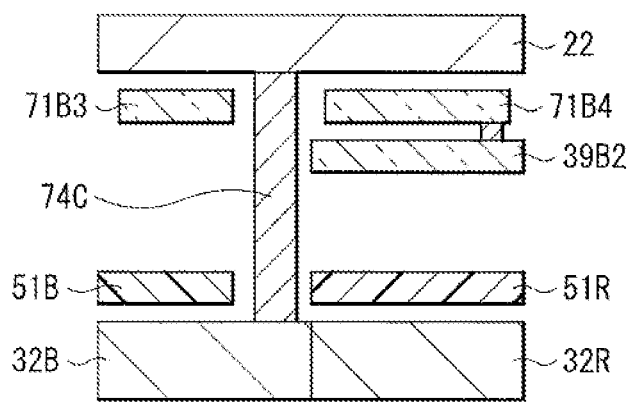
FIG. 18C is a schematic cross-sectional view taken along a line II-II illustrated in FIG. 18A.

FIG. 18A schematically illustrates a planar configuration of four photoelectric converters 70E provided in the respective pixels P (Pb1, Pr1, Pb2, and Pr2) disposed in two rows and two columns. FIG. 18B schematically illustrates a cross-sectional configuration taken along a line I-I illustrated in FIG. 18A, and FIG. 18C schematically illustrates a cross-sectional configuration taken along a line II-II illustrated in FIG. 18A. The photoelectric converters 70E are another example of a specific configuration of the respective sections of the photoelectric converters 70 illustrated in FIG. 13. As with the photoelectric converters 70A, for example, the pixel Pr1 and pixel Pr2 (blue pixels) that absorb blue light and the pixels Pr1 and pixel Pr2 (red pixels) that absorb red light are disposed in one pixel unit Pu in a checkerboard pattern. In this pixel unit Pu, the readout electrodes 71A (71A1, 71A2, 71A3, and 71A4) and the through electrodes 74 (74A, 74B, 74C, and 74D) coupled thereto are provided, for example, at respective corners of the rectangular pixels Pb1, Pr1, Pb2, and Pr2. For example, the readout electrodes 71A (71A1, 71A2, 71A3, and 71A4) and the through electrodes 74 (74A, 74B, 74C, and 74D) coupled thereto are collectively provided in the middle portion of the adjacent pixels. The wiring lines 39B1 and 39B2 coupled to the accumulation electrodes 71B (71B1, 71B2, 71B3, and 71B4) are provided to a pair of opposite sides of one of pixels including, for example, the four pixels Pb1, Pr1, Pb2, and Pr2 as common wiring lines of the pixels Pb1 and Pr1 and pixels Pb2 and Pr2 that are adjacent in the X axis direction. In these photoelectric converters 70E, for example, the through electrodes 74A, 74B, 74C, and 74D and the wiring lines 39B1 and 39B2 are formed by using materials each having a light-shielding property, and these are included in the light-shielding sections.

Figure 19A:
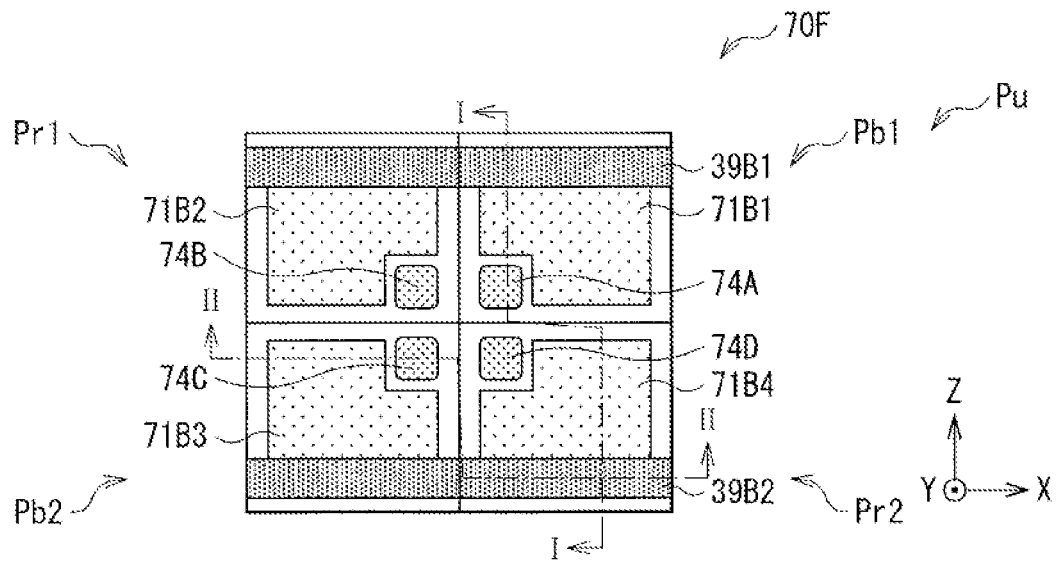
FIG. 19A is a schematic plan view of the positional relationship between the respective sections in the photoelectric converters illustrated in FIG. 13.
Figure 19B:
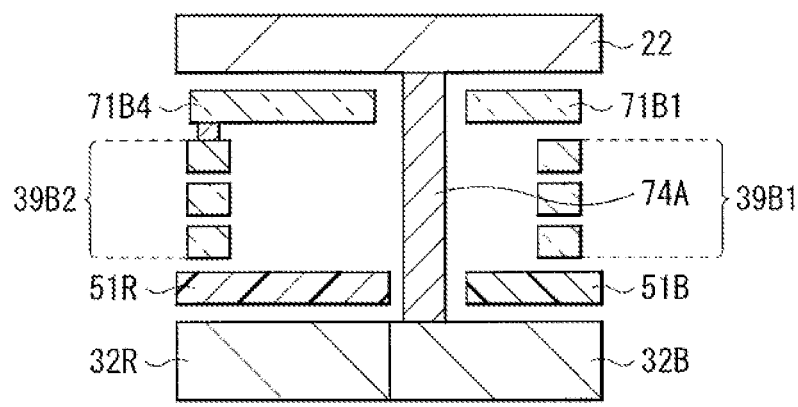
FIG. 19B is a schematic cross-sectional view taken along a line I-I illustrated in FIG. 19A.
Figure 19C:
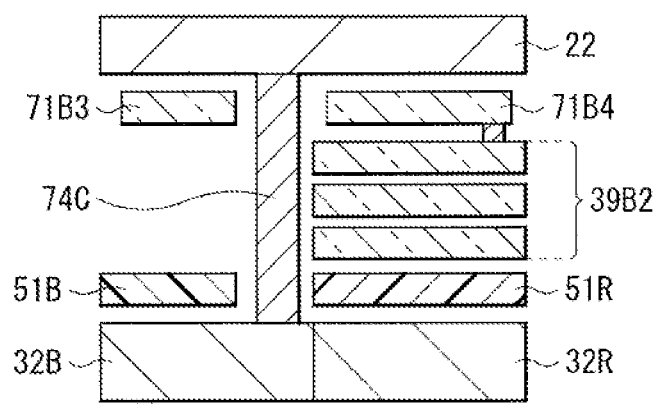
FIG. 19C is a schematic cross-sectional view taken along a line II-II illustrated in FIG. 19A.

FIG. 19A schematically illustrates a planar configuration of four photoelectric converters 70F provided in the respective pixels P (Pb1, Pr1, Pb2, and Pr2) disposed in two rows and two columns. FIG. 19B schematically illustrates a cross-sectional configuration taken along a line I-I illustrated in FIG. 19A, and FIG. 19C schematically illustrates a cross-sectional configuration taken along a line II-II illustrated in FIG. 19A. The photoelectric converters 70F are another example of a specific configuration of the respective sections of the photoelectric converters 70 illustrated in FIG. 13. For example, the pixel Pr1 and pixel Pr2 (blue pixels) that absorb blue light and the pixels Pr1 and pixel Pr2 (red pixels) that absorb red light are disposed in one pixel unit Pu in a checkerboard pattern. As with the photoelectric converters 70E, in this pixel unit Pu, the readout electrodes 71A (71B1, 71B2, 71B3, and 71B4) are collectively provided, for example, at respective corners of the rectangular pixels Pb1, Pr1, Pb2, and Pr2, for example, in the middle portion of the adjacent pixels. The wiring lines 39B1 and 39B2 coupled to the accumulation electrodes 71B (71B1, 71B2, 71B3, and 71B4) are provided as common wiring lines of the pixels Pb1 and Pr1 and pixels Pb2 and Pr2 that are adjacent in the X axis direction, and each have a stacked structure (e.g., 3-layer structure). In these photoelectric converters 70F, for example, the through electrodes 74A, 74B, 74C, and 74D and the wiring lines 39B1 and 39B2 are formed by using materials each having a light-shielding property, and these are included in the light-shielding sections.

FIG. 20A schematically illustrates a planar configuration of four photoelectric converters 70G provided in the respective pixels P (Pb1, Pr1, Pb2, and Pr2) disposed in two rows and two columns. FIG. 20B schematically illustrates a cross-sectional configuration taken along a line I-I illustrated in FIG. 20A, and FIG. 20C schematically illustrates a cross-sectional configuration taken along a line II-II illustrated in FIG. 20A. The photoelectric converters 70G are another example of a specific configuration of the respective sections of the photoelectric converters 70 illustrated in FIG. 13. For example, the pixel Pr1 and pixel Pr2 (blue pixels) that absorb blue light and the pixels Pr1 and pixel Pr2 (red pixels) that absorb red light are disposed in one pixel unit Pu in a checkerboard pattern. In this pixel unit Pu, as with the photoelectric converters 70E, the readout electrodes 71A (71B1, 71B2, 71B3, and 71B4) and the through electrodes 74 (74A, 74B, 74C, and 74D) coupled thereto are provided, for example, at respective corners of the rectangular pixels Pb1, Pr1, Pb2, and Pr2. For example, the readout electrodes 71A (71B1, 71B2, 71B3, and 71B4) and the through electrodes 74 (74A, 74B, 74C, and 74D) coupled thereto are collectively provided in the middle portion of the one pixel unit Pu.

In the pixel unit Pu illustrated in FIG. 20A or the like, the wiring lines 39B1 and 39B2 are provided at peripheral edges to surround the respective pixels P (Pb1, Pr1, Pb2, and Pr2). As with the photoelectric converters 70E illustrated in FIG. 18A, the wiring lines 39B1 and 39B2 are coupled to the accumulation electrodes 71B (71B1, 71B2, 71B3, and 71B4), and formed, for example, as common wiring lines between the pixels Pb1 and Pr1 and between the pixels Pb2 and Pr2. The pixels Pb1 and Pr1, and the pixels Pb2 and Pr2 are adjacent in the X axis direction. The respective wiring lines 39B1 and 39B2 are provided with extension sections 39$b$1 and 39$b$2 extending in the Z axis direction between the pixels adjacent in the X axis direction. It is to be noted that the extension section 39$b$1 and the extension section 39$b$2 extending toward each other from the wiring lines 39B1 and 39B2 are separated from each other, and electrically insulated. In addition, for example, the extension section 39$b$2 of the wiring line 39B2 is provided with extension sections 39$b$3 between the pixel Pr1 and the pixel Pb2 and between the pixel Pb1 and the pixel Pr2. The tip sections of the extension sections 39$b$3 extend near the middle section of the pixel unit Pu, for example, in the vicinity of the through electrodes 74A, 74B, 74C, and 74D. The pixel Pr1 and the pixel Pb2, and the pixel Pb1 and the pixel Pr2 are adjacent in the Z axis direction. In the photoelectric converters 70G, for example, the through electrodes 74A, 74B, 74C, and 74D and the wiring lines 39B1 and 39B2 including the respective extension sections 39$b$1, 39$b$2, and 39$b$3 are formed by using materials each having a light-shielding property, and these are included in the light-shielding sections. This allows each photoelectric converter 70G to prevent not only light from leaking from the X axis direction, but also light from leaking from the Y axis direction. That is, it is possible to improve a spectral characteristic more than the above-described photoelectric converters 70A to 70F do.

Figure 21A:
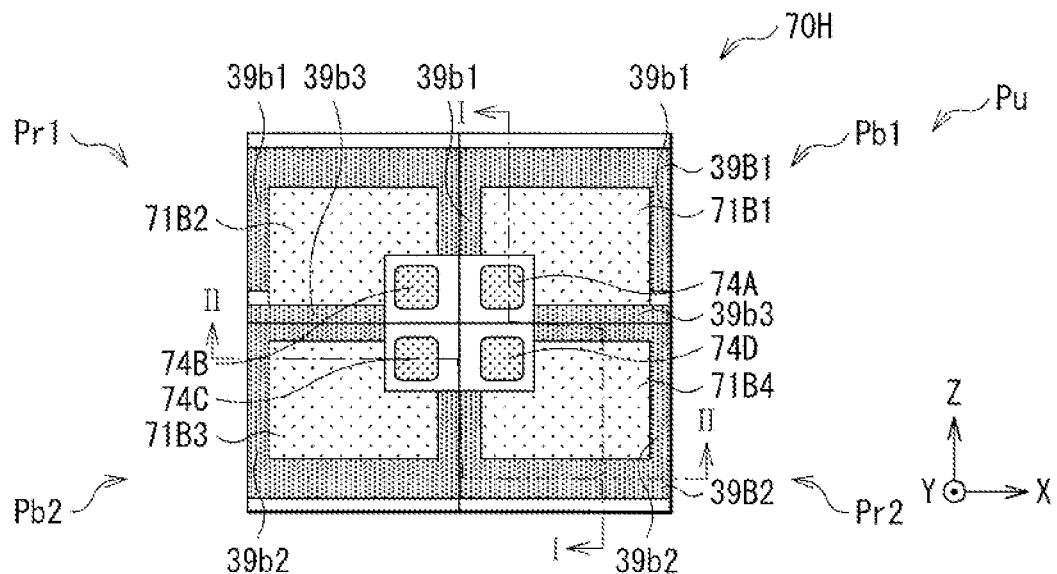
FIG. 21A is a schematic plan view of the positional relationship between the respective sections in the photoelectric converters illustrated in FIG. 13.
Figure 21B:
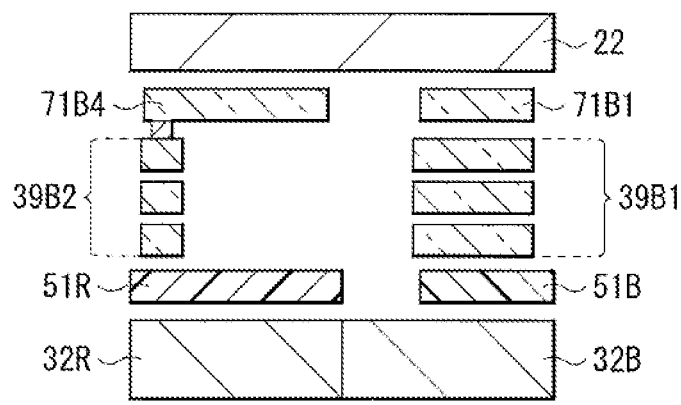
FIG. 21B is a schematic cross-sectional view taken along a line I-I illustrated in FIG. 21A.
Figure 21C:
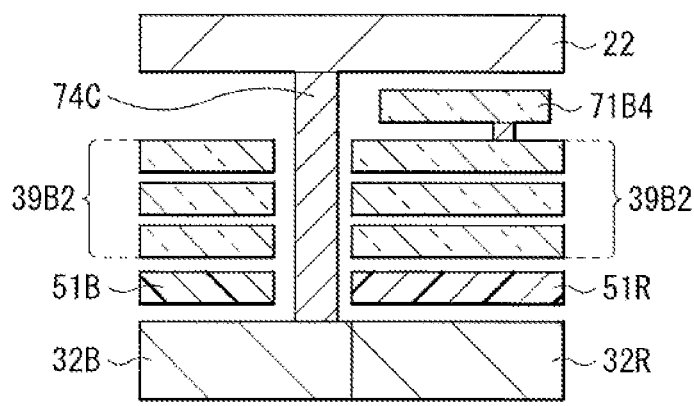
FIG. 21C is a schematic cross-sectional view taken along a line II-II illustrated in FIG. 21A.

FIG. 21A schematically illustrates a planar configuration of four photoelectric converters 70H provided in the respective pixels P (Pb1, Pr1, Pb2, and Pr2) disposed in two rows and two columns. FIG. 21B schematically illustrates a cross-sectional configuration taken along a line I-I illustrated in FIG. 21A, and FIG. 21C schematically illustrates a cross-sectional configuration taken along a line II-II illustrated in FIG. 21A. The photoelectric converters 70H are another example of a specific configuration of the respective sections of the photoelectric converters 70 illustrated in FIG. 13. For example, the pixel Pb1 and pixel Pb2 (blue pixels) that absorb blue light and the pixels Pr1 and pixel Pr2 (red pixels) that absorb red light are disposed in one pixel unit Pu in a checkerboard pattern. In this pixel unit Pu, as with the photoelectric converters 70E, the readout electrodes 71A (71A1, 71A2, 71A3, and 71A4) and the through electrodes 74 (74A, 74B, 74C, and 74D) coupled thereto are provided, for example, at respective corners of the pixels Pb1, Pr1, Pb2, and Pr2. For example, the readout electrodes 71A (71A1, 71A2, 71A3, and 71A4) and the through electrodes 74 (74A, 74B, 74C, and 74D) coupled thereto are collectively provided in the middle portion of the one pixel unit Pu.

In the pixel unit Pu illustrated in FIG. 21A or the like, as with the photoelectric converters 70G, the wiring lines 39B1 and 39B2 are provided at peripheral edges to surround the respective pixels P (Pb1, Pr1, Pb2, and Pr2). The respective wiring lines 39B1 and 39B2 are formed, for example, as common wiring lines between the pixels Pb1 and Pr1 and between the pixels Pb2 and Pr2. The pixels Pb1 and Pr1, and the pixels Pb2 and Pr2 are adjacent in the X axis direction. In addition, the respective wiring lines 39B1 and 39B2 are provided with extension sections 39b1 and 39b2 extending in the Z axis direction between the pixels adjacent in the X axis direction. The extension section 39b1 and the extension section 39b2 are separated from each other, and electrically insulated. Further, the extension section 39b2 of the wiring line 39B2 is provided with extension sections 39b3 between the pixel Pr1 and the pixel Pb2 and between the pixel Pb1 and the pixel Pr2. The tip sections of the extension sections 39b3 extend near the middle section of the pixel unit Pu, for example, in the vicinity of the through electrodes 74A, 74B, 74C, and 74D. The pixel Pr1 and the pixel Pb2, and the pixel Pb1 and the pixel Pr2 are adjacent in the Z axis direction. In the photoelectric converters 70H, for example, the through electrodes 74A, 74B, 74C, and 74D and the wiring lines 39B1 and 39B2 including the respective extension sections 39b1, 39b2, and 39b3 are each formed by using a material having a light-shielding property, and each have a stacked structure (e.g., 3-layer structure). This makes it possible to further prevent light from leaking from an adjacent pixel than the above-described photoelectric converter 70G does.

Figure 22A:
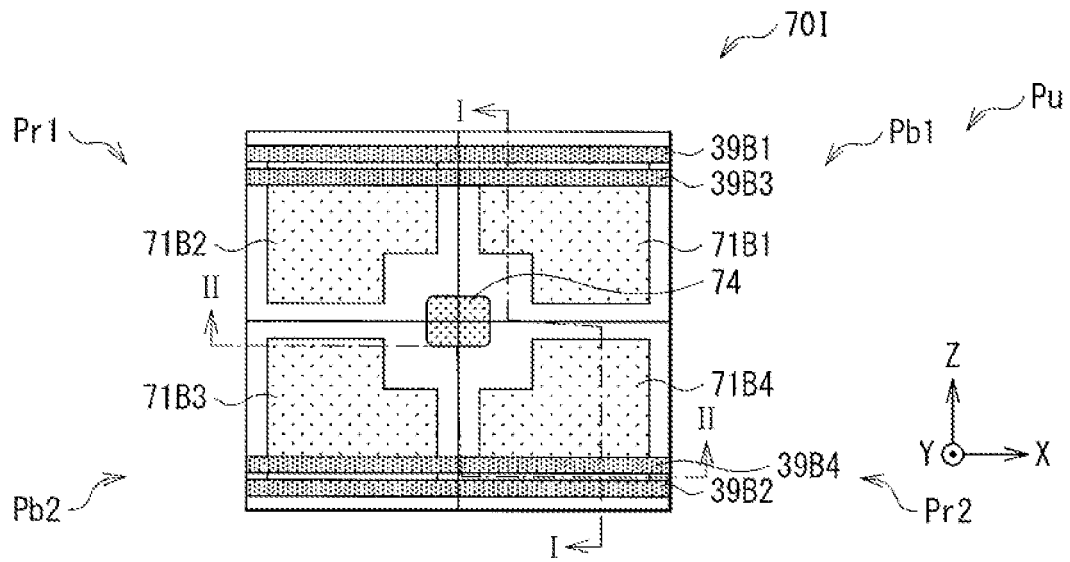
FIG. 22A is a schematic plan view of the positional relationship between the respective sections in the photoelectric converters illustrated in FIG. 13.
Figure 22B:
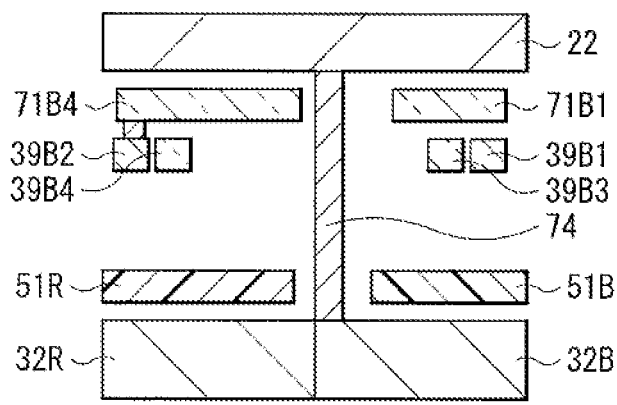
FIG. 22B is a schematic cross-sectional view taken along a line I-I illustrated in FIG. 22A.
Figure 22C:
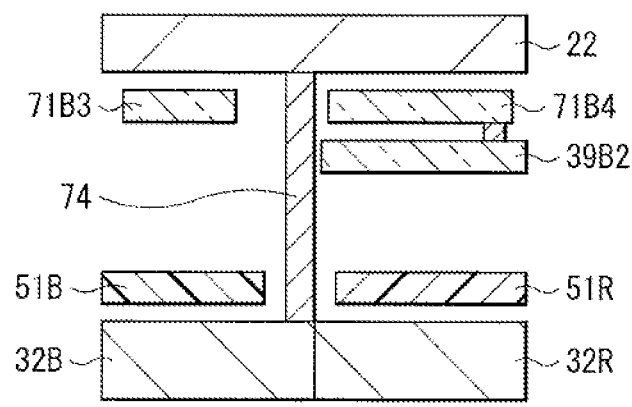
FIG. 22C is a schematic cross-sectional view taken along a line II-II illustrated in FIG. 22A.

FIG. 22A schematically illustrates a planar configuration of four photoelectric converters 70I provided in the respective pixels P (Pb1, Pr1, Pb2, and Pr2) disposed in two rows and two columns. FIG. 22B schematically illustrates a cross-sectional configuration taken along a line I-I illustrated in FIG. 22A, and FIG. 22C schematically illustrates a cross-sectional configuration taken along a line II-II illustrated in FIG. 22A. The photoelectric converters 70I are another example of a specific configuration of the respective sections of the photoelectric converters 70 illustrated in FIG. 13. As with the photoelectric converters 70A, for example, the pixel Pb1 and pixel Pb2 (blue pixels) that absorb blue light and the pixels Pb1 and pixel Pb2 (red pixels) that absorb red light are disposed in one pixel unit Pu in a checkerboard pattern. In this pixel unit Pu, the readout electrodes 71A and the through electrodes 74 coupled thereto are provided, for example, at the respective corners of the pixels Pb1, Pr1, Pb2, and Pr2 in the middle portion of the pixels P, for example, as one shared electrode of the adjacent pixels.

In the pixel unit Pu illustrated in FIG. 22A or the like, the wiring lines 39B1, 39B2, 39B3, and 39B4 are formed as wiring lines coupled to the accumulation electrodes 71B (71B1, 71B2, 71B3, and 71B4). The wiring lines 39B1, 39B2, 39B3, and 39B4 are independent from each other, and extend the pixels Pb1 and Pr1 and the pixels Pb2 and Pr2. The pixels Pb1 and Pr1 and the pixels Pb2 and Pr2 are adjacent in the X axis direction. Specifically, for example, the wiring line 39B1 and the wiring line 39B3 are formed side by side in the adjacent pixels Pb1 and Pr1. For example, the accumulation electrode 71B1 is coupled to the wiring line 39B1, and the accumulation electrode 71B2 is coupled to the wiring line 39B3. The wiring line 39B2 and the wiring line 39B4 are formed side by side in the adjacent pixels Pb2 and Pr2. For example, the accumulation electrode 71B3 is coupled to the wiring line 39B2, and the accumulation electrode 71B4 is coupled to the wiring line 39B4. In the photoelectric converters 70I, for example, the through electrodes 74 and the wiring lines 39B1, 39B2, 39B3, and 39B4 are formed by using materials each having a light-shielding property, and these are included in the light-shielding sections.

Figure 23A:
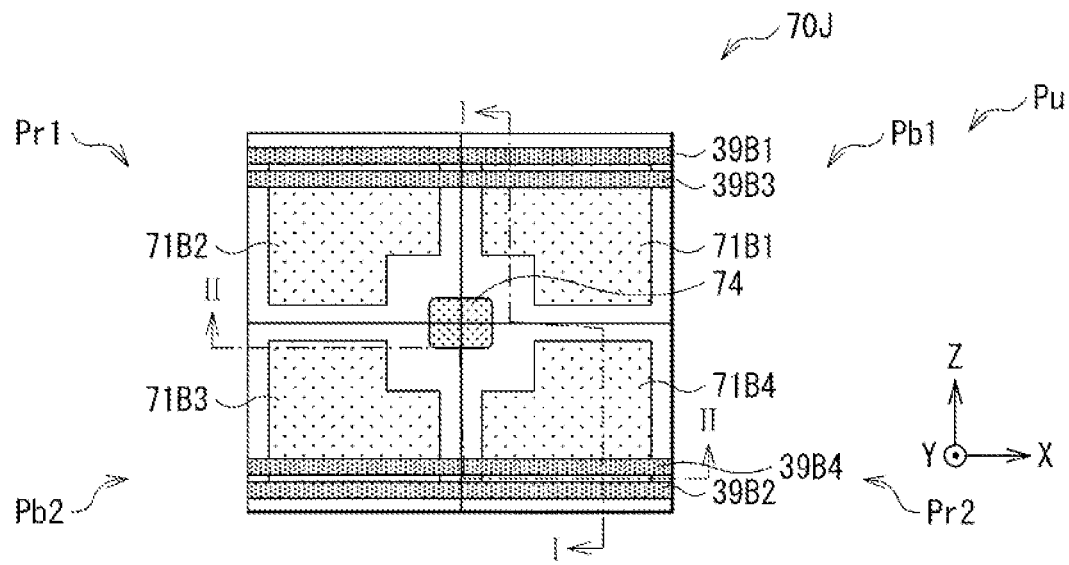
FIG. 23A is a schematic plan view of the positional relationship between the respective sections in the photoelectric converters illustrated in FIG. 13.
Figure 23B:
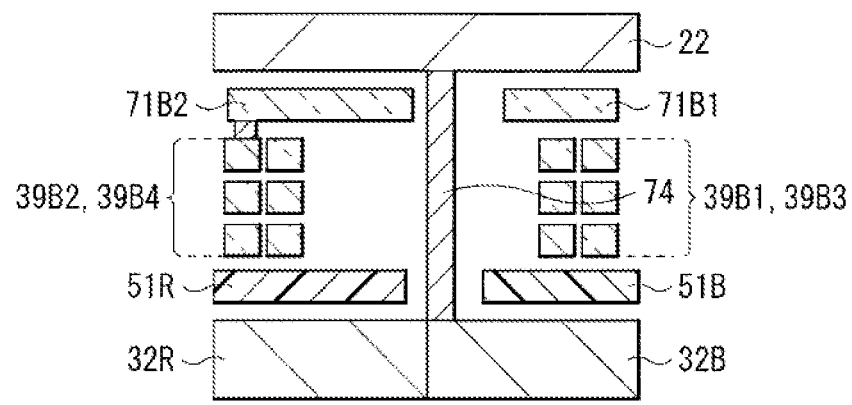
FIG. 23B is a schematic cross-sectional view taken along a line I-I illustrated in FIG. 23A.
Figure 23C:
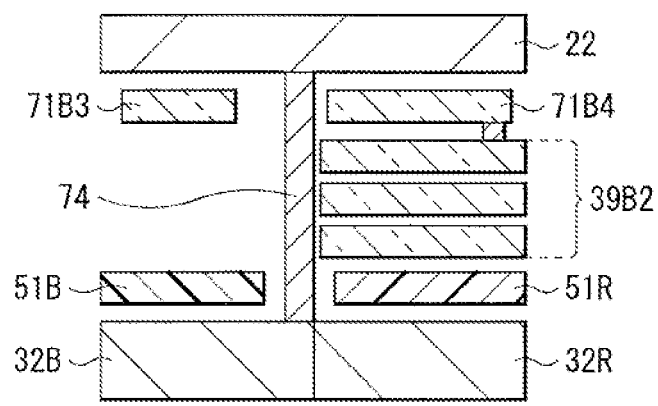
FIG. 23C is a schematic cross-sectional view taken along a line II-II illustrated in FIG. 23A.

FIG. 23A schematically illustrates a planar configuration of four photoelectric converters 70J provided in the respective pixels P (Pb1, Pr1, Pb2, and Pr2) disposed in two rows and two columns. FIG. 23B schematically illustrates a cross-sectional configuration taken along a line I-I illustrated in FIG. 23A, and FIG. 23C schematically illustrates a cross-sectional configuration taken along a line II-II illustrated in FIG. 23A. The photoelectric converters 70J are another example of a specific configuration of the respective sections of the photoelectric converters 70 illustrated in FIG. 13. As with the photoelectric converters 70E, for example, the pixel Pb1 and pixel Pb2 (blue pixels) that absorb blue light and the pixels Pb1 and pixel Pb2 (red pixels) that absorb red light are disposed in one pixel unit Pu in a checkerboard pattern. The readout electrodes 71A and the through electrodes 74 coupled thereto are provided, for example, at the respective corners of the pixels Pb1, Pr1, Pb2, and Pr2 in the middle portion of the pixels P, for example, as one shared electrode of the adjacent pixels.

In the pixel unit Pu illustrated in FIG. 23A or the like, as with the photoelectric converters 70I, the wiring lines 39B1, 39B2, 39B3, and 39B4 are formed as wiring lines coupled to the accumulation electrodes 71B (71B1, 71B2, 71B3, and 71B4). The wiring lines 39B1, 39B2, 39B3, and 39B4 are independent from each other, and extend the pixels Pb1 and Pr1 and the pixels Pb2 and Pr2. The pixels Pb1 and Pr1 and the pixels Pb2 and Pr2 are adjacent in the X axis direction. Specifically, for example, the wiring line 39B1 and the wiring line 39B3 are formed side by side in the adjacent pixels Pb1 and Pr1. For example, the accumulation electrode 71B1 is coupled to the wiring line 39B1, and the accumulation electrode 71B2 is coupled to the wiring line 39B3. The wiring line 39B2 and the wiring line 39B4 are formed side by side in the adjacent pixels Pb2 and Pr2. For example, the accumulation electrode 71B3 is coupled to the wiring line 39B2, and the accumulation electrode 71B4 is coupled to the wiring line 39B4. In the photoelectric converters 70J, through electrodes and the wiring lines 39B1, 39B2, 39B3, and 39B4 are included in the light-shielding sections. Further, the wiring lines 39B1, 39B2, 39B3, and 39B4 each have a stacked structure (e.g., 3-layer structure). This makes it possible to further prevent light from leaking from an adjacent pixel than the above-described photoelectric converter 70I does.

Figure 24A:
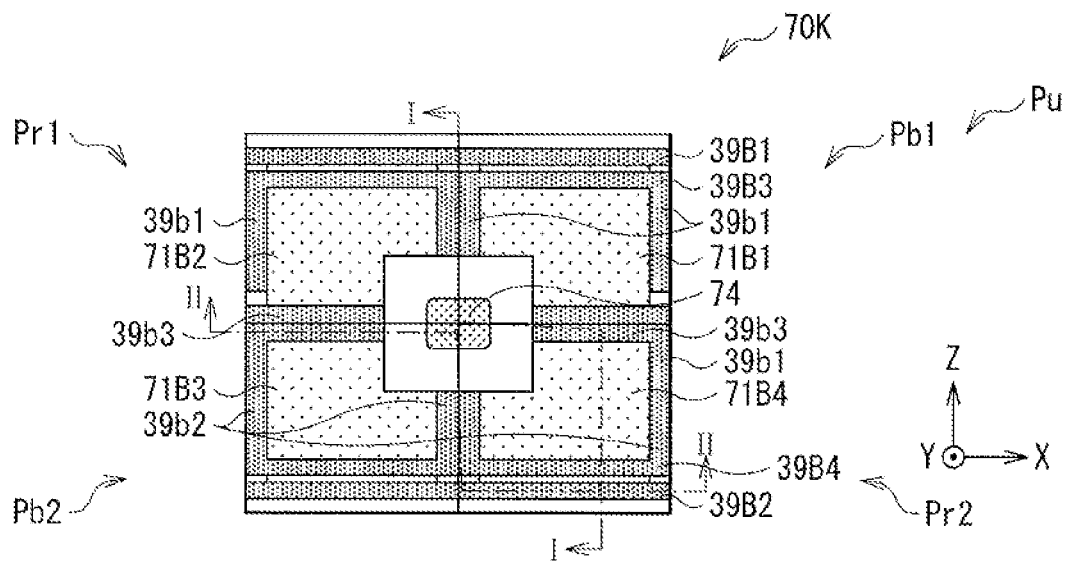
FIG. 24A is a schematic plan view of the positional relationship between the respective sections in the photoelectric converters illustrated in FIG. 13.
Figure 24B:
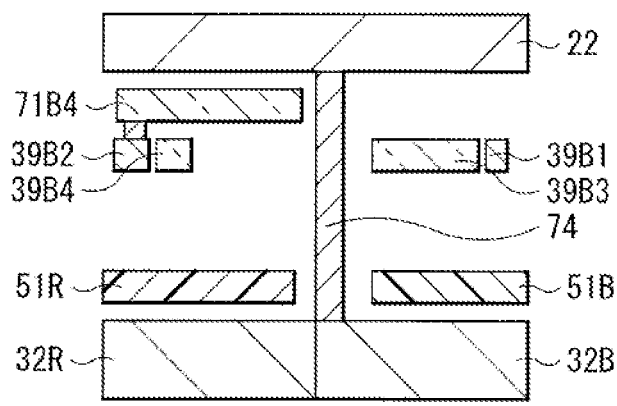
FIG. 24B is a schematic cross-sectional view taken along a line I-I illustrated in FIG. 24A.
Figure 24C:
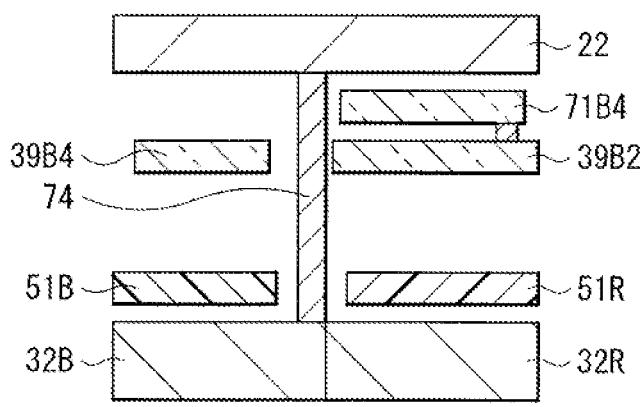
FIG. 24C is a schematic cross-sectional view taken along a line II-II illustrated in FIG. 24A.

FIG. 24A schematically illustrates a planar configuration of four photoelectric converters 70K provided in the respective pixels P (Pb1, Pr1, Pb2, and Pr2) disposed in two rows and two columns. FIG. 24B schematically illustrates a cross-sectional configuration taken along a line I-I illustrated in FIG. 24A, and FIG. 24C schematically illustrates a cross-sectional configuration taken along a line II-II illustrated in FIG. 24A. The photoelectric converters 70K are another example of a specific configuration of the respective sections of the photoelectric converters 70 illustrated in FIG. 13. As with the photoelectric converters 70E, for example, the pixel Pb1 and pixel Pb2 (blue pixels) that absorb blue light and the pixels Pb1 and pixel Pb2 (red pixels) that absorb red light are disposed in one pixel unit Pu in a checkerboard pattern. The readout electrodes 71A and the through electrodes 74 coupled thereto are provided, for example, at the respective corners of the pixels Pb1, Pr1, Pb2, and Pr2 in the middle portion of the pixels P, for example, as one shared electrode of the adjacent pixels.

In the pixel unit Pu illustrated in FIG. 24A or the like, as with the photoelectric converters 70I, the wiring lines 39B1, 39B2, 39B3, and 39B4 are formed as wiring lines coupled to the accumulation electrodes 71B (71B1, 71B2, 71B3, and 71B4). The wiring lines 39B1, 39B2, 39B3, and 39B4 are independent from each other, and extend the pixels Pb1 and Pr1 and the pixels Pb2 and Pr2. The pixels Pb1 and Pr1 and the pixels Pb2 and Pr2 are adjacent in the X axis direction. Specifically, for example, the wiring line 39B1 and the wiring line 39B3 are formed side by side in the adjacent pixels Pb1 and Pr1. For example, the accumulation electrode 71B1 is coupled to the wiring line 39B1, and the accumulation electrode 71B2 is coupled to the wiring line 39B3. The wiring line 39B2 and the wiring line 39B4 are formed side by side in the adjacent pixels Pb2 and Pr2. For example, the accumulation electrode 71B3 is coupled to the wiring line 39B2, and the accumulation electrode 71B4 is coupled to the wiring line 39B4. Further, as in the photoelectric converters 70G, the extension sections 39$b$1, 39$b$2, and 39$b$3 are provided at the peripheral edges in the photoelectric converters 70K to surround the respective pixels P (Pb1, Pr1, Pb2, and Pr2). In photoelectric converters 70K, the extension section 39$b$1 is formed by being drawn, for example, from the wiring line 39B3 provided inside among the wiring line 39B1 and the wiring line 39B3 formed side by side. The extension sections 39$b$2 and 39$b$3 are formed by being drawn, for example, from the wiring line 39B4 provided inside among the wiring line 39B2 and the wiring line 39B4 formed side by side.

Figure 25A:
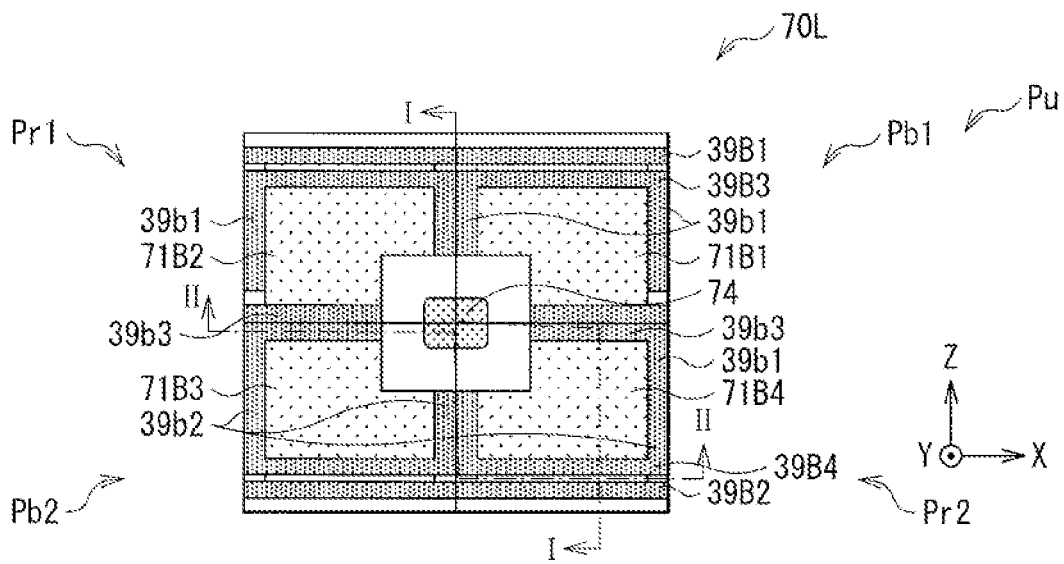
FIG. 25A is a schematic plan view of the positional relationship between the respective sections in the photoelectric converters illustrated in FIG. 13.
Figure 25B:
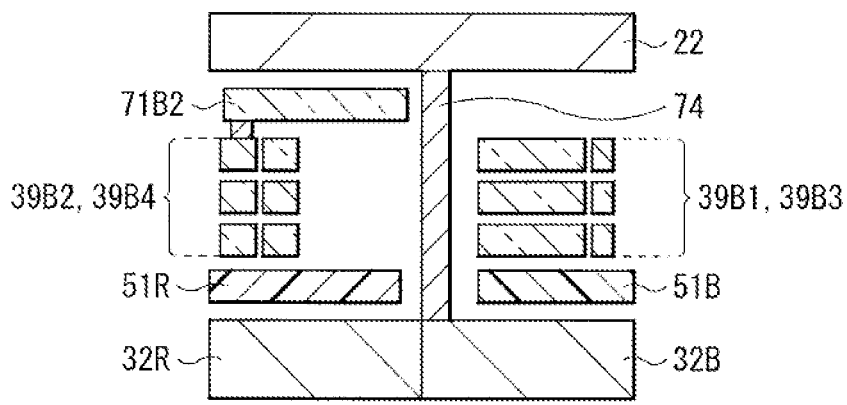
FIG. 25B is a schematic cross-sectional view taken along a line I-I illustrated in FIG. 25A.
Figure 25C:
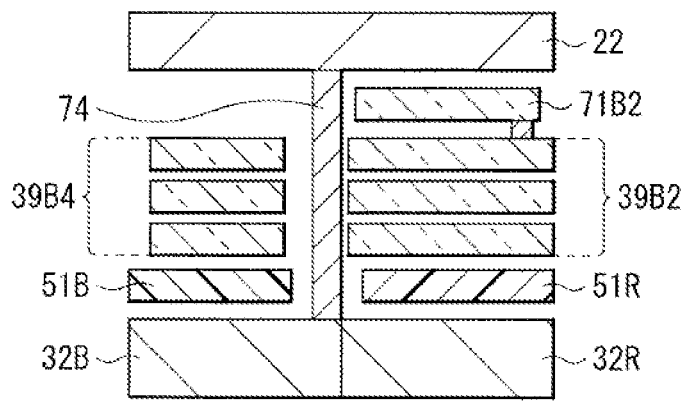
FIG. 25C is a schematic cross-sectional view taken along a line II-II illustrated in FIG. 25A.

FIG. 25A schematically illustrates a planar configuration of four photoelectric converters 70L provided in the respective pixels P (Pb1, Pr1, Pb2, and Pr2) disposed in two rows and two columns. FIG. 25B schematically illustrates a cross-sectional configuration taken along a line I-I illustrated in FIG. 25A, and FIG. 25C schematically illustrates a cross-sectional configuration taken along a line II-II illustrated in FIG. 25A. The photoelectric converters 70L are another example of a specific configuration of the respective sections of the photoelectric converters 70 illustrated in FIG. 13. As with the photoelectric converters 70E, for example, the pixel Pb1 and pixel Pb2 (blue pixels) that absorb blue light and the pixels Pb1 and pixel Pb2 (red pixels) that absorb red light are disposed in one pixel unit Pu in a checkerboard pattern. The readout electrodes 71A and the through electrodes 74 coupled thereto are provided, for example, at the respective corners of the pixels Pb1, Pr1, Pb2, and Pr2 in the middle portion of the pixels P, for example, as one shared electrode of the adjacent pixels.

In the pixel unit Pu illustrated in FIG. 25A or the like, as with the photoelectric converters 70I, the wiring lines 39B1, 39B2, 39B3, and 39B4 are formed as wiring lines coupled to the accumulation electrodes 71B (71B1, 71B2, 71B3, and 71B4). The wiring lines 39B1, 39B2, 39B3, and 39B4 are independent from each other, and extend the pixels Pb1 and Pr1 and the pixels Pb2 and Pr2. The pixels Pb1 and Pr1 and the pixels Pb2 and Pr2 are adjacent in the X axis direction. Specifically, for example, the wiring line 39B1 and the wiring line 39B3 are formed side by side in the adjacent pixels Pb1 and Pr1. For example, the accumulation electrode 71B1 is coupled to the wiring line 39B1, and the accumulation electrode 71B2 is coupled to the wiring line 39B3. The wiring line 39B2 and the wiring line 39B4 are formed side by side in the adjacent pixels Pb2 and Pr2. For example, the accumulation electrode 71B3 is coupled to the wiring line 39B2, and the accumulation electrode 71B4 is coupled to the wiring line 39B4. Further, as in the photoelectric converters 70G, the extension sections 39$b$1, 39$b$2, and 39$b$3 are provided at the peripheral edges in the photoelectric converters 70K to surround the respective pixels P (Pb1, Pr1, Pb2, and Pr2). In photoelectric converters 70K, the extension section 39$b$1 is formed by being drawn, for example, from the wiring line 39B3 provided inside among the wiring line 39B1 and the wiring line 39B3 formed side by side. The extension sections 39$b$2 and 39$b$3 are formed by being drawn, for example, from the wiring line 39B4 provided inside among the wiring line 39B2 and the wiring line 39B4 formed side by side. Further, these wiring lines 39B1, 39B2, 39B3, and 39B4, and extension sections 39$b$1, 39$b$2, and 39$b$3 each have a stacked structure (e.g., 3-layer structure) as in the photoelectric converters 70H and 70J.

As described above, at least the respective through electrodes 74 (74A, 74B, 74C, and 74D) of the adjacent inorganic photoelectric conversion sections 32 (e.g., inorganic photoelectric conversion sections 32B and 32R) that absorb respective pieces of light in wavelength bands different from each other, the wiring lines 39B1 and 39B2 in the inter-layer insulation layer 26 provided on the light incidence surface S1 side of the semiconductor substrate 30, or the like of the photoelectric converters 70 according to the present modification example are formed by using materials each having a light-shielding property. This makes it possible to suppress a color mixture between adjacent pixels, and further improve a spectral characteristic.

3. APPLICATION EXAMPLES

Application Example 1

Figure 26:
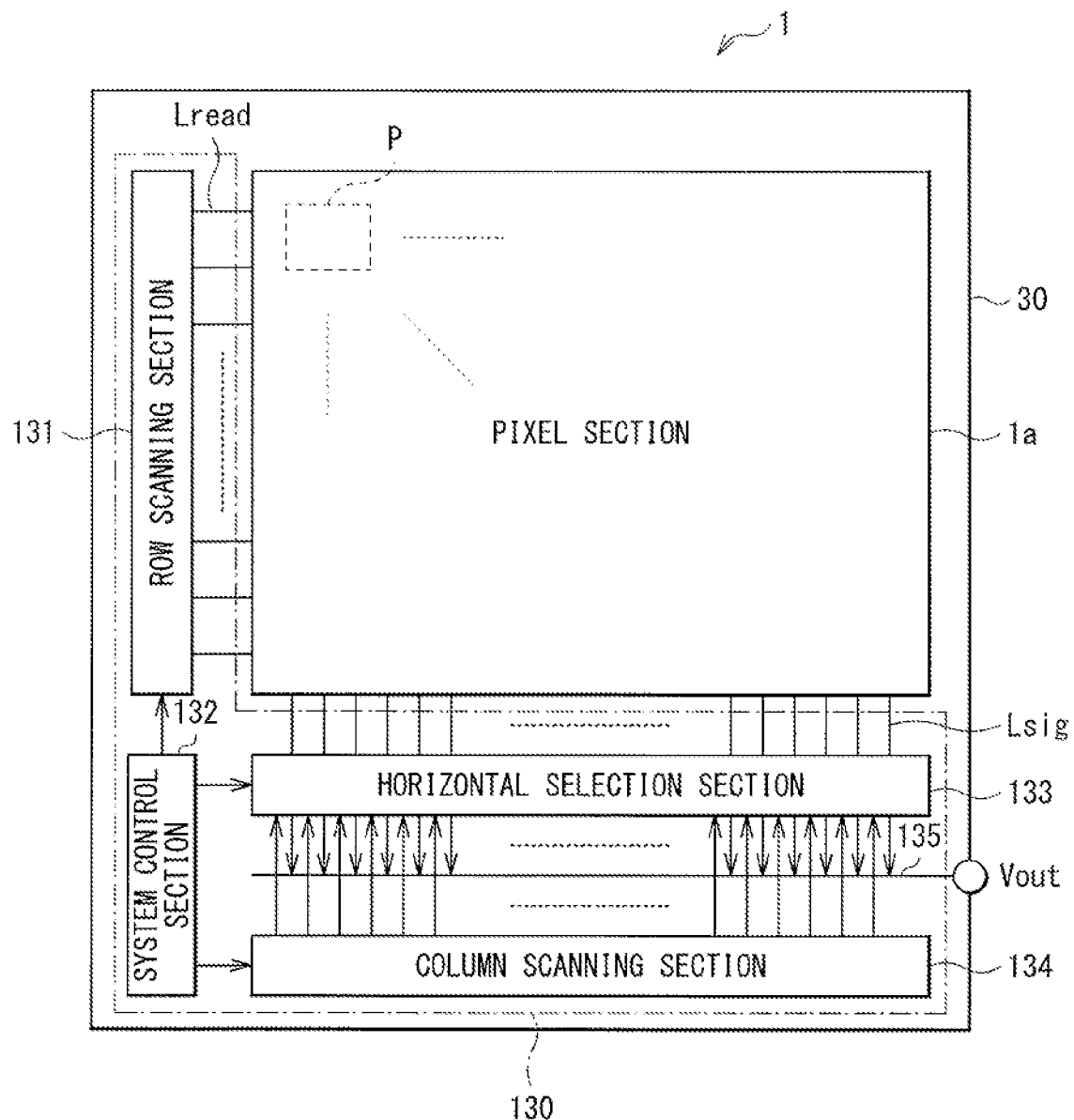
FIG. 26 is a block diagram illustrating a solid-state imaging device including a photoelectric converter illustrated in FIG. 1 or the like as a pixel.

FIG. 26 illustrates, for example, an overall configuration of the solid-state imaging device 1 including the photoelectric converter 10 described in the above-described embodiment for each pixel. This solid-state imaging device 1 is a CMOS image sensor. The solid-state imaging device 1 includes, on the semiconductor substrate 11, the pixel section 1$a$ as an imaging area, and a peripheral circuit unit 130 in a peripheral region of this pixel section 1$a$. The peripheral circuit unit 130 includes, for example, a row scanning section 131, a horizontal selection section 133, a column scanning section 134, and a system control section 132.

The pixel section 1$a$ includes, for example, a plurality of unit pixels P (corresponding to, for example, the photoelectric converters 10) that are two-dimensionally disposed in a matrix. In these unit pixels P, pixel drive lines Lread (specifically, row selection lines and reset control lines) are disposed in each of pixel rows, for example, and vertical signal lines Lsig are disposed in each of pixel columns. The pixel drive lines Lread are each used to transmit drive signals for reading signals from pixels. One end of each of the pixel drive lines Lread is coupled to the output end of the row scanning section 131 corresponding to each row.

The row scanning section 131 is a pixel drive section that includes a shift register, an address decoder, and the like, and drives each of the unit pixels P of the pixel section 1$a$ on a row basis, for example. A signal outputted from each of the unit pixels P of the pixel rows selected and scanned by the row scanning section 131 is supplied to the horizontal selection section 133 through each of the vertical signal lines Lsig. The horizontal selection section 133 includes an amplifier, a horizontal selection switch, and the like provided for each of the vertical signal lines Lsig.

The column scanning section 134 includes a shift register, an address decoder, and the like, and drives each of the horizontal selection switches of the horizontal selection section 133 in sequence while scanning the horizontal selection switches. Selection and scanning by this column scanning section 134 output signals of the respective pixels transmitted through each of the vertical signal lines Lsig to a horizontal signal line 135 in sequence, and transmits the signals to the outside of the semiconductor substrate 11 through the horizontal signal line 135.

Circuit portions including the row scanning section 131, the horizontal selection section 133, the column scanning section 134, and the horizontal signal line 135 may be formed directly on the semiconductor substrate 11 or may be disposed on external control IC. In addition, those circuit portions may be formed on another substrate coupled by a cable or the like.

The system control section 132 receives, for example, a clock, data for an instruction about an operation mode, and the like. The clock and the data are supplied from the outside of the semiconductor substrate 11. In addition, the system control section 132 outputs data such as internal information of the solid-state imaging device 1. The system control section 132 further includes a timing generator that generates various timing signals, and controls the driving of the peripheral circuit such as the row scanning section 131, the horizontal selection section 133, and the column scanning section 134 on the basis of the various timing signals generated by the timing generator.

Application Example 2

Figure 27:
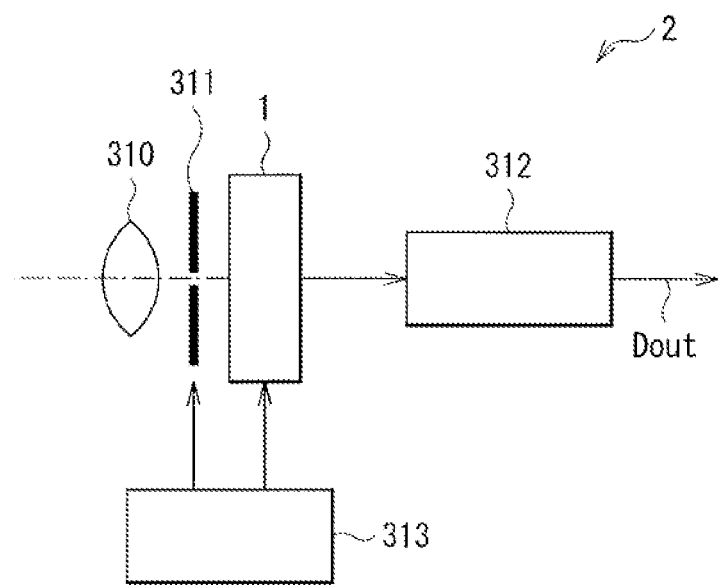
FIG. 27 is a functional block diagram illustrating an example of an electronic apparatus (camera) including the solid-state imaging device illustrated in FIG. 26.

The above-described solid-state imaging device 1 is applicable to, for example, any type of electronic apparatus (solid-state imaging device) having an imaging function. The electronic apparatus (solid-state imaging device) includes a camera system such as a digital still camera and a video camera, a mobile phone having the imaging function, and the like. FIG. 27 illustrates a schematic configuration of a camera 2 as an example thereof. This camera 2 is, for example, a video camera that is able to capture a still image or a moving image. The camera 2 includes the solid-state imaging device 1, an optical system (optical lens) 310, a shutter device 311, a drive section 313 that drives the solid-state imaging device 1 and the shutter device 311, and a signal processing section 312.

The optical system 310 guides image light (incident light) from an object to the pixel section 1a of the solid-state imaging device 1. This optical system 310 may include a plurality of optical lenses. The shutter device 311 controls a period of time in which the solid-state imaging device 1 is irradiated with light and a period of time in which light is blocked. The drive section 313 controls a transfer operation of the solid-state imaging device 1 and a shutter operation of the shutter device 311. The signal processing section 312 performs various types of signal processing on signals outputted from the solid-state imaging device 1. An image signal Dout subjected to the signal processing is stored in a storage medium such as a memory or outputted to a monitor or the like.

Application Example 3

<Example of Application to In-Vivo Information Acquisition System>

Further, the technology (present technology) according to the present disclosure is applicable to various products. For example, the technology according to the present disclosure may be applied to an endoscopic surgery system.

Figure 28:
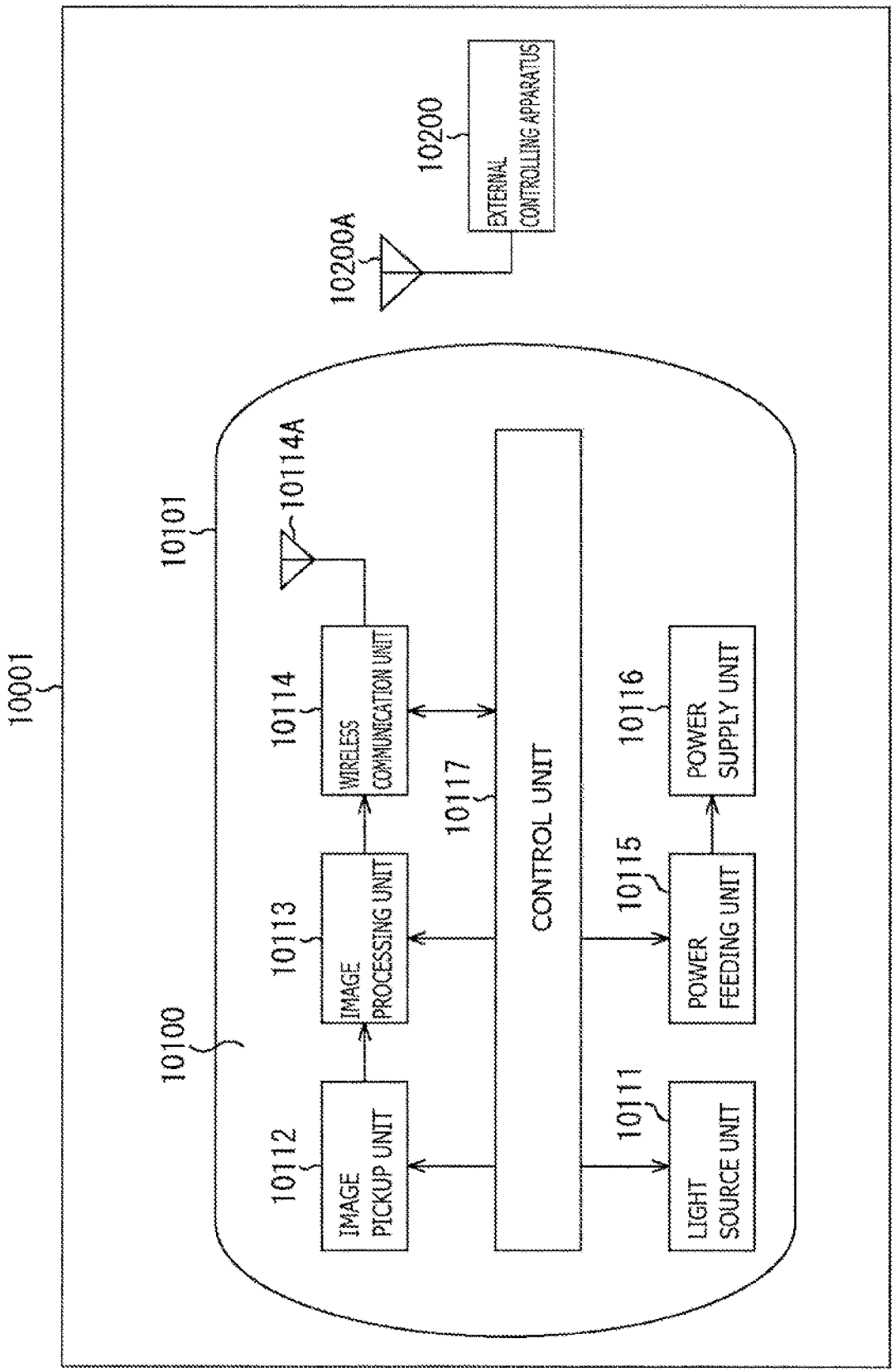
FIG. 28 is a block diagram depicting an example of a schematic configuration of an in-vivo information acquisition system.

FIG. 28 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 28, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to the present disclosure may be applied, for example, to the image pickup unit 10112 among the components described above. This makes it possible to increase the detection accuracy.

Application Example 4

4. Example of Application to Endoscopic Surgery System

The technology (present technology) according to the present disclosure is applicable to various products. For example, the technology according to the present disclosure may be applied to an endoscopic surgery system.

Figure 29:
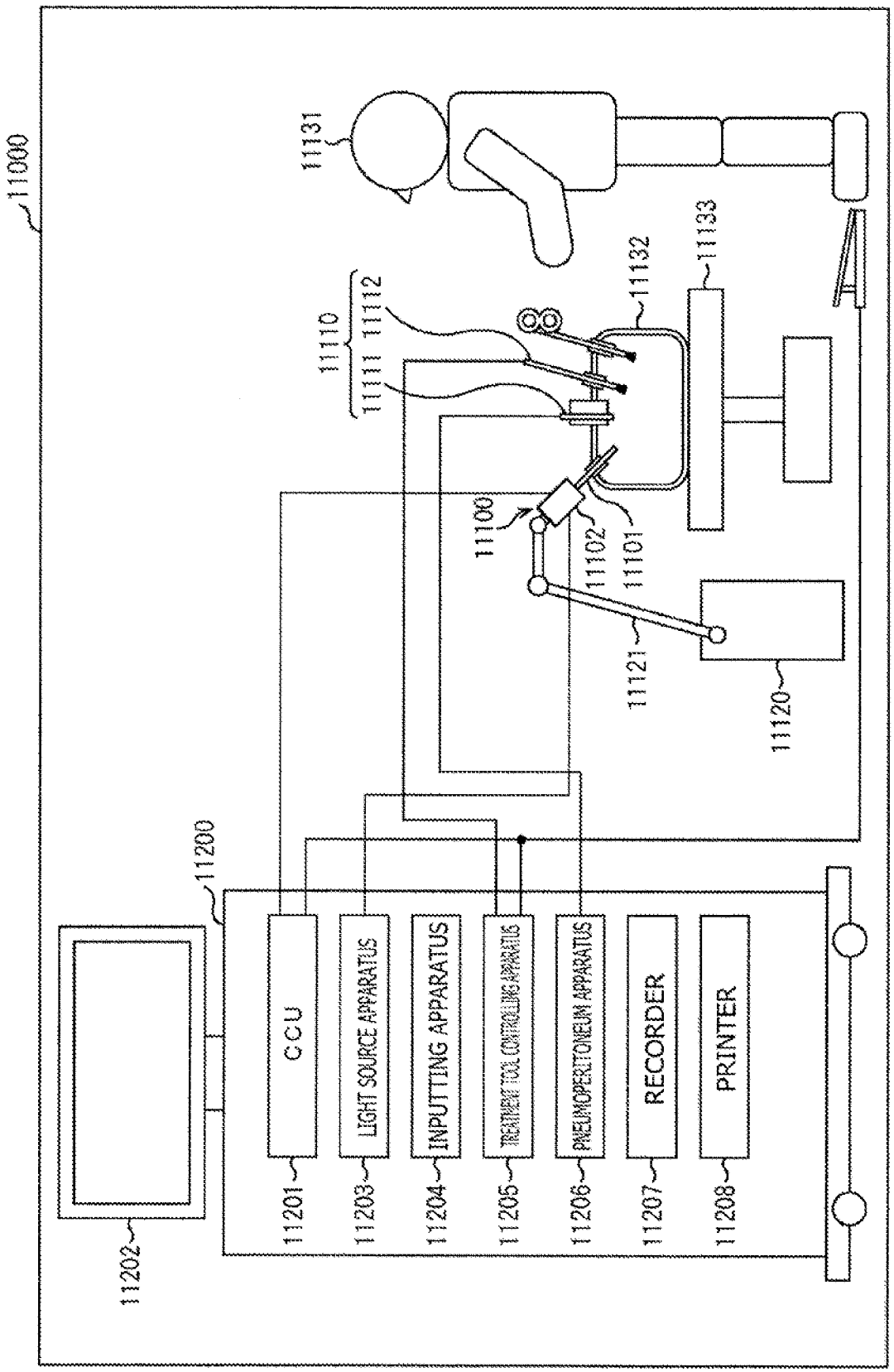
FIG. 29 is a view depicting an example of a schematic configuration of an endoscopic surgery system.

FIG. 29 is a view depicting an example of a schematic configuration of an endoscopic surgery system to which the technology according to an embodiment of the present disclosure (present technology) can be applied.

In FIG. 29, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as, a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 30:
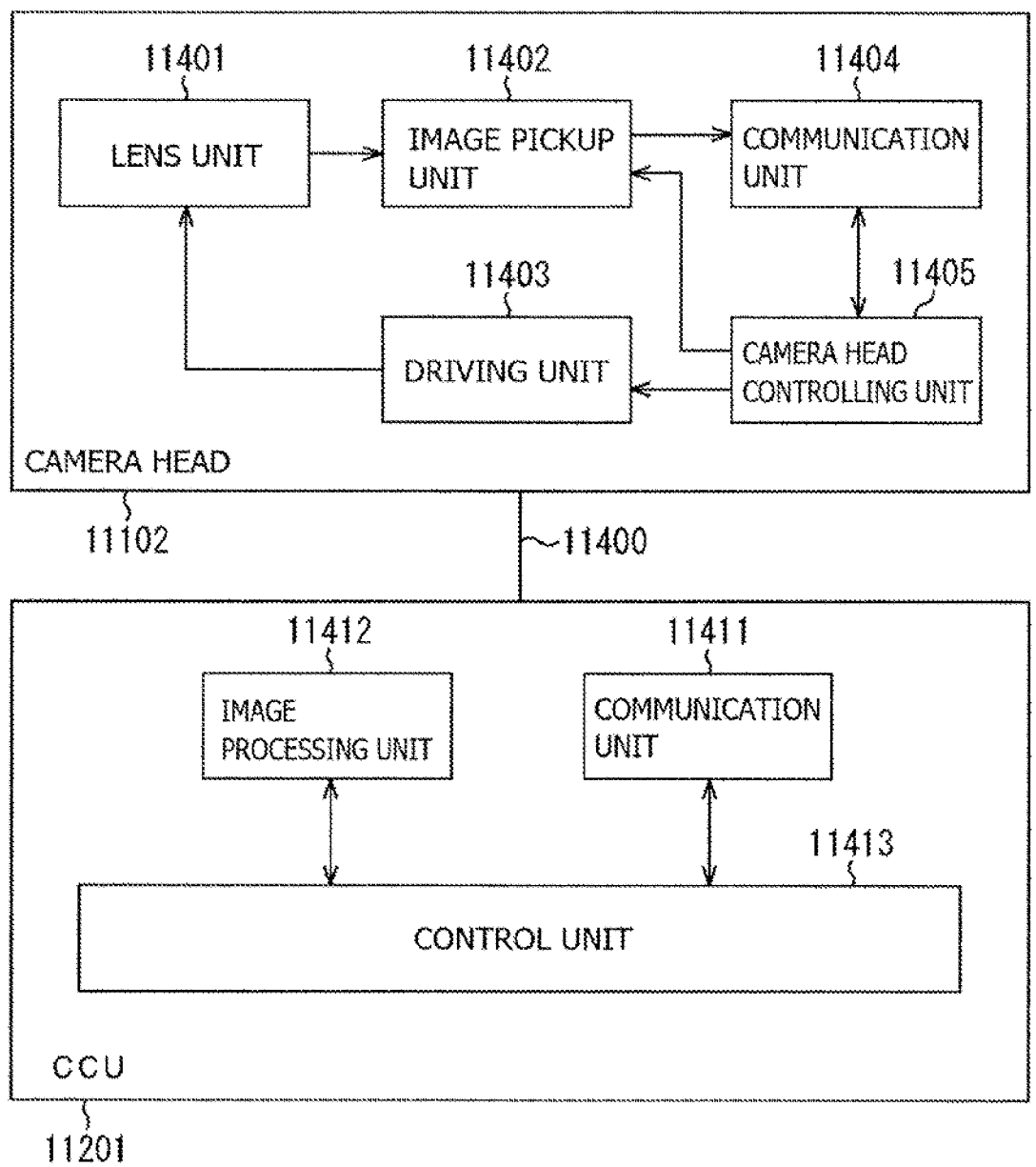
FIG. 30 is a block diagram depicting an example of a functional configuration of a camera head and a camera control unit (CCU).

FIG. 30 is a block diagram depicting an example of a functional configuration of the camera head 11102 and the CCU 11201 depicted in FIG. 29.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied to the image pickup unit 11402 among the components described above. Applying the technology according to an embodiment of the present disclosure to the image pickup unit 11402 increases the detection accuracy.

It is to be noted that the endoscopic surgery system has been described here as an example, but the technology according to the present disclosure may be additionally applied to, for example, a microscopic surgery system or the like.

Application Example 5

<Example of Application to Mobile Body>

The technology according to the present disclosure is applicable to various products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

Figure 31:
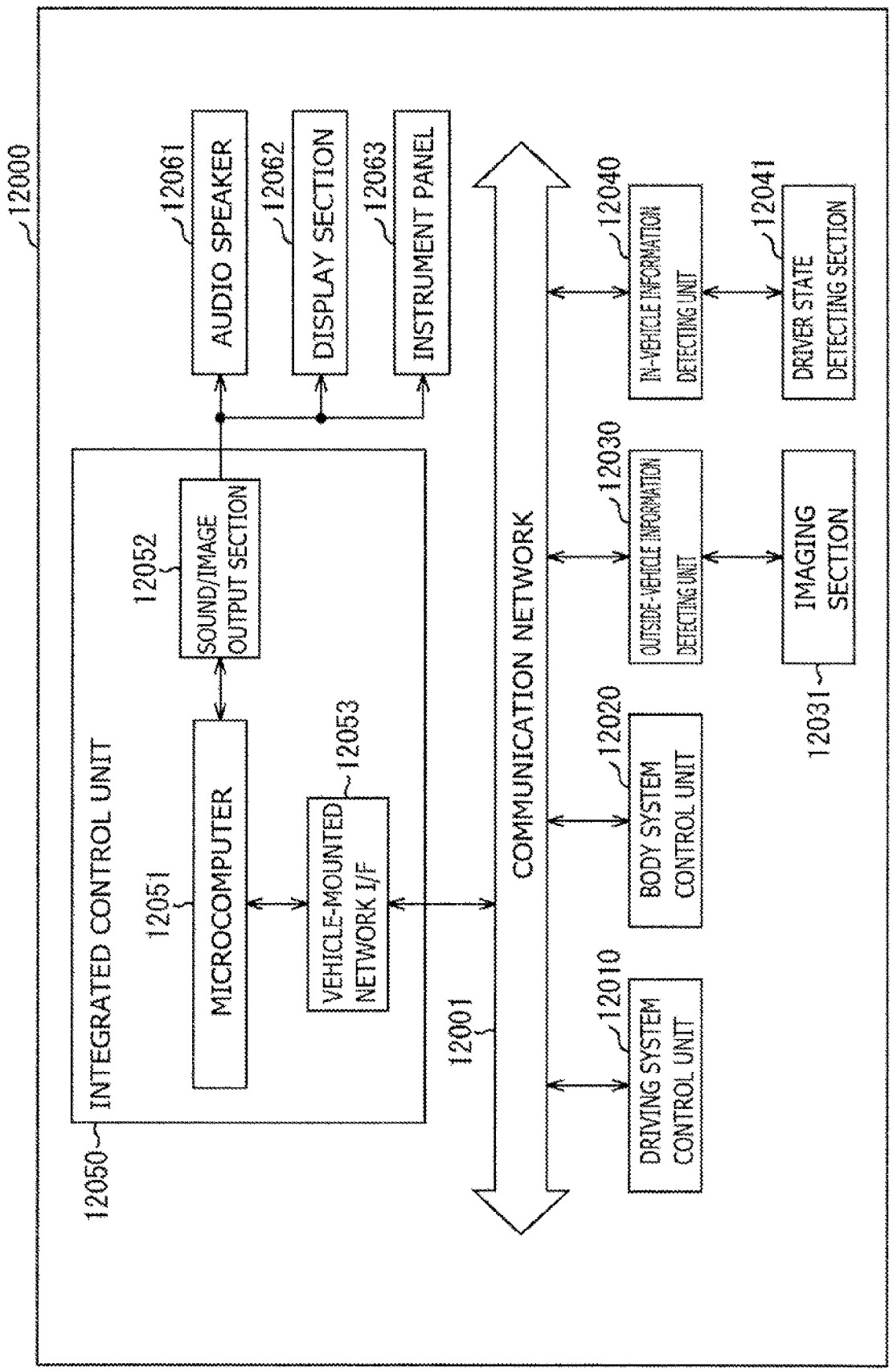
FIG. 31 is a block diagram depicting an example of schematic configuration of a vehicle control system.

FIG. 31 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 31, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 31, an audio speaker 12061, a display section 12062, and an instrument panel 12063 are illustrated as the output device. The display section 12062 may, for example, include at least one of an on-board display and a head-up display.

Figure 32:
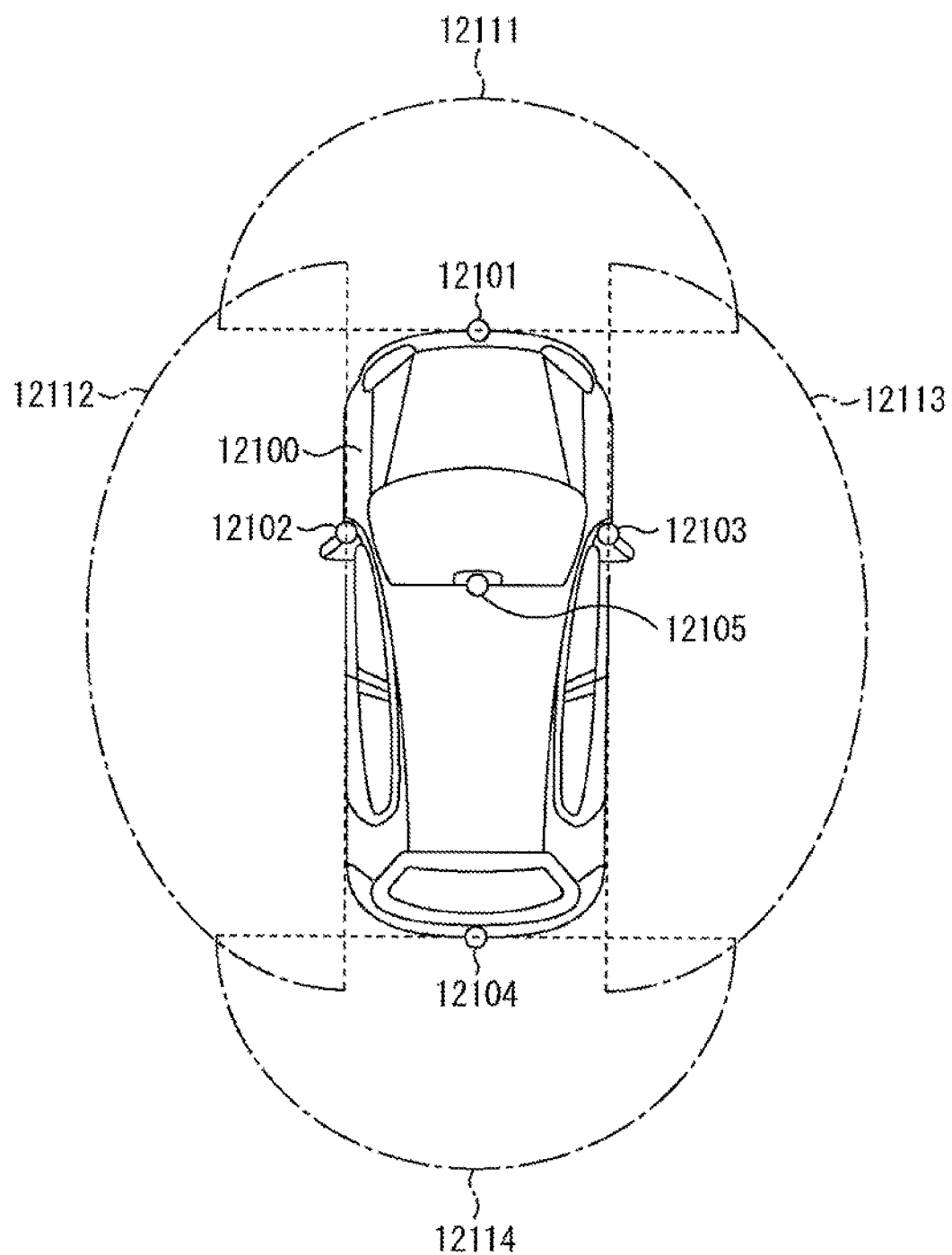
FIG. 32 is a diagram of assistance in explaining an example of installation positions of an outside-vehicle information detecting section and an imaging section.

FIG. 32 is a diagram depicting an example of the installation position of the imaging section 12031.

In FIG. 32, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 32 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Description has been given above by referring to the embodiment, the modification examples 1 to 3, and the application examples, but the content of the present disclosure is not limited to the above-described embodiment and the like, and various modifications are possible. For example, in the above-described embodiment, the photoelectric converters 10 have a configuration in which the organic photoelectric conversion section 20 that detects green light, and the inorganic photoelectric conversion sections 32B and 32R that detect blue light and red light, respectively, are stacked. However, the content of the present disclosure is not limited to such a structure. That is, the organic photoelectric conversion section may detect the red light or the blue light, or the inorganic photoelectric conversion sections may detect the green light.

In addition, the number of these organic photoelectric conversion sections and inorganic photoelectric conversion sections or a proportion thereof are not limited. The two or more organic photoelectric conversion sections may be provided or color signals of a plurality of colors may be obtained with the organic photoelectric conversion section alone. Further, the photoelectric converter and solid-state imaging device according to the present disclosure each do not necessarily have to include all of the components described in the above-described embodiment and the like, and may include another layer, conversely.

It is to be noted that the effects described herein are merely examples, but not limitative. In addition, there may be other effects.

It is to be noted that the present disclosure may have the following configurations.

(1)

A photoelectric converter including:

an organic photoelectric conversion section including a first electrode, a second electrode, and an organic photoelectric conversion layer, the first electrode including one electrode and another electrode, the second electrode being disposed to be opposed to the first electrode, the organic photoelectric conversion layer being disposed between the first electrode and the second electrode and being electrically coupled to the one electrode, the organic photoelectric conversion layer and the other electrode being provided with an insulation layer therebetween;

an inorganic photoelectric conversion section with the first electrode disposed between the inorganic photoelectric conversion section and the organic photoelectric conversion section; and an optical filter provided between the organic photoelectric conversion section and the inorganic photoelectric conversion section.

(2)

The photoelectric converter according to (1), in which the optical filter is provided between the other electrode and the inorganic photoelectric conversion section.

(3)

The photoelectric converter according to (1) or (2), in which the organic photoelectric conversion section and the inorganic photoelectric conversion section absorb respective pieces of light in wavelength bands different from each other, and the optical filter selectively transmits light in a wavelength band, the light being absorbed in the inorganic photoelectric conversion section.

(4)

The photoelectric converter according to any of (1) to (3), in which the inorganic photoelectric conversion section is provided in a semiconductor substrate, and a plurality of photoelectric conversion sections is disposed in a planar direction of the semiconductor substrate.

(5)

The photoelectric converter according to (4), in which the optical filter includes a first optical filter and a second optical filter, the first optical filter selectively transmitting light in a first wavelength band, the second optical filter selectively transmitting light in a second wavelength band, and the first optical filter or the second optical filter is disposed between the first electrode and each of the plurality of photoelectric conversion sections.

(6)

The photoelectric converter according to (5), in which the first optical filters and the second optical filters are disposed in a checkerboard pattern or a striped pattern.

(7)

The photoelectric converter according to (5) or (6), in which the optical filter further includes a third optical filter, the third optical filter selectively transmitting light in a third wavelength band, and the first optical filters, the second optical filters, and the third optical filters are disposed in a Bayer array.

(8)

The photoelectric converter according to (7), in which the optical filter further includes a fourth optical filter, the fourth optical filter selectively transmitting light in a fourth wavelength band.

(9)

The photoelectric converter according to (8), in which the first optical filter, the second optical filter, the third optical filter, and the fourth optical filter are different from each other, and the first optical filter, the second optical filter, the third optical filter, and the fourth optical filter each selectively transmit light in any of a red region, a green region, a blue region, or a visible region.

(10)

The photoelectric converter according to (9), in which the two first optical filters are disposed on one diagonal line, and the second optical filter and the third optical filter are disposed on another diagonal line in a 2×2 array.

(11)

The photoelectric converter according to (9) or (10), in which the two first optical filters are disposed in one column to be adjacent to each other, and the second optical filter and the third optical filter are disposed in another column to be adjacent to each other in a 2×2 array.

(12)

The photoelectric converter according to any of (1) to (11), in which a light-shielding section is provided at least partially between the adjacent optical filters that selectively transmit respective pieces of light in wavelength bands different from each other.

(13)

The photoelectric converter according to (12), in which the light-shielding section includes a through electrode, the through electrode being electrically coupled to the one electrode and penetrating a semiconductor substrate, the semiconductor substrate including the inorganic photoelectric conversion section.

(14)

The photoelectric converter according to (12) or (13), in which the light-shielding section includes a driving wiring line, the driving wiring line being electrically coupled to the other electrode.

(15)

The photoelectric converter according to any of (1) to (14), in which the optical filter includes an organic pigment.

(16)

The photoelectric converter according to any of (1) to (15), in which the optical filter is formed by using a plurality of openings.

(17)

The photoelectric converter according to any of (1) to (16), in which the optical filter includes a metal nanoparticle.

(18)

The photoelectric converter according to any of (1) to (17), in which the optical filter includes a multilayer interference film.

(19)

A solid-state imaging device including a plurality of pixels each provided with one or more photoelectric converters, the photoelectric converters each including an organic photoelectric conversion section including a first electrode, a second electrode, and an organic photoelectric conversion layer, the first electrode including one electrode and another electrode, the second electrode being disposed to be opposed to the first electrode, the organic photoelectric conversion layer being disposed between the first electrode and the second electrode and being electrically coupled to the one electrode, the organic photoelectric conversion layer and the other electrode being provided with an insulation layer therebetween, an inorganic photoelectric conversion section with the first electrode disposed between the inorganic photoelectric conversion section and the organic photoelectric conversion section, and an optical filter provided between the organic photoelectric conversion section and the inorganic photoelectric conversion section.

This application claims the priority on the basis of Japanese Patent Application No. 2017-244346 filed with Japan Patent Office on Dec. 20, 2017, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photoelectric converter comprising:

an organic photoelectric conversion section including a first electrode, a second electrode, and an organic photoelectric conversion layer, the first electrode including one electrode and another electrode, the organic photoelectric conversion layer being disposed between the first electrode and the second electrode and being electrically coupled to the one electrode, the organic photoelectric conversion layer and the another electrode being provided with an insulation layer therebetween;

an inorganic photoelectric conversion section, wherein the first electrode is disposed between the inorganic photoelectric conversion section and the organic photoelectric conversion section;

an optical filter provided between the organic photoelectric conversion section and the inorganic photoelectric conversion section;

a through electrode penetrating a semiconductor substrate that includes the inorganic photoelectric conversion section, wherein, in a plan view, the through electrode is at a first side of the another electrode, and wherein, in a cross-sectional view, the through electrode is between the inorganic photoelectric conversion section and an adjacent inorganic photoelectric conversion section; and a driving wiring line that receives a voltage and that is electrically coupled to the another electrode and at least one other electrode of an adjacent organic photoelectric conversion section, wherein, in the plan view, the driving wiring line extends across multiple pixels to serve as a common wiring line for the multiple pixels.

2. The photoelectric converter according to claim 1, wherein the through electrode is electrically coupled to the one electrode, and wherein the optical filter is provided between the another electrode and the inorganic photoelectric conversion section.

3. The photoelectric converter according to claim 1, wherein
the organic photoelectric conversion section and the inorganic photoelectric conversion section absorb light in wavelength bands different from each other, and
the optical filter selectively transmits light in a wavelength band that is absorbed in the inorganic photoelectric conversion section.

4. The photoelectric converter according to claim 1, wherein a plurality of inorganic photoelectric conversion sections is disposed in a planar direction of the semiconductor substrate.

5. The photoelectric converter according to claim 4, wherein
the optical filter includes a first optical filter and a second optical filter for each of the plurality of inorganic photoelectric conversion sections, the first optical filter selectively transmitting light in a first wavelength band, the second optical filter selectively transmitting light in a second wavelength band,
each of the plurality of inorganic photoelectric conversion sections includes a respective first electrode, and
the first optical filter or the second optical filter is disposed between each respective first electrode and each of the plurality of inorganic photoelectric conversion sections.

6. The photoelectric converter according to claim 5, wherein the first optical filters and the second optical filters are disposed in a checkerboard pattern or a striped pattern.

7. The photoelectric converter according to claim 5, wherein
the optical filter further includes a third optical filter for each of the plurality of inorganic photoelectric conversion sections, the third optical filter selectively transmitting light in a third wavelength band, and
the first optical filters, the second optical filters, and the third optical filters are disposed in a Bayer array.

8. The photoelectric converter according to claim 7, wherein the optical filter further includes a fourth optical filter for each of the plurality of inorganic photoelectric conversion sections, the fourth optical filter selectively transmitting light in a fourth wavelength band.

9. The photoelectric converter according to claim 8, wherein
the first optical filter, the second optical filter, the third optical filter, and the fourth optical filter are different from each other, and
the first optical filter, the second optical filter, the third optical filter, and the fourth optical filter each selectively transmit light in one of a red region, a green region, a blue region, or a visible region.

10. The photoelectric converter according to claim 9, wherein two first optical filters are disposed on one diagonal line, and the second optical filter and the third optical filter are disposed on another diagonal line in a 2×2 array.

11. The photoelectric converter according to claim 9, wherein two first optical filters are disposed in one column to be adjacent to each other, and the second optical filter and the third optical filter are disposed in another column to be adjacent to each other in a 2×2 array.

12. The photoelectric converter according to claim 1, wherein the driving wiring line is disposed over an edge of the optical filter in the plan view.

13. The photoelectric converter according to claim 12, wherein the driving wiring line is disposed over an edge of the one electrode in the plan view.

14. The photoelectric converter according to claim 1, wherein, in the plan view, the through electrode has an elongated shape that extends in a first direction along the first side of the another electrode.

15. The photoelectric converter according to claim 1, wherein, in the plan view, the through electrode is shared between at least two pixels.

16. The photoelectric converter according to claim 1, wherein, in the plan view, the first side of the another electrode corresponds to a corner of a pixel.

17. The photoelectric converter according to claim 1, wherein, in the cross-sectional view, the through electrode is between the optical filter and a neighboring optical filter.

18. The photoelectric converter according to claim 17, wherein the optical filter corresponds to a color filter that passes red light and the neighboring optical filter corresponds to color filter that passes blue light.

19. A solid-state imaging device comprising
a plurality of pixels each provided with one or more photoelectric converters, the one or more photoelectric converters each including:
an organic photoelectric conversion section including a first electrode, a second electrode, and an organic photoelectric conversion layer, the first electrode including one electrode and another electrode, the organic photoelectric conversion layer being disposed between the first electrode and the second electrode and being electrically coupled to the one electrode, the organic photoelectric conversion layer and the another electrode being provided with an insulation layer therebetween;
an inorganic photoelectric conversion section, wherein the first electrode is disposed between the inorganic photoelectric conversion section and the organic photoelectric conversion section;
an optical filter provided between the organic photoelectric conversion section and the inorganic photoelectric conversion section;
a through electrode penetrating a semiconductor substrate that includes the inorganic photoelectric conversion section, wherein, in a plan view, the through electrode is at a first side of the another electrode, and wherein, in a cross-sectional view, the through electrode is between the inorganic photoelectric conversion section and an adjacent inorganic photoelectric conversion section; and
a driving wiring line that receives a voltage and that is electrically coupled to the another electrode and at least one other electrode of an adjacent organic photoelectric conversion section, wherein, in the plan view, the driving wiring line extends across multiple pixels to serve as a common wiring line for the multiple pixels.

* * * * *